(12) United States Patent
Tang et al.

(10) Patent No.: US 10,910,379 B2
(45) Date of Patent: Feb. 2, 2021

(54) INTEGRATED ASSEMBLIES COMPRISING MEMORY CELLS AND SHIELDING MATERIAL BETWEEN THE MEMORY CELLS, AND METHODS OF FORMING INTEGRATED ASSEMBLIES

(71) Applicant: Micron Technology, Inc., Boise, ID (US)

(72) Inventors: Sanh D. Tang, Boise, ID (US); Mitsunari Sukekawa, Hiroshima (JP); Yusuke Yamamoto, Hiroshima (JP); Christopher J. Kawamura, Boise, ID (US); Hiroaki Taketani, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 16/354,450

(22) Filed: Mar. 15, 2019

(65) Prior Publication Data

US 2020/0295008 A1    Sep. 17, 2020

(51) Int. Cl.
*H01L 27/108* (2006.01)
*H01L 23/528* (2006.01)

(52) U.S. Cl.
CPC .... *H01L 27/10808* (2013.01); *H01L 23/5283* (2013.01); *H01L 27/10852* (2013.01); *H01L 27/10873* (2013.01); *H01L 27/10891* (2013.01)

(58) Field of Classification Search
CPC ............... H01L 27/10808; H01L 27/10891
USPC ........................................................ 257/296
See application file for complete search history.

(56) References Cited

U.S. PATENT DOCUMENTS

| | | | | |
|---|---|---|---|---|
| 5,467,305 A | * | 11/1995 | Bertin | H01L 27/115 257/298 |
| 7,569,878 B2 | * | 8/2009 | Weis | H01L 27/10861 257/301 |
| 8,829,583 B2 | * | 9/2014 | Taketani | H01L 27/10829 257/296 |
| 9,245,893 B1 | * | 1/2016 | Sukekawa | H01L 27/10823 |
| 2009/0315090 A1 | * | 12/2009 | Weis | H01L 27/2445 257/296 |
| 2018/0331029 A1 | | 11/2018 | Sukekawa | |
| 2019/0252553 A1 | | 8/2019 | Liu et al. | |
| 2020/0066727 A1 | * | 2/2020 | Sukekawa | H01L 27/10855 |
| 2020/0176465 A1 | * | 6/2020 | Tang | H01L 27/11556 |

* cited by examiner

*Primary Examiner* — Jami Valentine Miller
(74) *Attorney, Agent, or Firm* — Wells St. John P.S.

(57) ABSTRACT

Some embodiments include a memory device having a buried wordline, a shield plate, and an access device. The access device includes first and second diffusion regions and a channel region. The diffusion regions and the channel region are arranged vertically so that the channel region is between the first and second diffusion regions. The wordline is adjacent to a first side surface of the channel region, and the shield plate is adjacent to a second side surface of the channel region; with the first and second side surfaces being in opposing relation to one another. Some embodiments include methods of forming integrated assemblies.

11 Claims, 36 Drawing Sheets

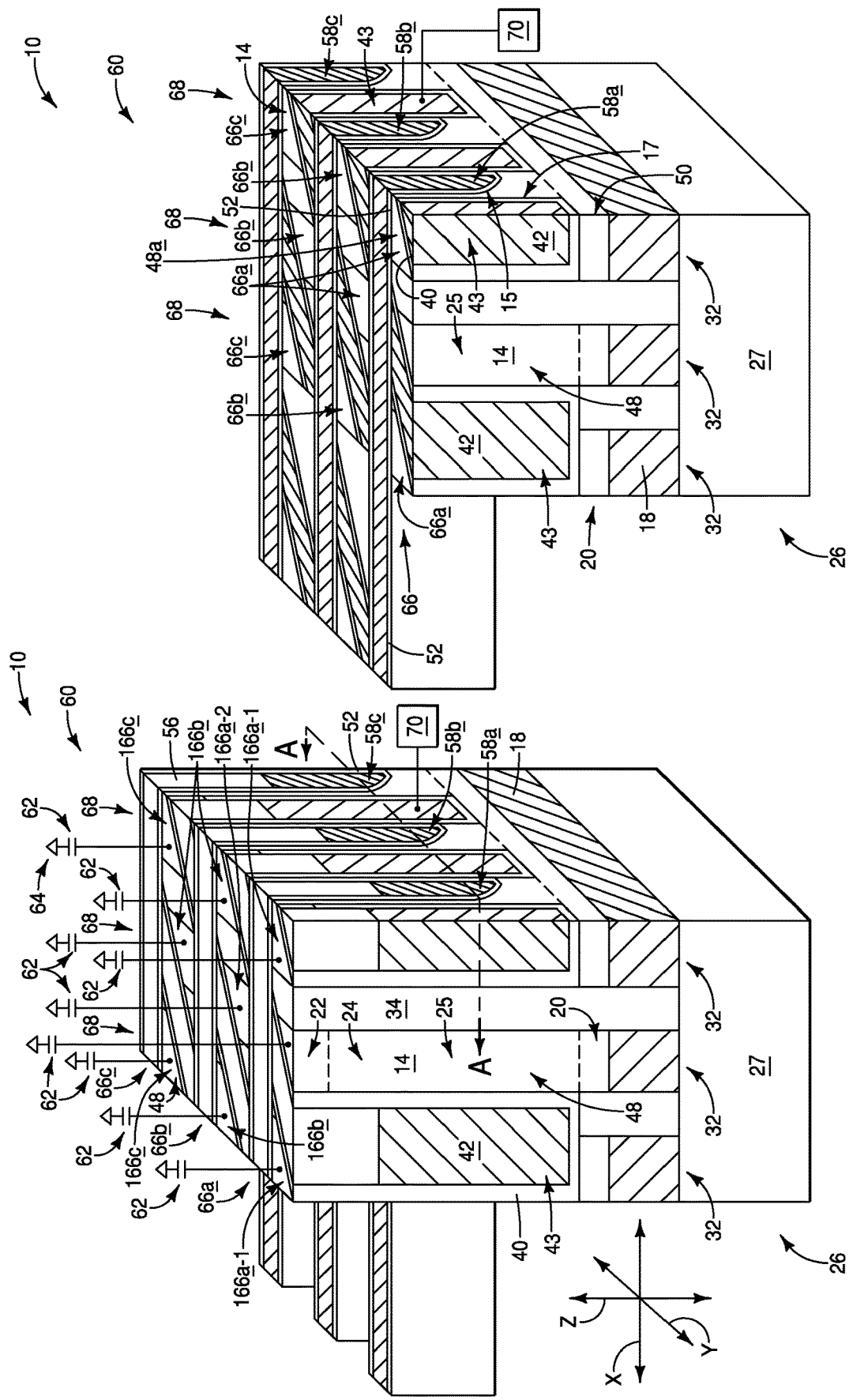

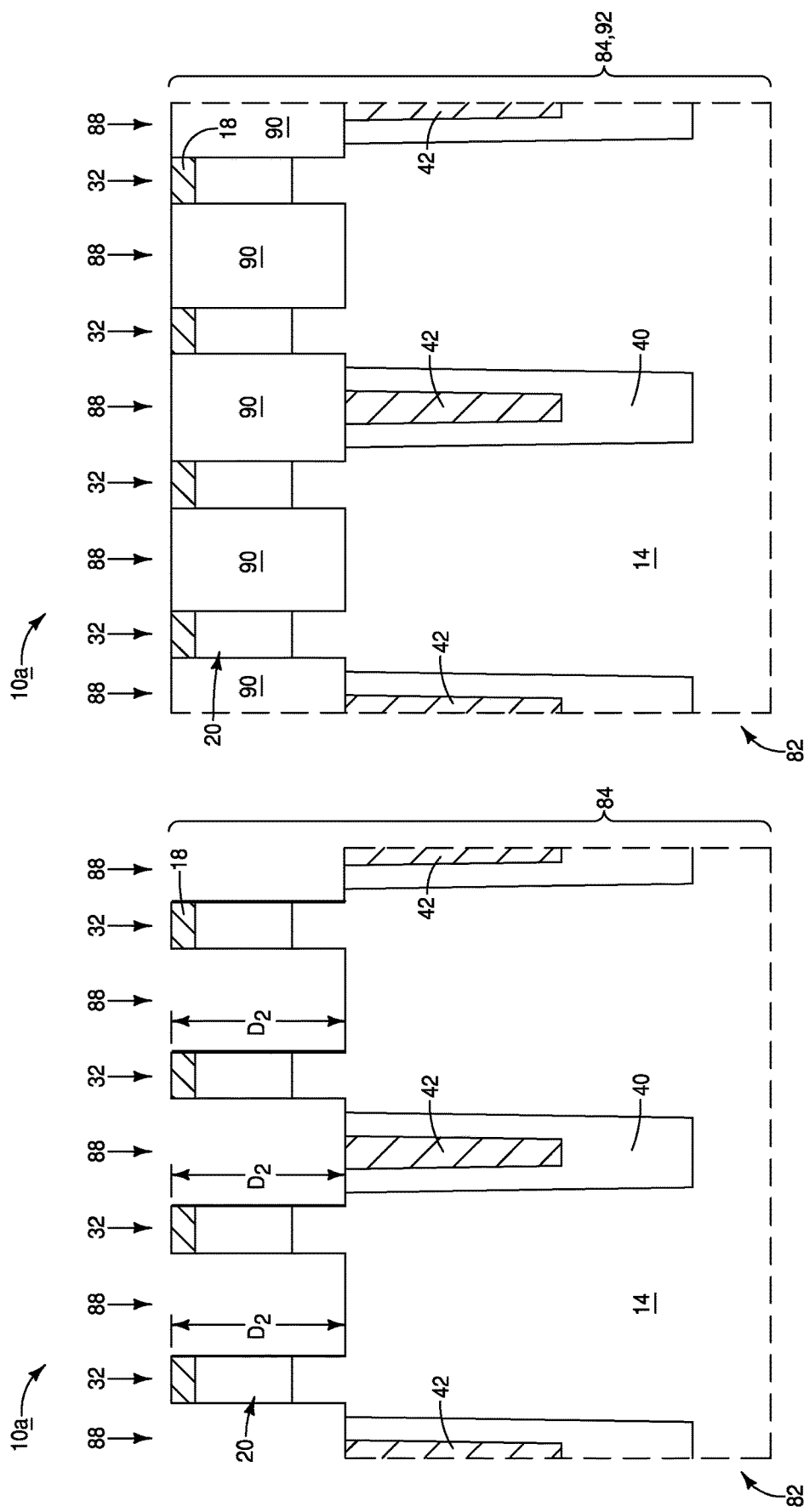

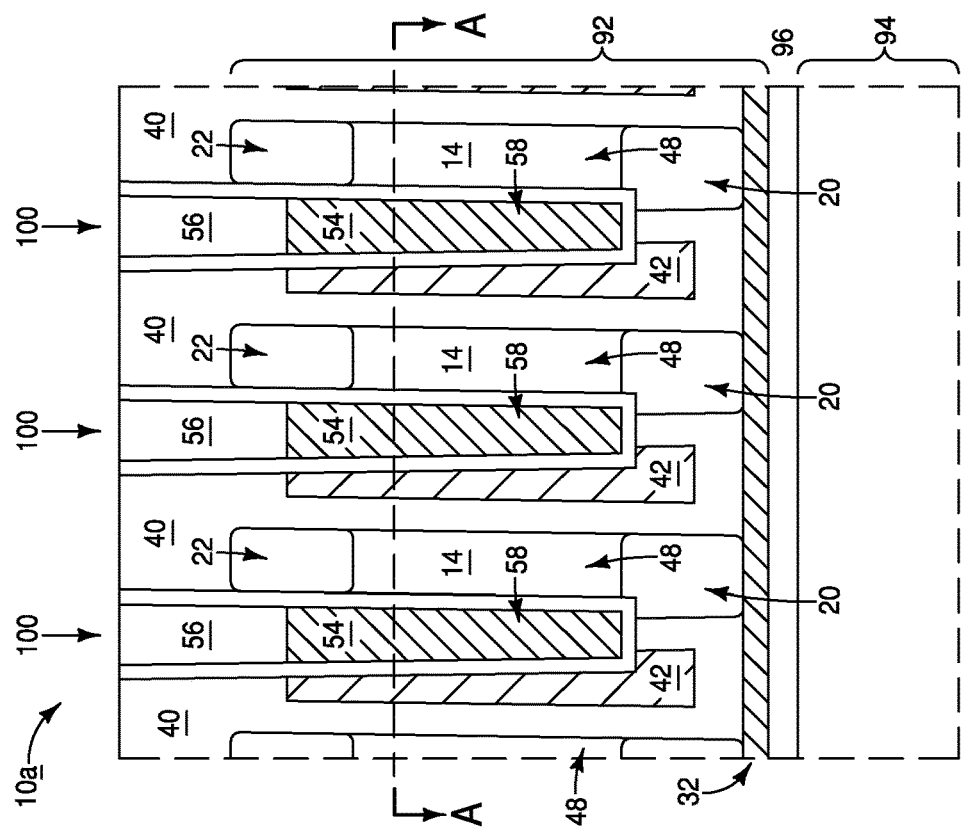
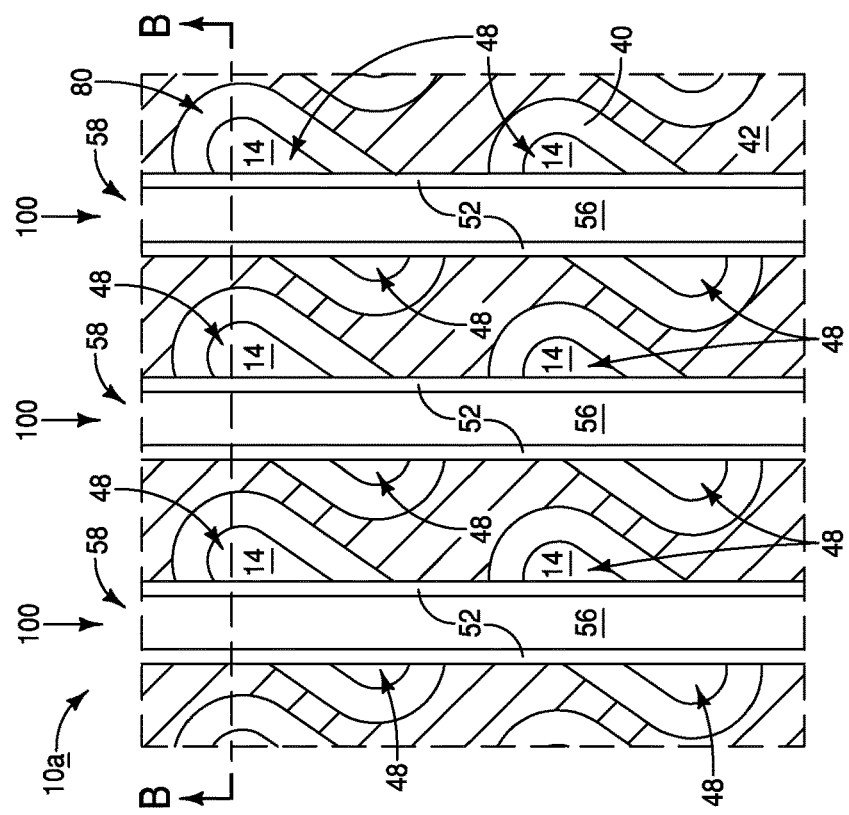
FIG. 21B
FIG. 21A

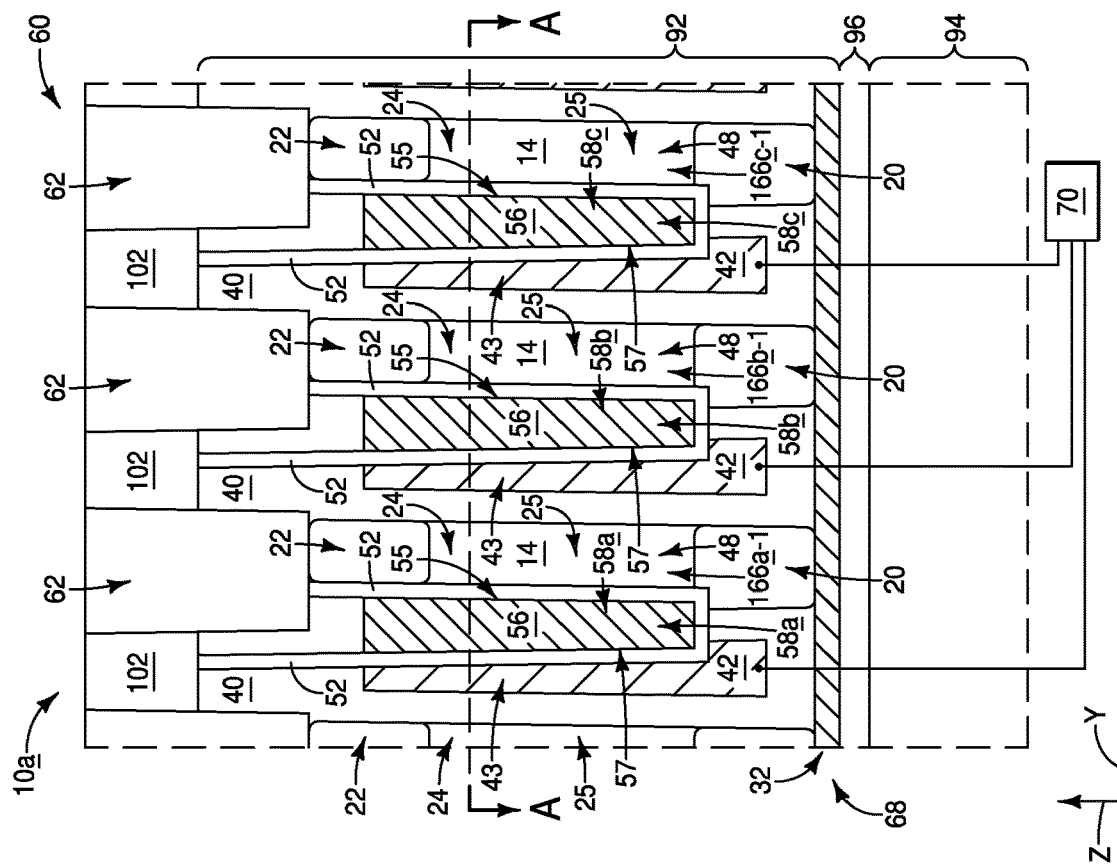
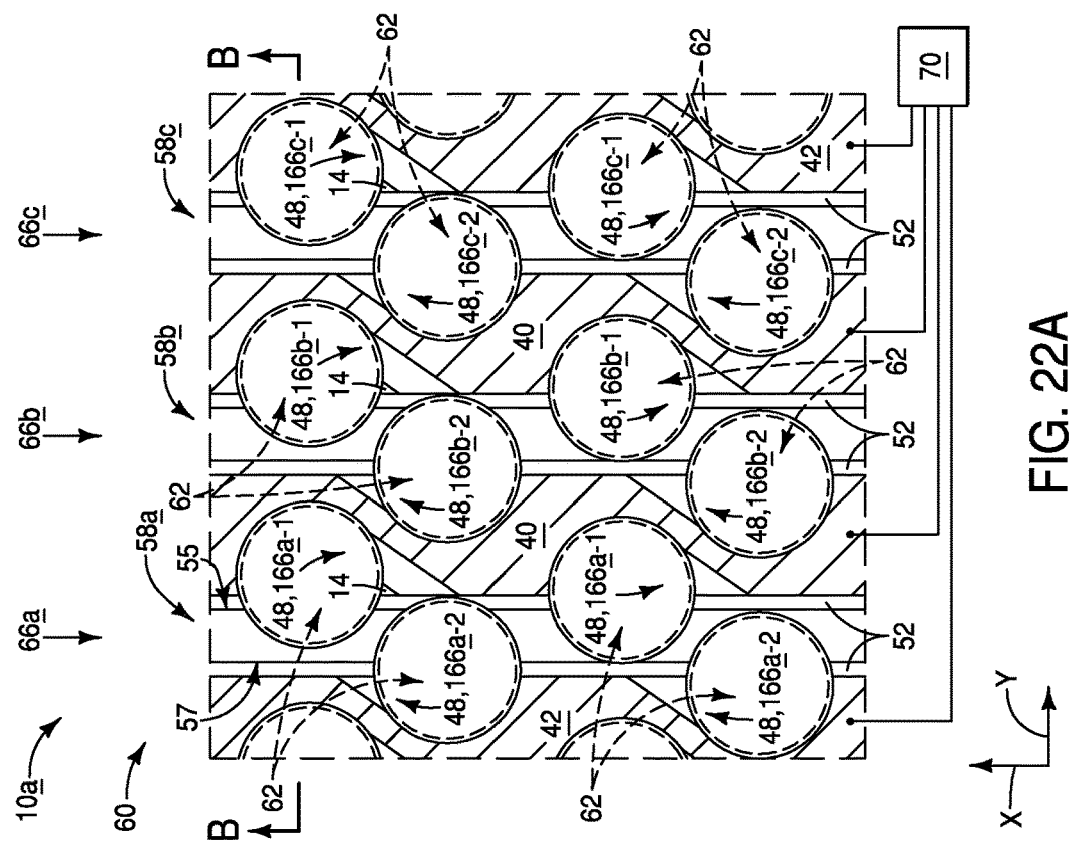
FIG. 22B
FIG. 22A

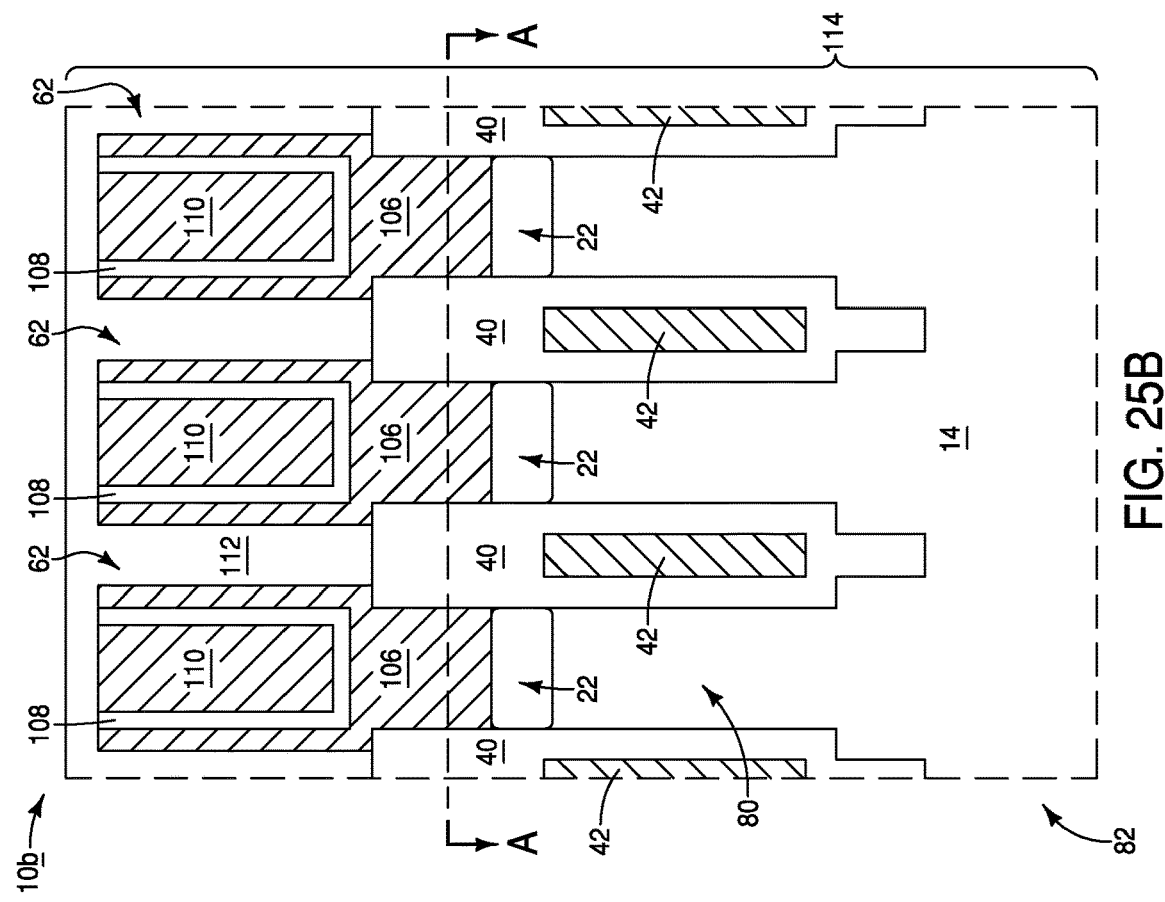
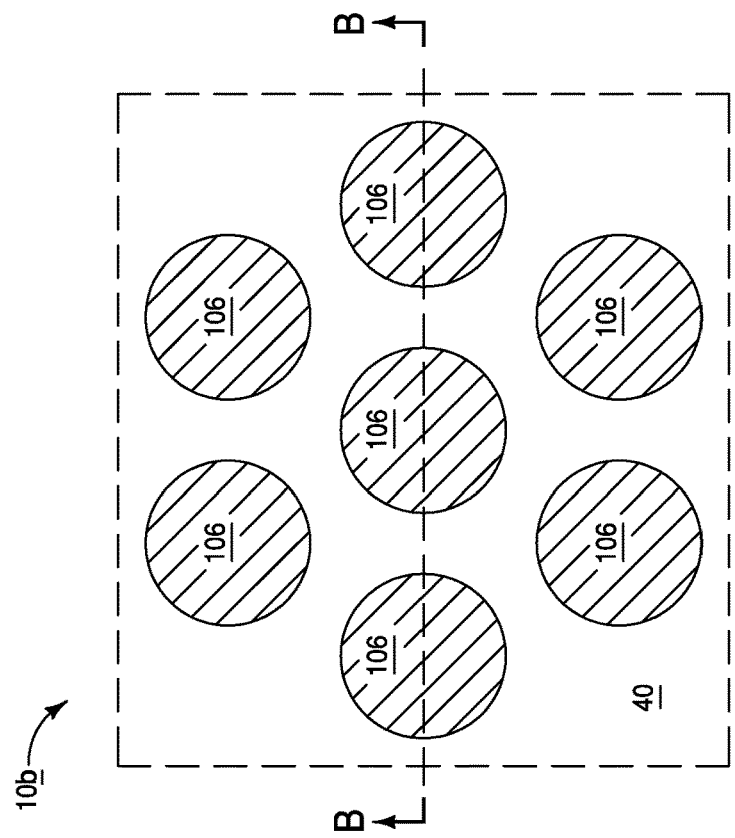
FIG. 25B
FIG. 25A

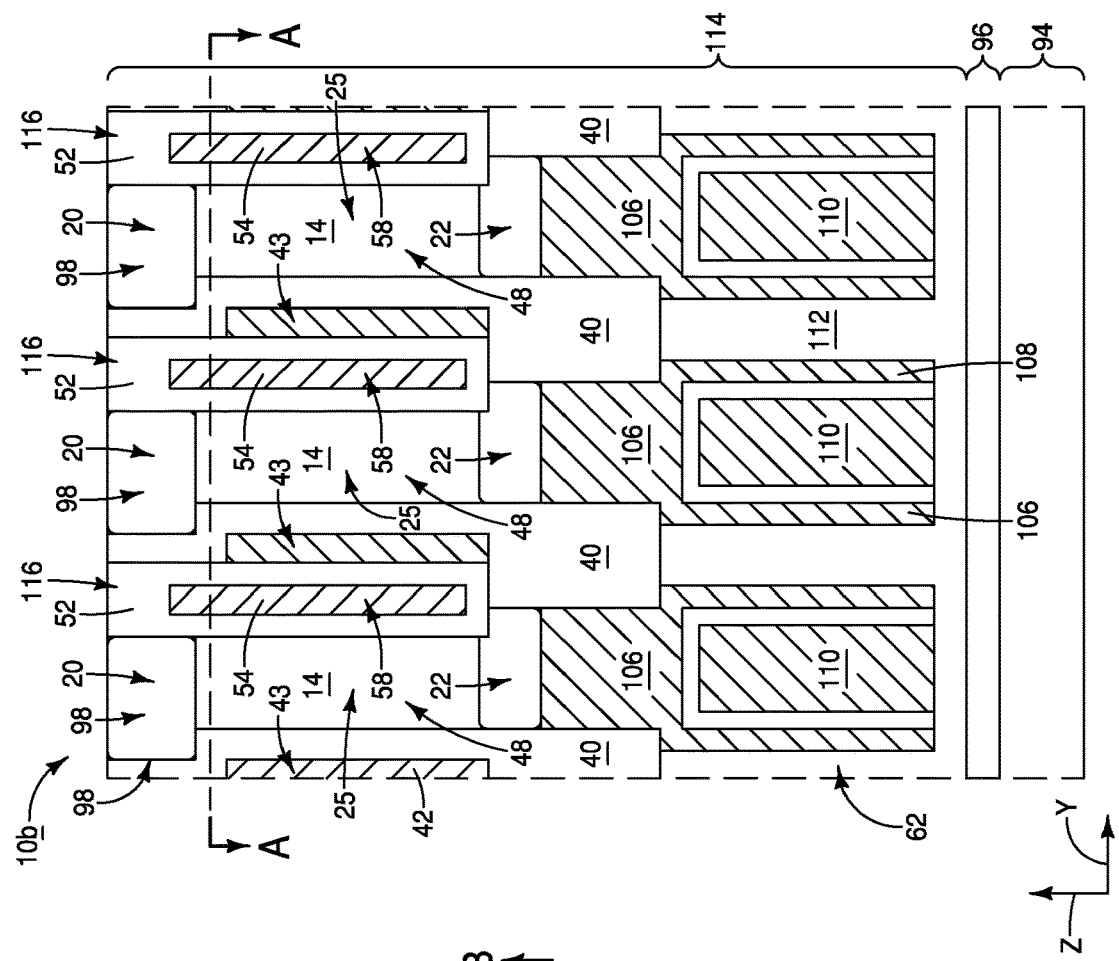
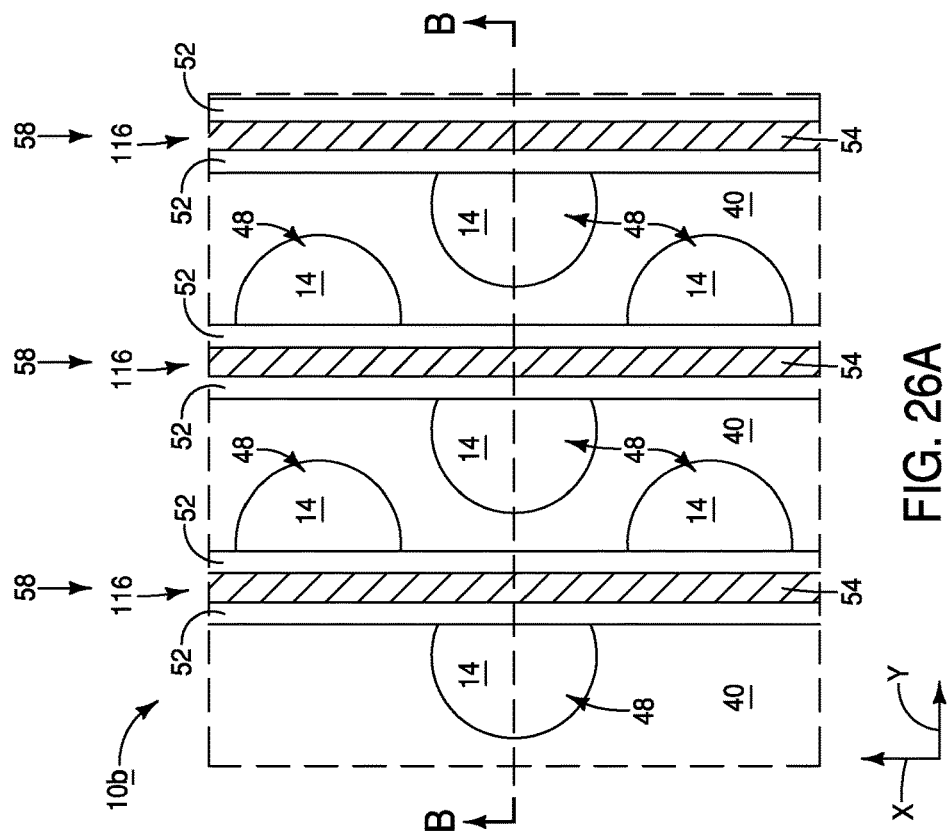
FIG. 26B
FIG. 26A

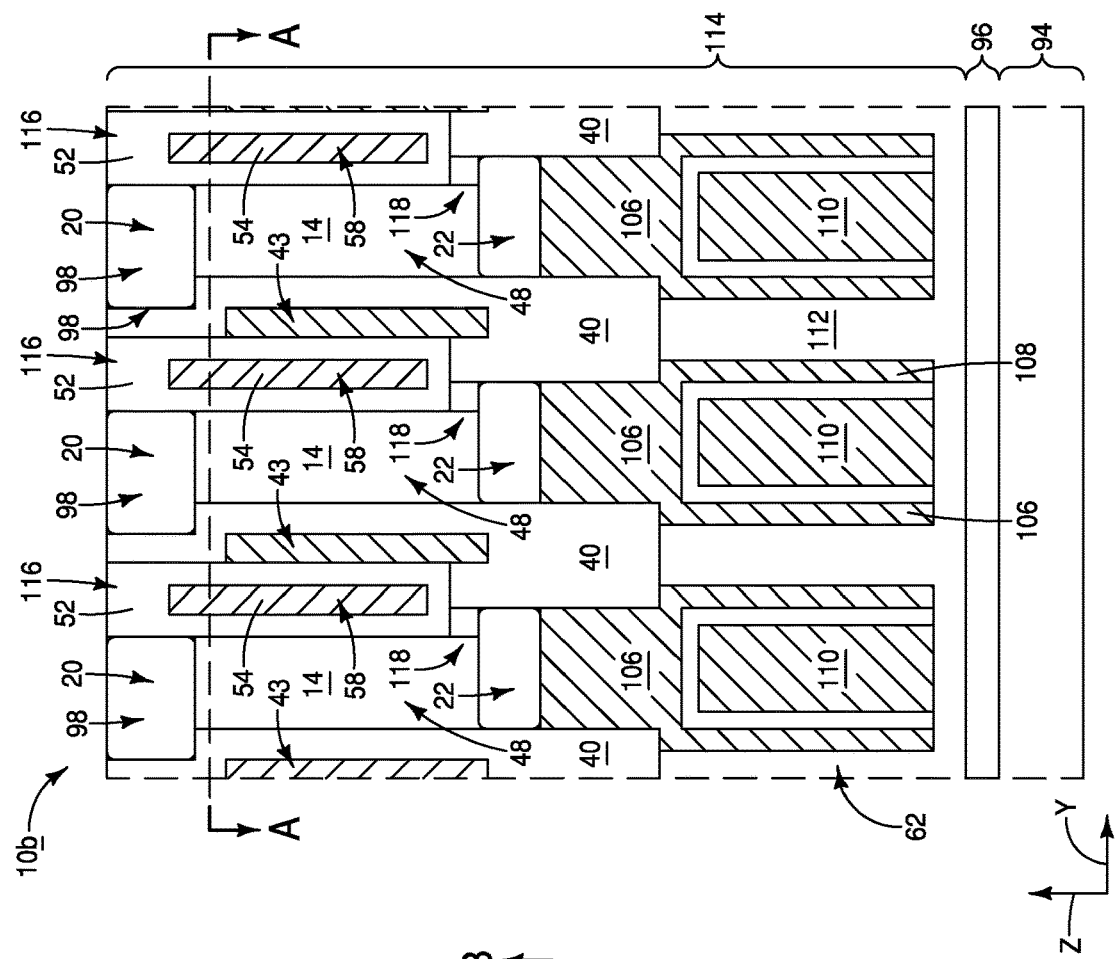
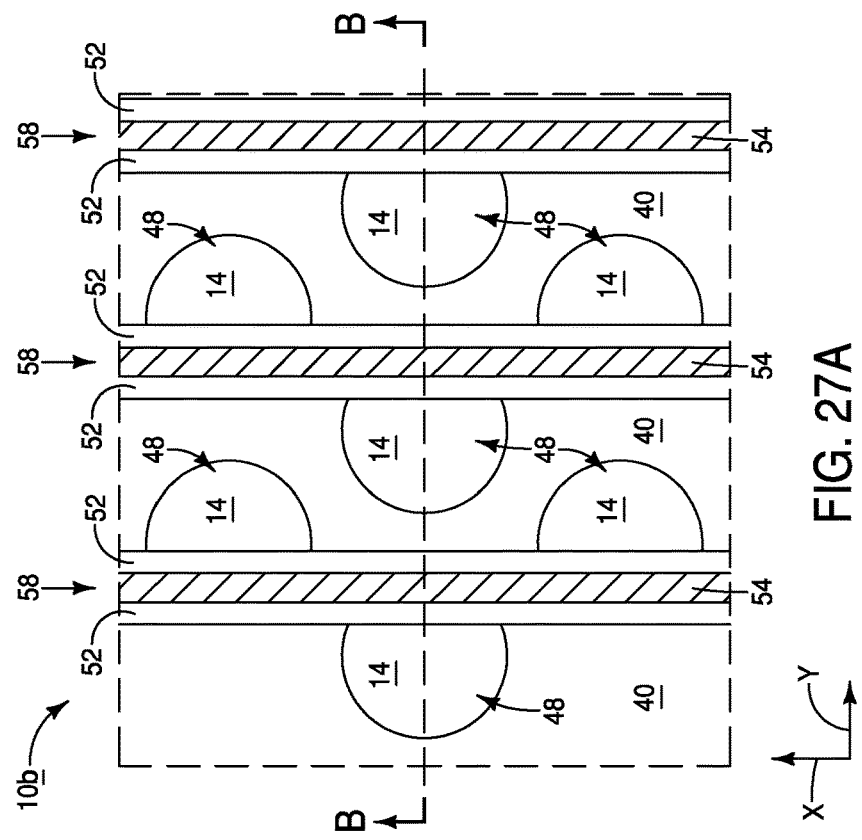
FIG. 27B
FIG. 27A

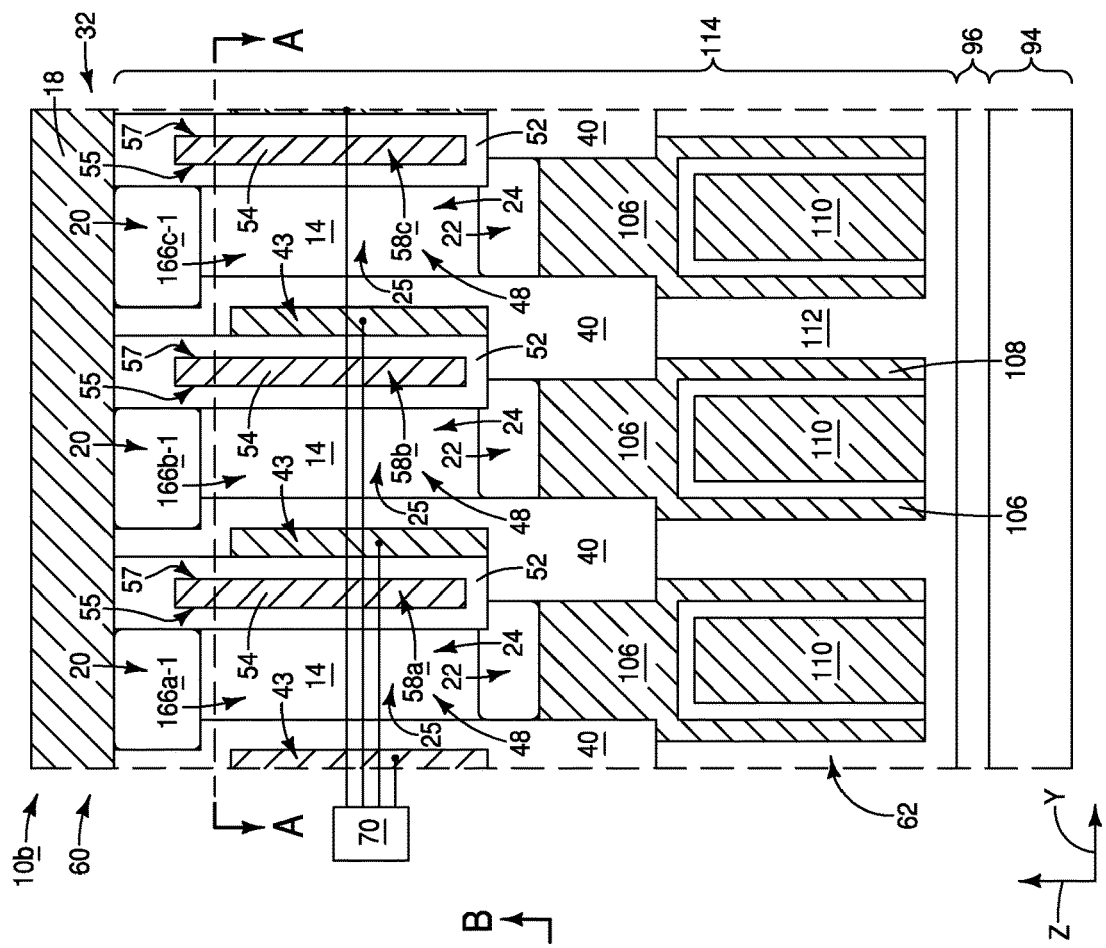
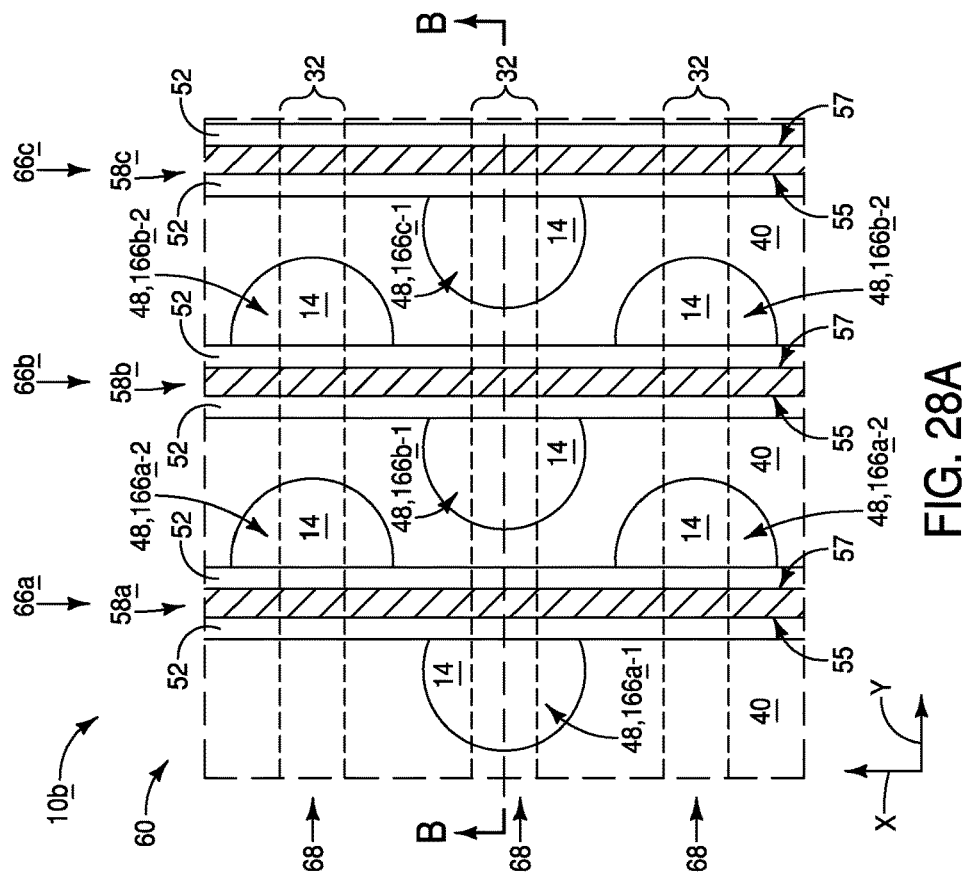
FIG. 28B
FIG. 28A

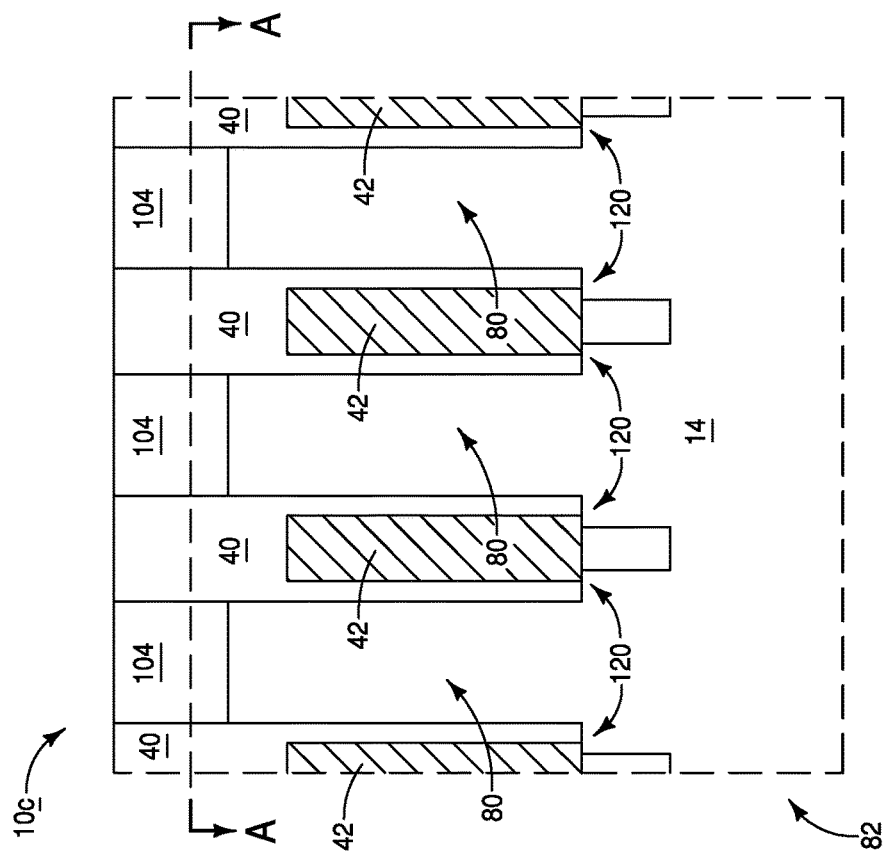
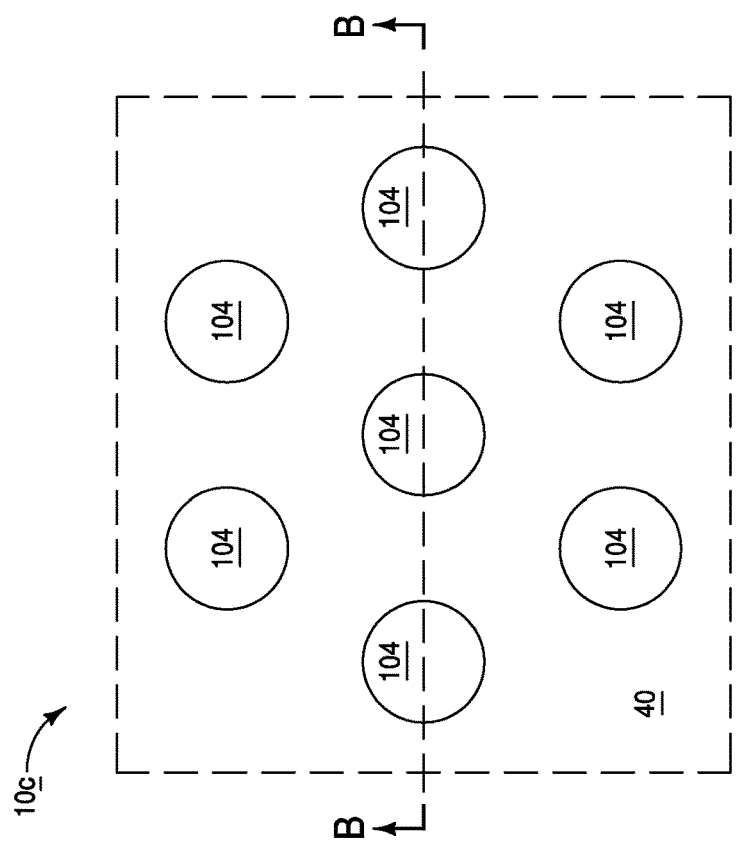
FIG. 30B
FIG. 30A

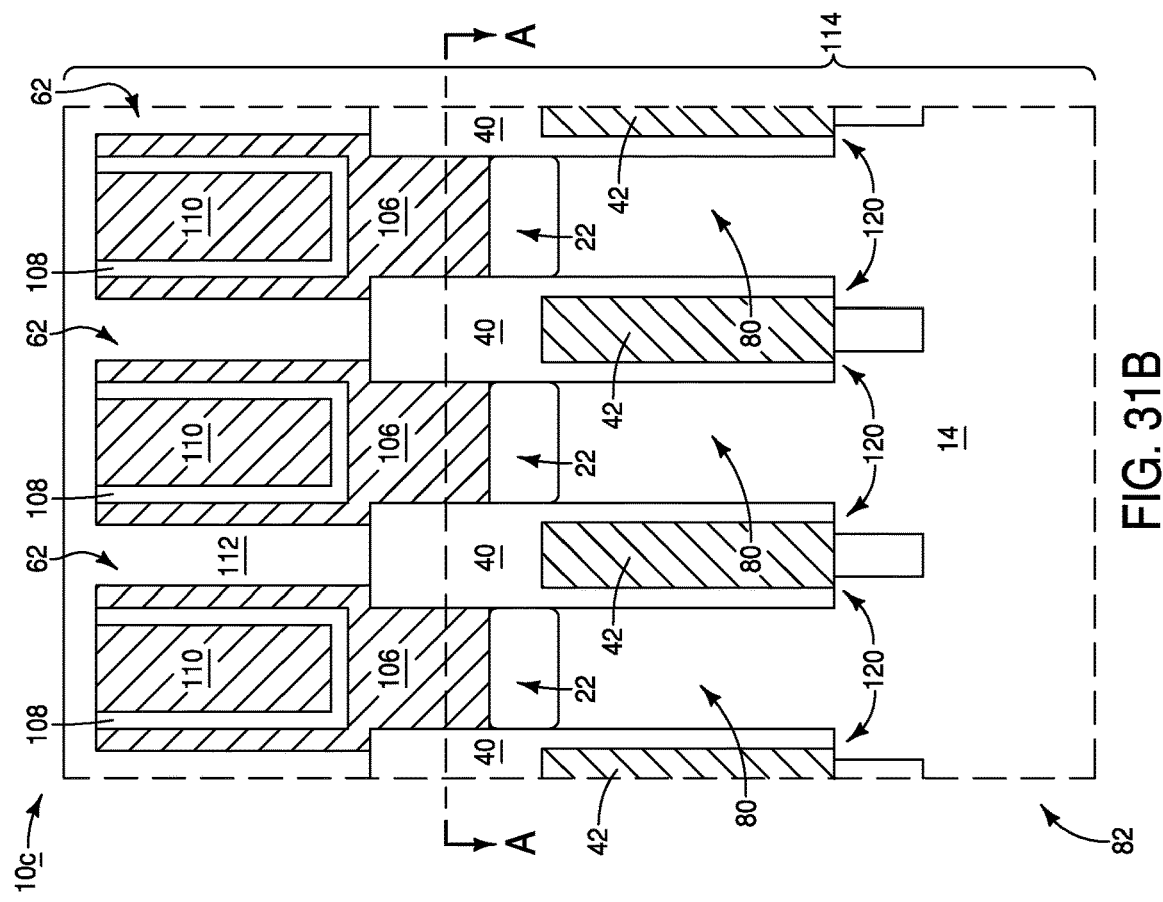
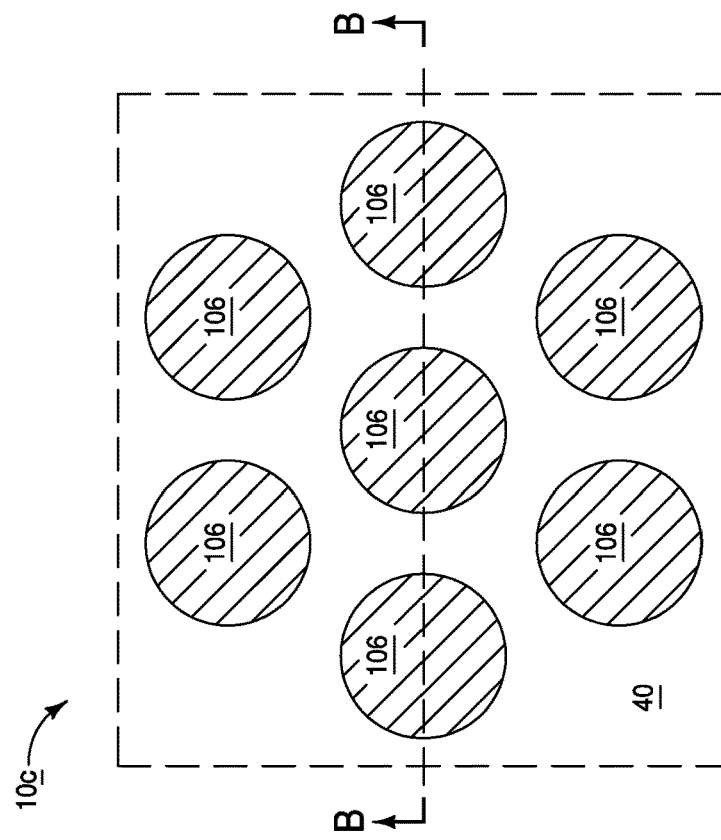
FIG. 31B
FIG. 31A

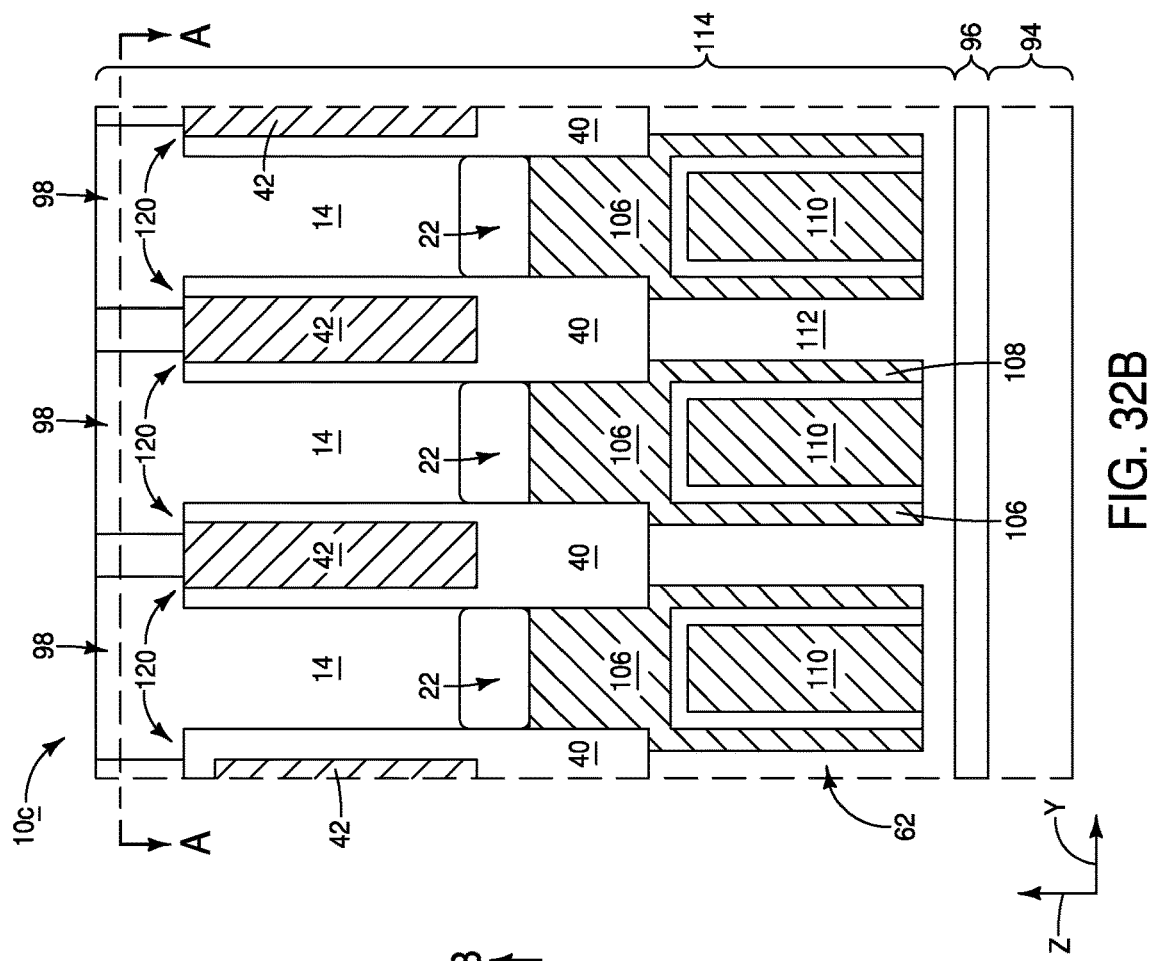
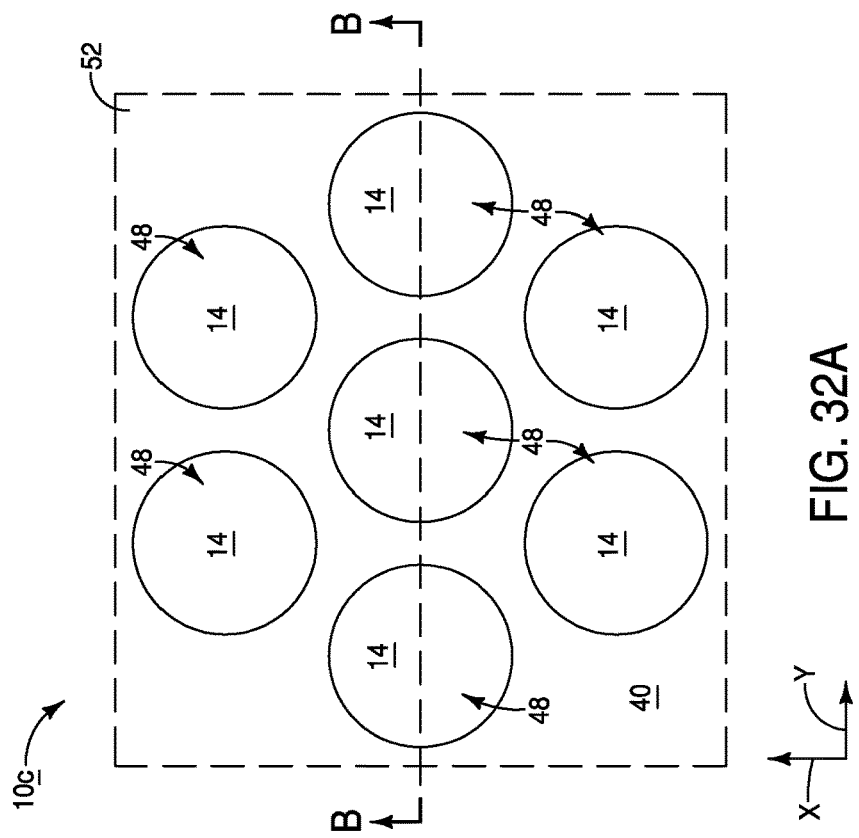
FIG. 32B
FIG. 32A

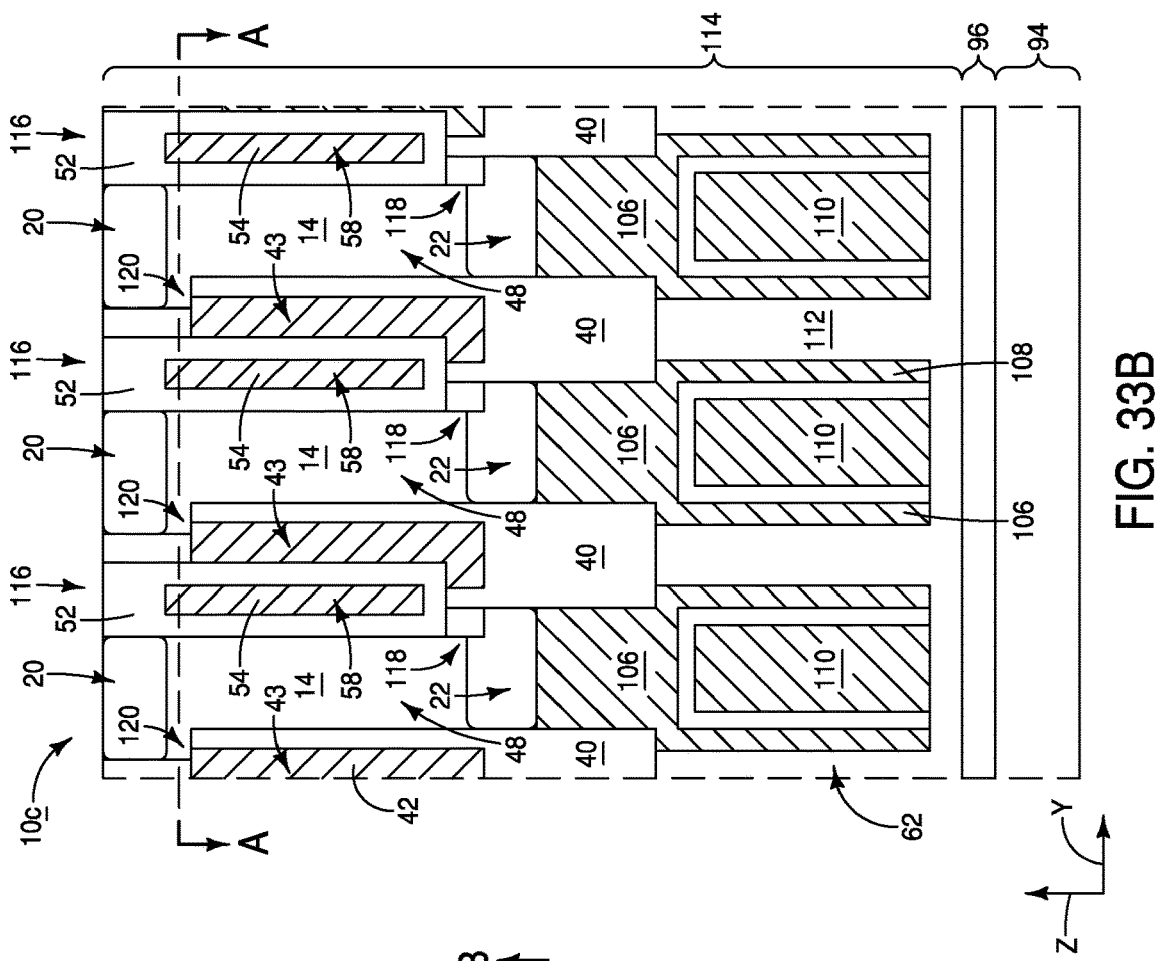
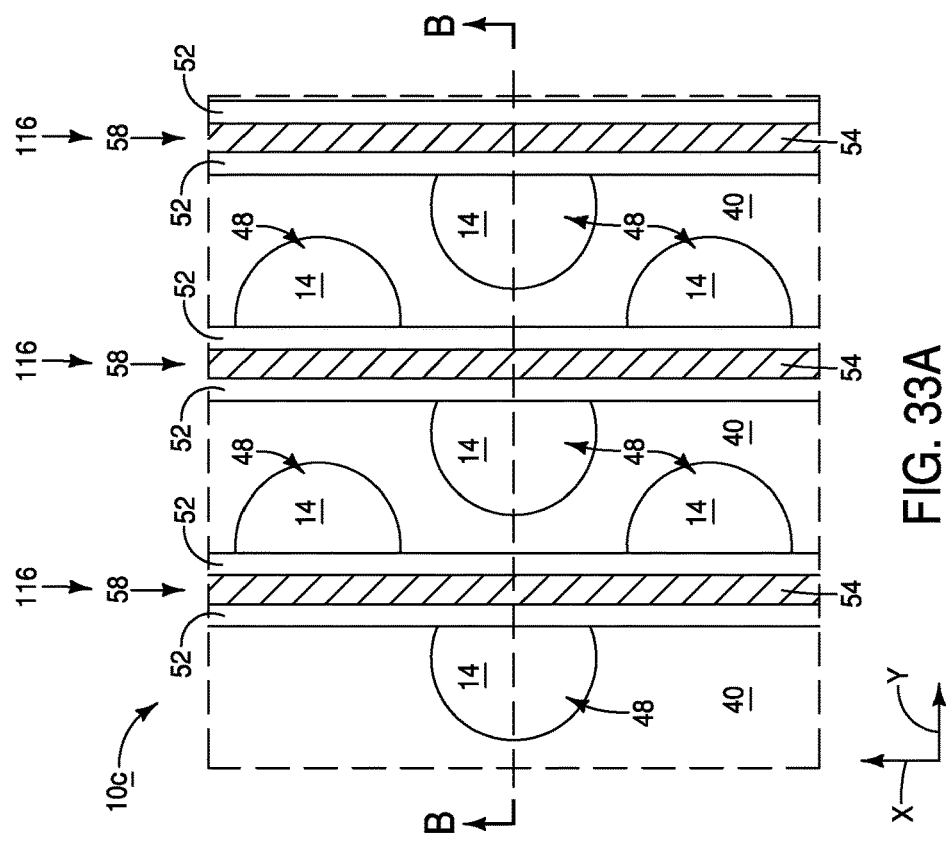
FIG. 33B
FIG. 33A

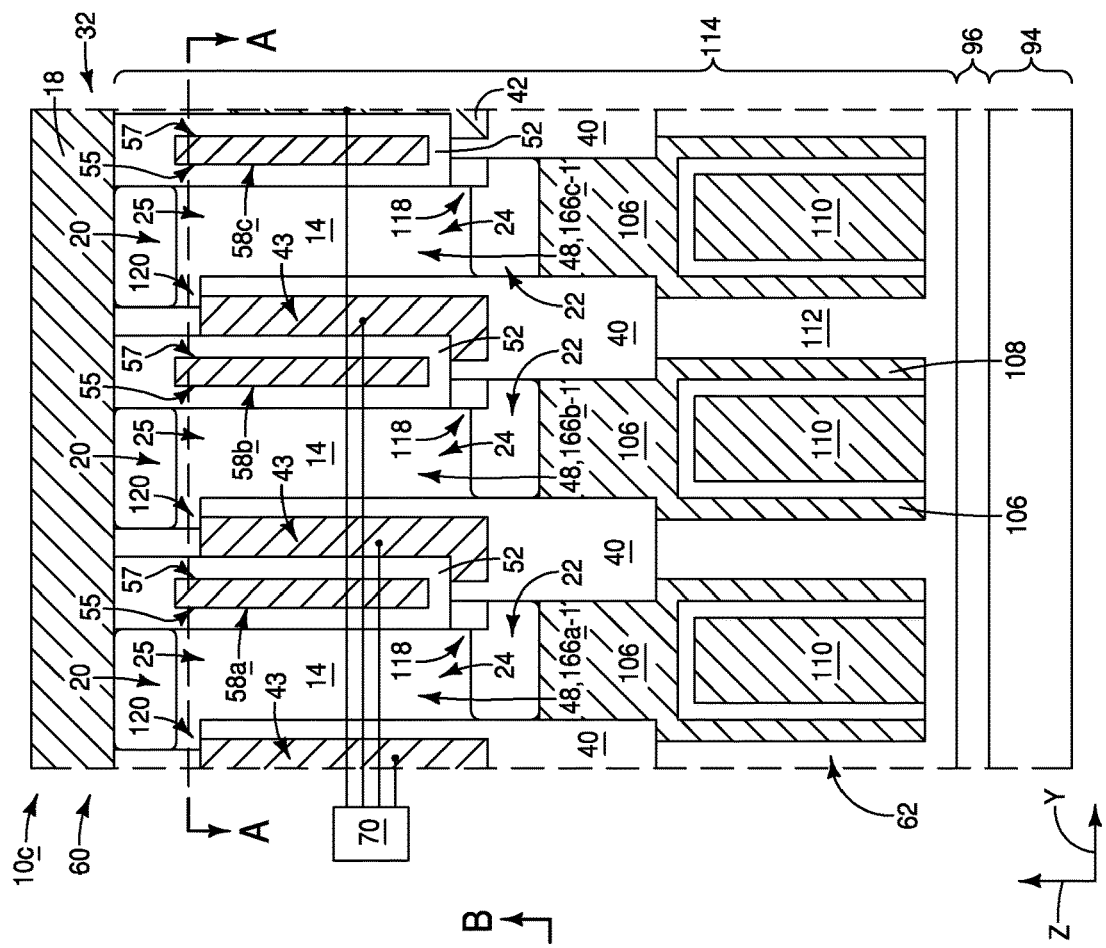
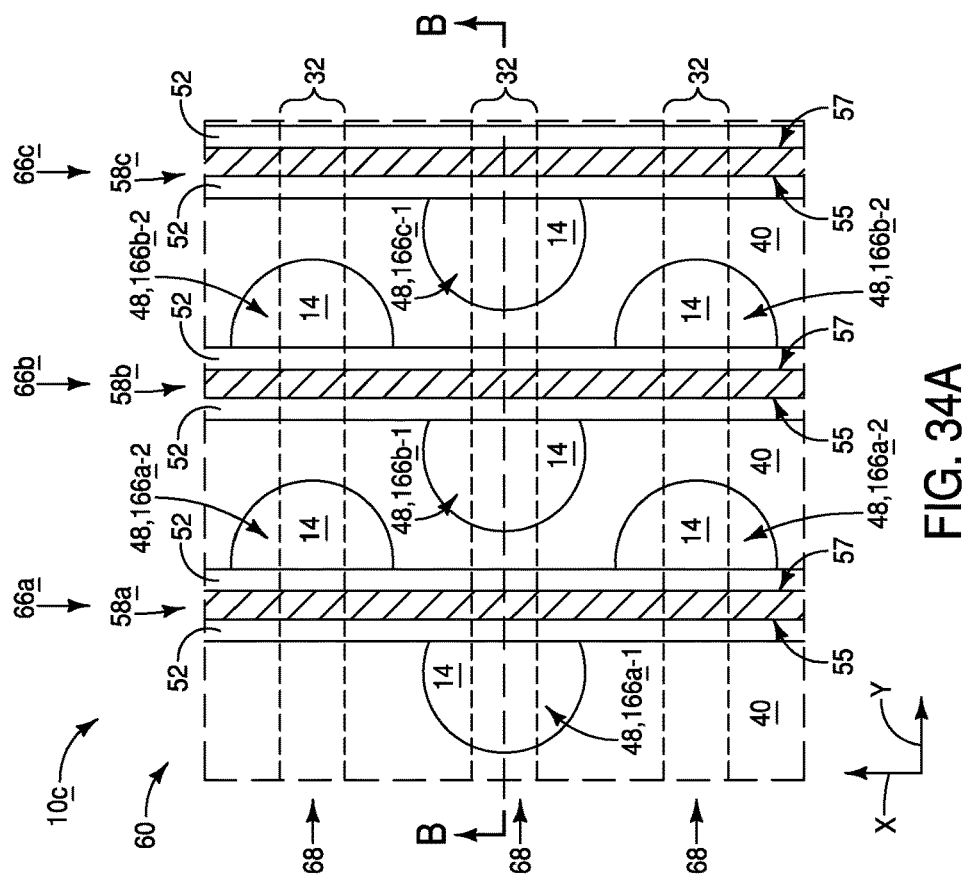
FIG. 34B
FIG. 34A

US 10,910,379 B2

INTEGRATED ASSEMBLIES COMPRISING MEMORY CELLS AND SHIELDING MATERIAL BETWEEN THE MEMORY CELLS, AND METHODS OF FORMING INTEGRATED ASSEMBLIES

TECHNICAL FIELD

Integrated assemblies (e.g., memory arrays) comprising memory cells and shielding material between the memory cells, and methods of forming integrated assemblies.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor.

A problem which may be encountered with conventional DRAM is that operation of a memory cell may problematically disturb one or more adjacent memory cells, and may eventually result in data loss. It would be desirable to develop arrangements which avoid such problem, and to develop methods of fabricating such arrangements.

BRIEF DESCRIPTION OF THE DRAWINGS

FIGS. 7 and 7A are a diagrammatic three-dimensional view and a diagrammatic cross-sectional top-down view, respectively, of the example assembly of FIG. 6. The view of FIG. 7A has a top surface along the line A-A of FIG. 7.

FIGS. 18A-18E are a diagrammatic cross-sectional top-down view (FIG. 18A) and diagrammatic cross-sectional side views (FIGS. 18B-18E) of the example assembly of FIGS. 15A and 15B at an example process stage following that of FIGS. 16A and 16B, and which may be alternative to the processing stage of FIGS. 17A-17E. The view of FIG. 18A is along the line A-A of FIG. 18B. The views of FIG. 18B-18D are along the lines B-B, C-C, D-D and E-E, respectively, of FIG. 18A.

FIG. 19 is a diagrammatic cross-sectional side view of the example assembly of FIGS. 15A and 15B at a process stage subsequent to that of FIGS. 18A-18E, and is along the same cross-section as FIG. 18E.

FIGS. 21A and 21B are a diagrammatic cross-sectional top-down view and a diagrammatic cross-sectional side view, respectively, of the example assembly of FIGS. 15A and 15B at an example process stage following that of FIGS. 20A and 20B. The view of FIG. 21A is along the line A-A of FIG. 21B, and the view of FIG. 21B is along the line B-B of FIG. 21A.

FIGS. 22A and 22B are a diagrammatic cross-sectional top-down view and a diagrammatic cross-sectional side view, respectively, of the example assembly of FIGS. 15A and 15B at an example process stage following that of FIGS. 21A and 21B. The view of FIG. 22A is along the line A-A of FIG. 22B, and the view of FIG. 22B is along the line B-B of FIG. 22A.

FIGS. 25A and 25B are a diagrammatic cross-sectional top-down view and a diagrammatic cross-sectional side view, respectively, of the example assembly of FIGS. 23A and 23B at an example process stage following that of FIGS. 24A and 24B. The view of FIG. 25A is along the line A-A of FIG. 25B, and the view of FIG. 25B is along the line B-B of FIG. 25A.

FIGS. 26A and 26B are a diagrammatic cross-sectional top-down view and a diagrammatic cross-sectional side view, respectively, of the example assembly of FIGS. 23A and 23B at an example process stage following that of FIGS. 25A and 25B. The view of FIG. 26A is along the line A-A of FIG. 26B, and the view of FIG. 26B is along the line B-B of FIG. 26A.

FIGS. 27A and 27B are a diagrammatic cross-sectional top-down view and a diagrammatic cross-sectional side view, respectively, of the example assembly of FIGS. 23A and 23B at an example process stage following that of FIGS. 25A and 25B, and alternative to that of FIGS. 26A and 26B. The view of FIG. 27A is along the line A-A of FIG. 27B, and the view of FIG. 27B is along the line B-B of FIG. 27A.

FIGS. 28A and 28B are a diagrammatic cross-sectional top-down view and a diagrammatic cross-sectional side view, respectively, of the example assembly of FIGS. 23A and 23B at an example process stage following that of FIGS. 26A and 26B. The view of FIG. 28A is along the line A-A of FIG. 28B, and the view of FIG. 28B is along the line B-B of FIG. 28A.

FIGS. 30A and 30B are a diagrammatic cross-sectional top-down view and a diagrammatic cross-sectional side view, respectively, of the example assembly of FIGS. 29A and 29B at an example process stage following that of FIGS. 29A and 29B. The view of FIG. 30A is along the line A-A of FIG. 30B, and the view of FIG. 30B is along the line B-B of FIG. 30A.

FIGS. 31A and 31B are a diagrammatic cross-sectional top-down view and a diagrammatic cross-sectional side view, respectively, of the example assembly of FIGS. 29A and 29B at an example process stage following that of FIGS. 30A and 30B. The view of FIG. 31A is along the line A-A of FIG. 31B, and the view of FIG. 31B is along the line B-B of FIG. 31A.

FIGS. 32A and 32B are a diagrammatic cross-sectional top-down view and a diagrammatic cross-sectional side view, respectively, of the example assembly of FIGS. 29A and 29B at an example process stage following that of FIGS. 31A and 31B. The view of FIG. 32A is along the line A-A of FIG. 32B, and the view of FIG. 32B is along the line B-B of FIG. 32A.

FIGS. 33A and 33B are a diagrammatic cross-sectional top-down view and a diagrammatic cross-sectional side view, respectively, of the example assembly of FIGS. 29A and 29B at an example process stage following that of FIGS. 32A and 32B. The view of FIG. 33A is along the line A-A of FIG. 33B, and the view of FIG. 33B is along the line B-B of FIG. 33A.

FIGS. 34A and 34B are a diagrammatic cross-sectional top-down view and a diagrammatic cross-sectional side view, respectively, of the example assembly of FIGS. 29A and 29B at an example process stage following that of FIGS. 33A and 33B. The view of FIG. 34A is along the line A-A of FIG. 34B, and the view of FIG. 34B is along the line B-B of FIG. 34A.

DETAILED DESCRIPTION OF THE ILLUSTRATED EMBODIMENTS

Some embodiments include methods of forming shielding material between memory cells (e.g., DRAM cells). The memory cells may be within a memory array, and may be arranged along rows and columns of the memory array. Wordlines may extend along the rows of the memory array. The memory cells along individual rows may alternate between memory cells of a first set and memory cells of a second set. The memory cells of the first set may be along one side of a wordline, and the memory cells of the second set may be along a second opposing side of the wordline. Each of the memory cells may comprise a vertically-extending body region which includes a transistor channel region. Each body region may comprise a first side which is adjacent to a wordline, and an opposing second side which is adjacent to a shielding material. The shielding material may directly contact the body regions of the memory cells in some embodiments, and may be electrically isolated from the body regions of the memory cells in other embodiments. Example embodiments are described with reference to FIGS. 1-36.

Figure 1A:
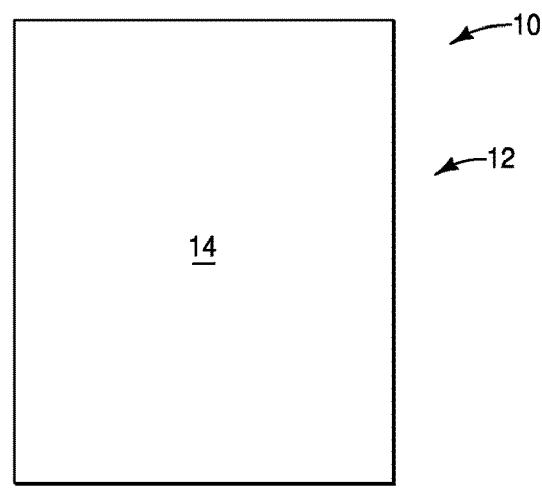
FIGS. 1 and 1A are a diagrammatic three-dimensional view and a diagrammatic top view, respectively, of an example assembly at an example process stage of an example method for fabricating an example array of memory cells.
Figure 1:
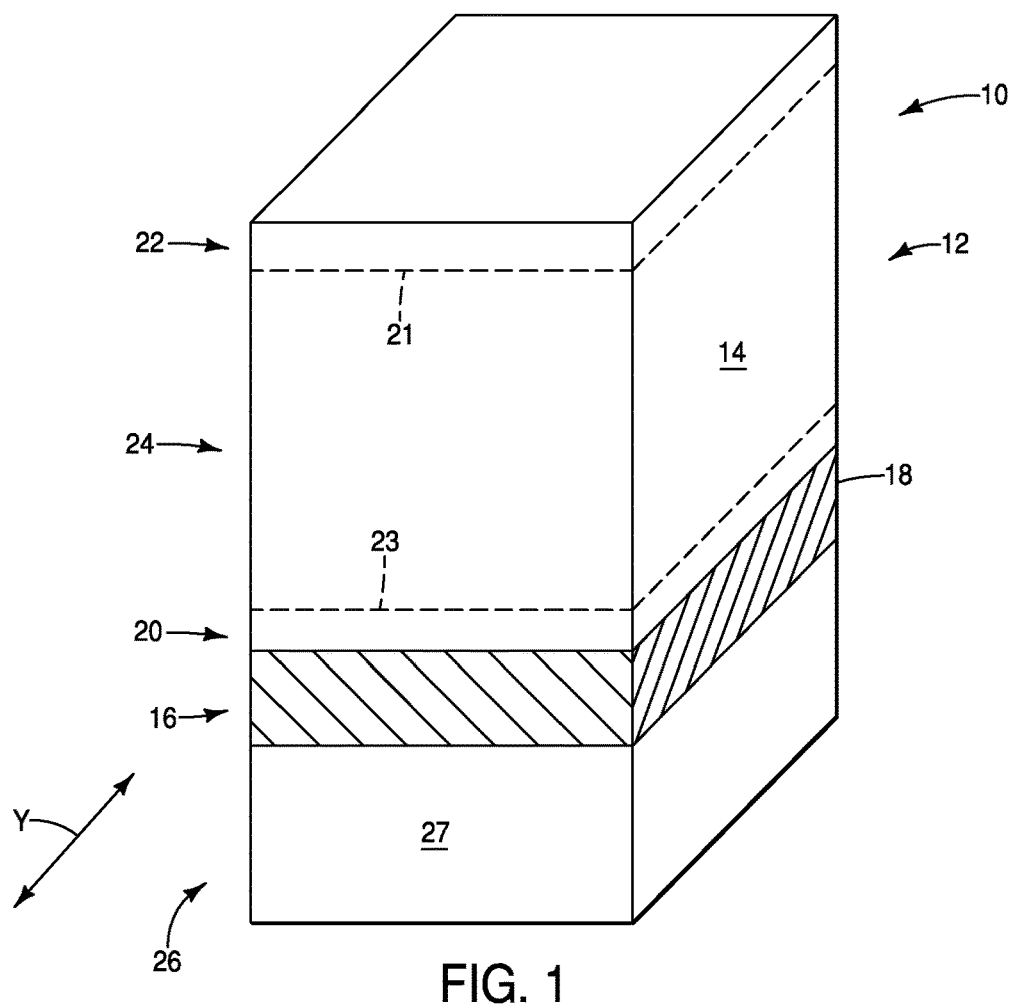

Referring to FIGS. 1 and 1A, a construction 10 includes a mass 12 of semiconductor material 14 supported over an expanse 16 of conductive material 18.

The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of monocrystalline silicon.

The semiconductor material 14 comprises lower and upper regions 20 and 22 which are doped with appropriate source/drain doping. Dashed lines 21 and 23 are provided to diagrammatically illustrate approximate boundaries of the doped regions 20 and 22. The doped regions 20 and 22 may comprise any suitable dopant to any suitable concentration. In some embodiments the doped regions may comprise n-type dopant provided to a concentration of at least about $1\times10^{20}$ atoms/cm$^3$, and in other embodiments may comprise p-type dopant provided to the concentration of at least about $1\times10^{20}$ atoms/cm$^3$.

A body region (also referred to as a central region) 24 is between the doped regions 20 and 22. The central region 24 may comprise any suitable dopant type to any suitable dopant concentration, and in some embodiments may be intrinsically doped. In some embodiments, the central region 24 may be doped to a concentration of less than or equal to about $10^{16}$ atoms/cm$^3$ with appropriate dopant (which, in some embodiments, may be of a opposite conductivity type relative to the doped regions 20 and 22).

The conductive material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive material 18 is ultimately patterned into bitlines, and may comprise any suitable bitline material. For instance, in some embodiments the material 18 may comprise one or more of tungsten, titanium, tantalum, tungsten nitride, titanium nitride, tantalum nitride, etc.

The conductive expanse 16 is supported by a base 26. The base 26 may comprise any suitable composition(s). The base 26 generally comprises insulative material 27 (e.g., silicon dioxide, silicon nitride, etc.) directly under the conductive expanse 16. In some embodiments, the base may comprise an oxide region (e.g., a region comprising silicon dioxide) over another substrate (or handle); and may be formed utilizing hybrid bonding (i.e., smart-cut) technology. Example hybrid bonding technology is described below with reference to FIGS. 20A and 20B.

Figure 2A:
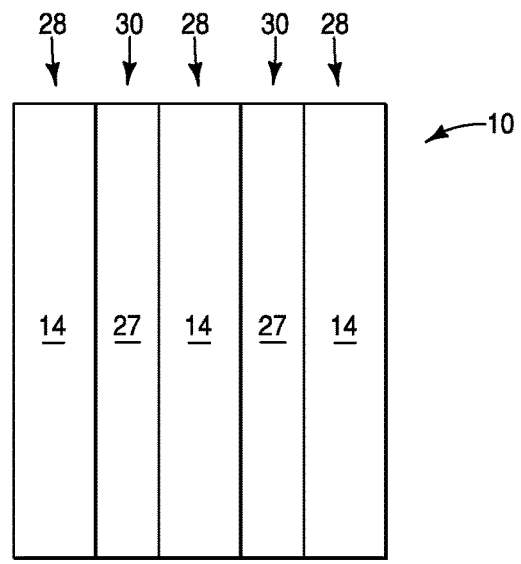
FIGS. 2 and 2A are a diagrammatic three-dimensional view and a diagrammatic top view, respectively, of the example assembly of FIGS. 1 and 1A at an example process stage following that of FIGS. 1 and 1A.
Figure 2:
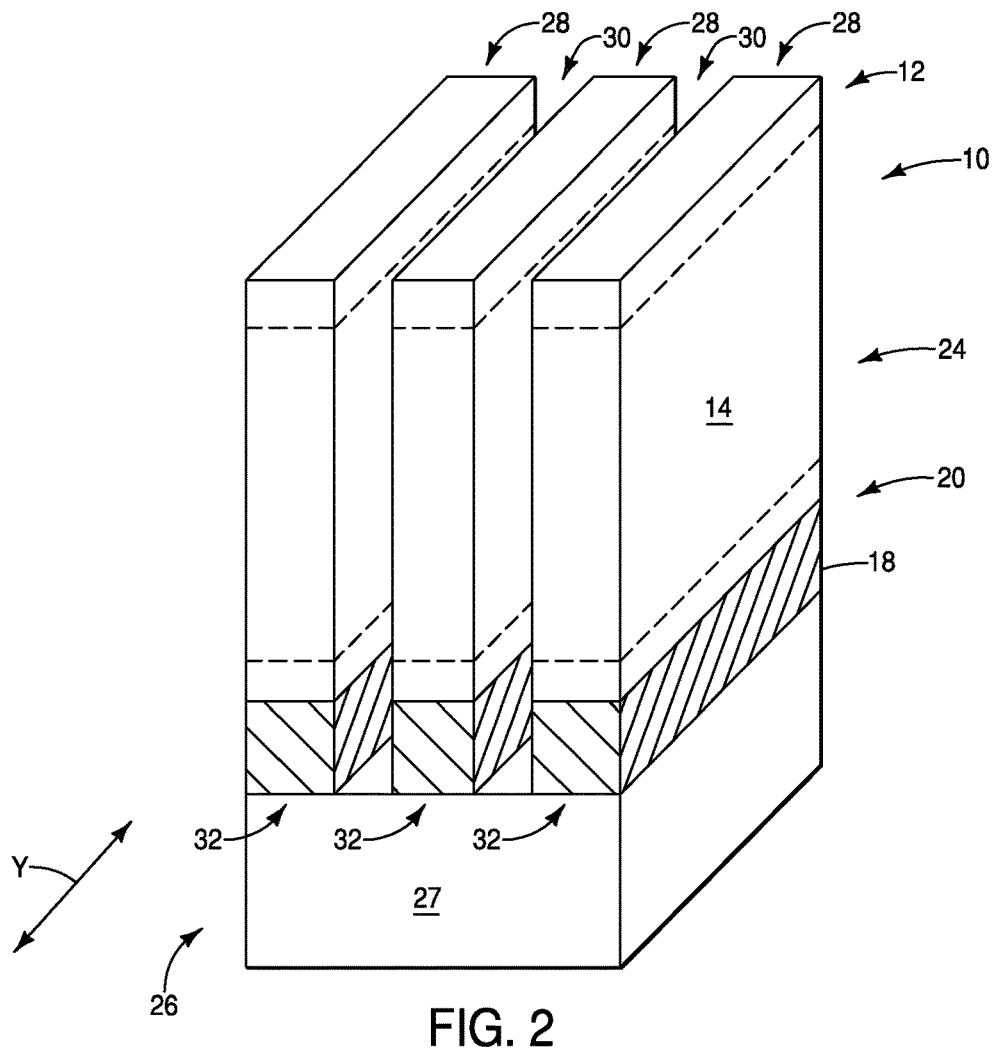

Referring to FIGS. 2 and 2A, the mass 12 (FIG. 1) and expanse 16 (FIG. 1) are patterned into rails 28, with such rails being spaced from one another by trenches 30.

The rails 28 may be formed with any suitable processing. For instance, a patterned mask (not shown) may be formed over the semiconductor material 14, a pattern may be transferred from the mask into the semiconductor material 14 and the conductive material 18 with one or more suitable etches, and then the mask may be removed to leave the construction of FIGS. 2 and 2A.

The patterned material 18 within the rails 28 becomes bitlines 32. Such bitlines extend along a direction corresponding to an illustrated y-axis, and such direction may ultimately correspond to a column direction of a memory array.

In some embodiments, the rails 28 may be considered to comprise the semiconductor material 14, and such rails may be considered to be formed over the bitlines 32. In some embodiments, the rails 28 may be considered to comprise the body region 24 and upper doped region 20 of the semiconductor material 14, and such rails may be considered to be formed over linear structures comprising the bitlines 32 and the lower doped region 20 of the semiconductor material 14. The lower doped regions 20 within such linear structures may be considered to be beams which extend along upper surfaces of the bitlines 32.

Figure 3A:
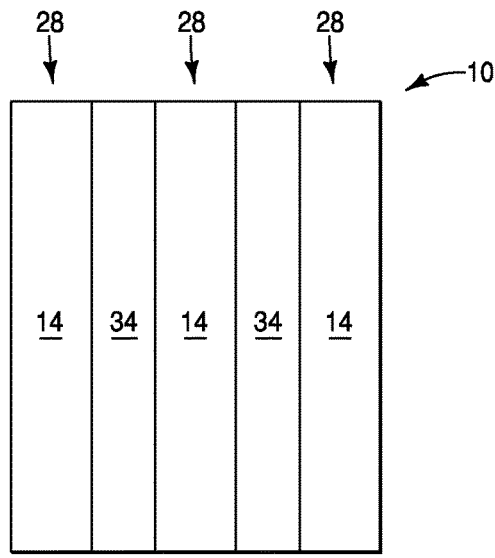
FIGS. 3 and 3A are a diagrammatic three-dimensional view and a diagrammatic top view, respectively, of the example assembly of FIGS. 1 and 1A at an example process stage following that of FIGS. 2 and 2A.
Figure 3:
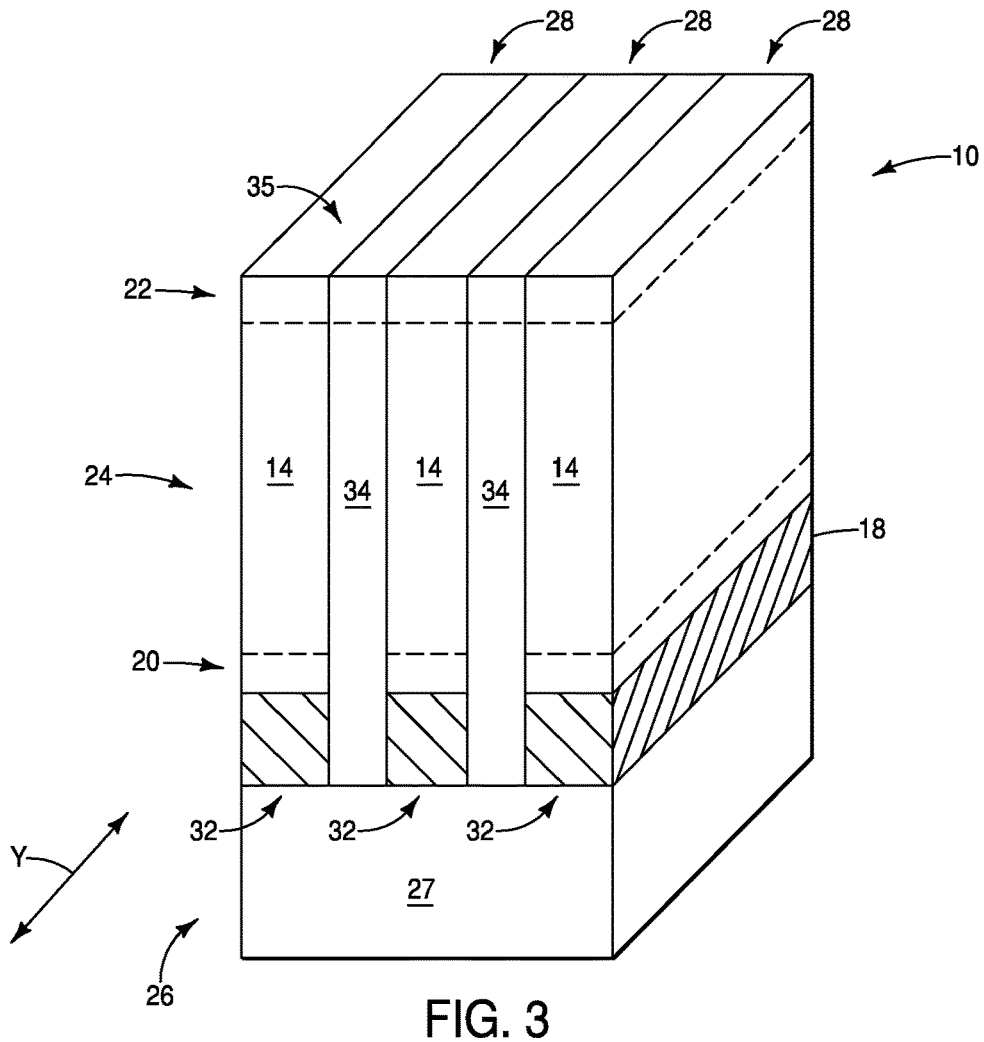

Referring to FIGS. 3 and 3A, insulative material 34 is formed between the rails 28, and in the shown embodiment fills the trenches 30 (FIGS. 2 and 2A). The insulative material 34 may comprise any suitable composition(s); including, for example, one or more of silicon dioxide, silicon nitride, and any of various low-k materials (with the term "low-k material" meaning a material having a lower dielectric constant than silicon dioxide, and including, for example, porous silicon dioxide).

In the shown embodiment, a planarized surface 35 extends across the materials 14 and 34. Such planarized surface may be formed utilizing any suitable processing; including, for example, chemical-mechanical polishing (CMP).

Figure 4A:
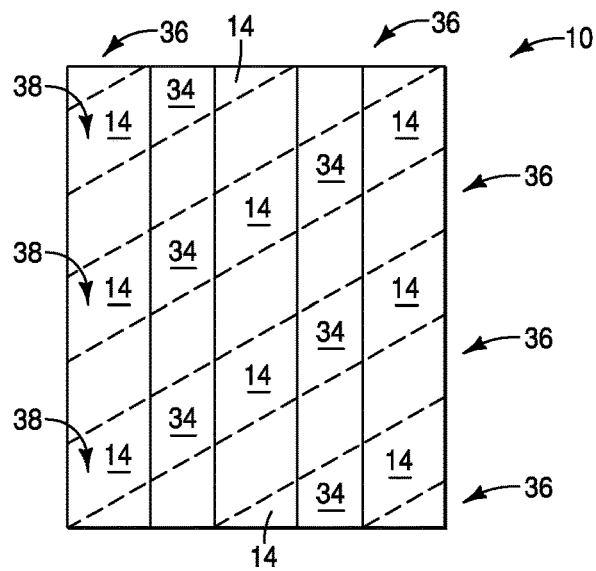
FIGS. 4 and 4A are a diagrammatic three-dimensional view and a diagrammatic top view, respectively, of the example assembly of FIGS. 1 and 1A at an example process stage following that of FIGS. 3 and 3A.
Figure 4:
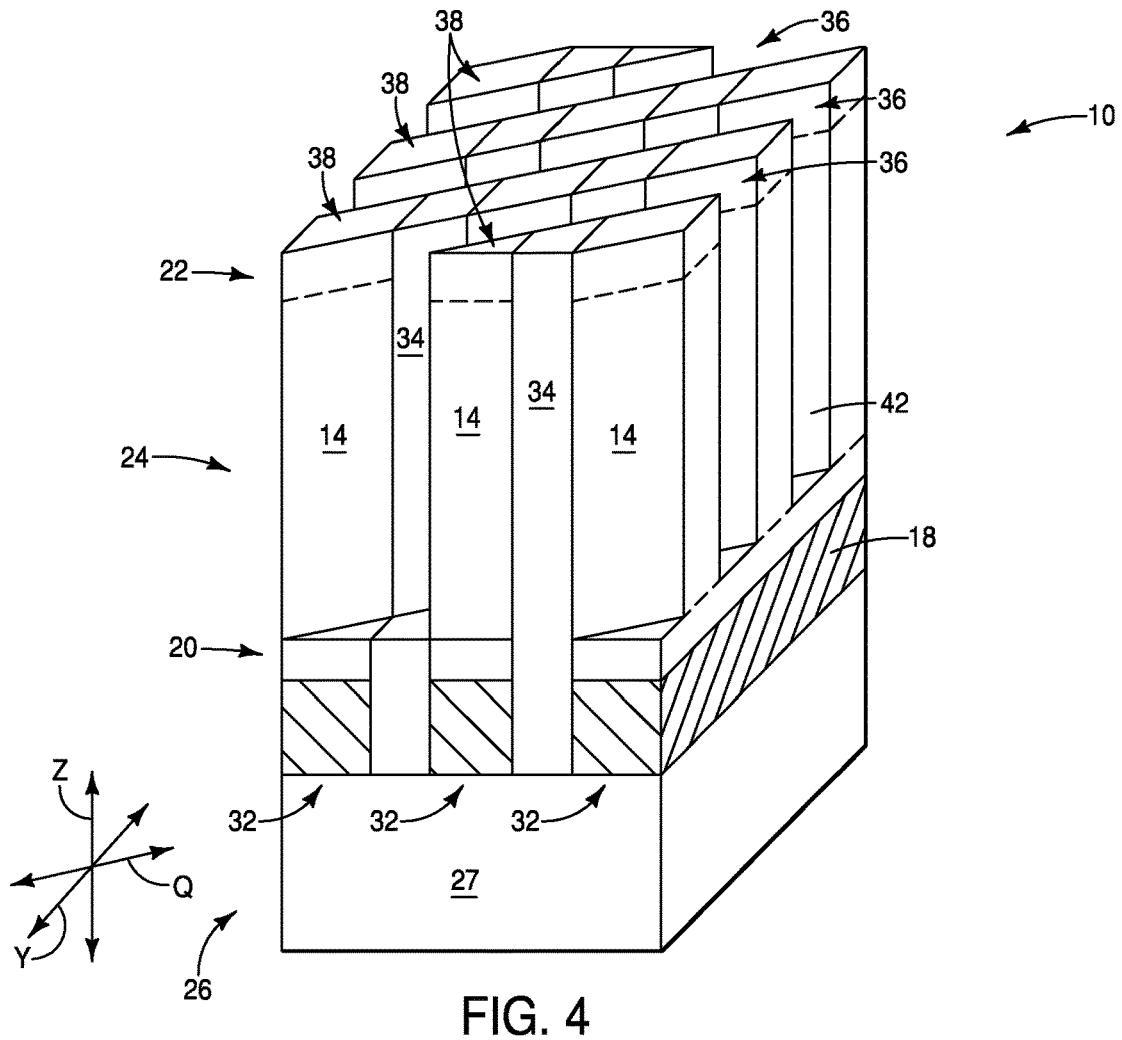

Referring to FIGS. 4 and 4A, trenches 36 are formed to extend through the insulative material 34 and into the rails 28 (FIGS. 3 and 3A). The trenches 36 slice the semiconductor material 14 of the rails 28 into structures 38 (only some of which are labeled). In some embodiments, the structures 38 are ultimately patterned into active region pillars (i.e., access device pillars), and may be referred to as templates of the pillars (or as pillar templates).

In the shown embodiment, the trenches 36 extend to a depth approximately coextensive with a top boundary of the lower doped region 20 within the semiconductor material 14. Such depth may be achieved utilizing a timed etch and/or by incorporating etch-stop material along a lower region of the insulative material 34 where it is desired for the bottoms of the trenches 36 to be formed.

The structures 38 extend vertically along an illustrated z-axis. The trenches 36 extend horizontally along an illustrated Q-axis, with the Q-axis crossing the y-axis and not being orthogonal to the y-axis.

Figure 5B:
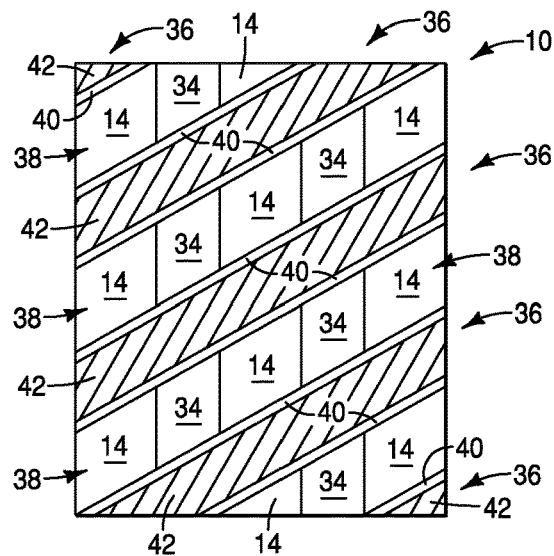
FIGS. 5, 5A and 5B are a diagrammatic three-dimensional view, a diagrammatic top view, and a diagrammatic cross-sectional top-down view, respectively, of the example assembly of FIGS. 1 and 1A at an example process stage following that of FIGS. 4 and 4A. The view of FIG. 5B is along a cross-section identified by the line B-B of FIG. 5.
Figure 5A:
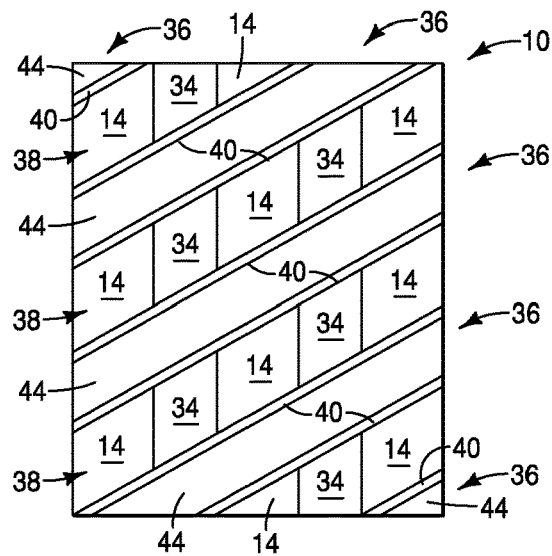
Figure 5:
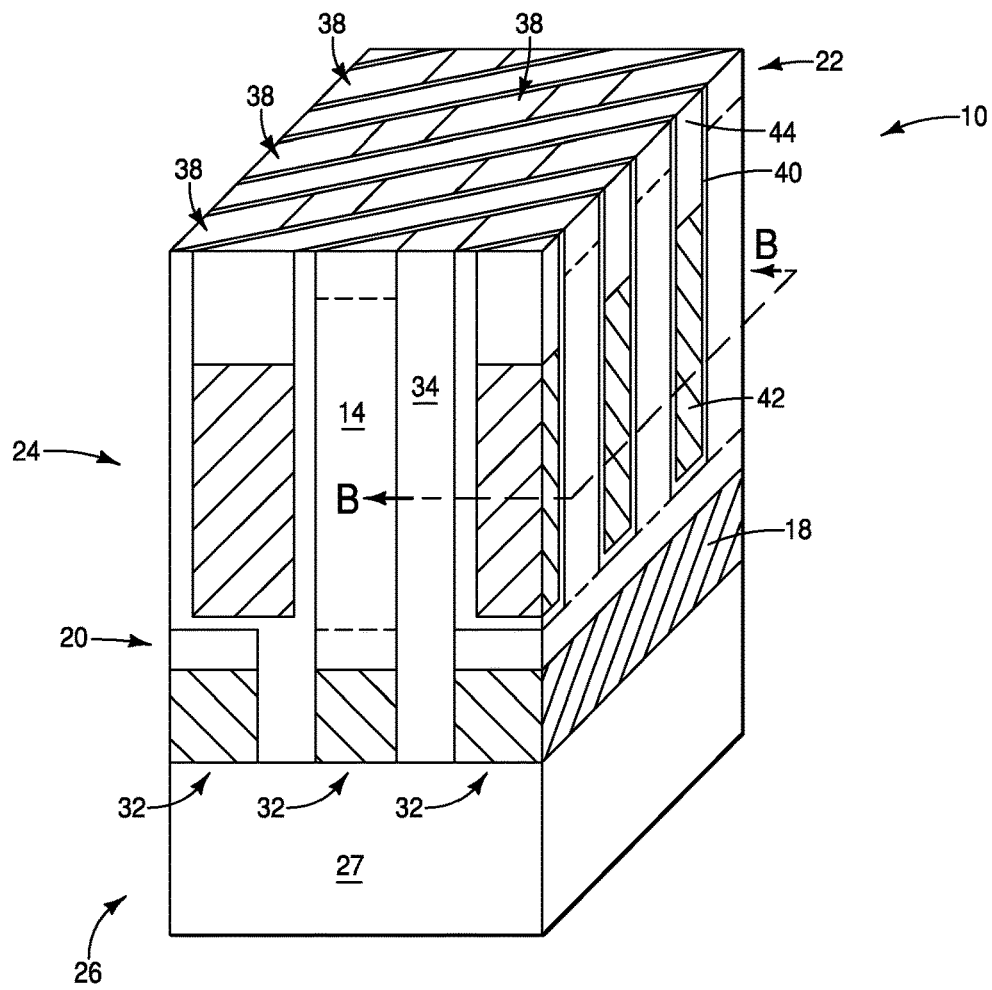

Referring to FIGS. 5, 5A and 5B, insulative material 40 is provided within the trenches 36 to line the trenches, and then conductive shield material 42 is provided within the lined trenches. In the shown embodiment, the conductive shield material 40 partially fills the lined trenches, and remaining regions of the lined trenches are filled with additional insulative material 44.

The insulative material 40 may comprise any suitable composition(s); and in some embodiments may comprise, consist essentially of, or consist of silicon dioxide.

The insulative material 44 may comprise any suitable composition(s); and in some embodiments may comprise, consist essentially of, or consist of silicon dioxide.

The insulative materials 34, 40 and 44 may be the same composition as one another in some embodiments. In other embodiments, at least one of the insulative materials 34, 40 and 44 may comprise a different composition than at least one other of such insulative materials.

The conductive shield material 42 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive shield material 42 may comprise, consist essentially of, or consist of conductively-doped semiconductor material (e.g., conductively-doped polycrystalline silicon). The conductively-doped semiconductor material may be doped to any suitable concentration, and in some embodiments may be doped to a concentration of at least about $1\times10^{20}$ atoms/cm$^3$ with either n-type dopant (e.g., phosphorus) or p-type dopant (e.g., boron). In other words, in some example embodiments the shield material 42 may comprise polycrystalline semiconductor material (e.g., polycrystalline silicon) which is heavily-doped with one or more impurities (e.g., one or more of phosphorus, arsenic, boron, etc.).

In some embodiments, the semiconductor material 14 and the shield material 42 may both comprise, consist essentially of, or consist of silicon; with the silicon of the semiconductor material 14 being monocrystalline, and with the silicon of the shield material 42 being polycrystalline (and in some applications, being referred to as polysilicon). In some embodiments, the doped regions 20 and 22 may be considered to comprise first semiconductor material (i.e., material 14), and the conductive shield material 42 may be considered to comprise second semiconductor material.

If the shield material 42 comprises conductively-doped silicon, the shield material may be doped to a same conductivity type as the doped regions 20 and 22, or may be doped to an opposite conductivity type as the doped regions 20 and 22 (with p-type and n-type being understood to be opposite conductivity types).

Referring to FIGS. 6, 6A, 6B and 6C, trenches 46 are formed to extend through the insulative materials 34, 40 and 44, the shield material 42, and the semiconductor material 14. The trenches 46 may be referred to as second trenches to distinguish them from the first trenches 36 (FIGS. 4 and 4A). Conductive material 54 is provided within the trenches 46 to form wordlines 58.

The trenches 46 extend along a direction of an x-axis. In some embodiments, the bitlines 32 may be considered to extend along a first direction corresponding to the direction of the y-axis, the second trenches 46 may be considered to extend along a second direction corresponding to the direction of the x-axis, and the first trenches 36 (FIGS. 4 and 4A) may be considered to extend along a third direction corresponding to the direction of the Q-axis. In the illustrated embodiment, the first and second directions (i.e., the directions of the y-axis and x-axis) are orthogonal to one another, and the third direction (i.e., the direction of the Q-axis) crosses the first and second directions (i.e., crosses the y-axis and the x-axis). In some embodiments, the wordlines 58 may be considered to extend horizontally in a first direction (i.e., the direction of the x-axis), and the bitlines may be considered to extend horizontally in a second direction (i.e., the direction of the y-axis); with the second direction crossing the first direction, and being orthogonal to the first direction in the shown embodiment.

The first trenches 36 extend to a first depth $D_1$ (shown relative to FIG. 6B), and the second trenches 46 extend to a second depth $D_2$ (also shown relative to FIG. 6B), with the second depth ($D_2$) being less than the first depth ($D_1$). Accordingly, regions of the shield material 42 are left beneath the second trenches 46 (and beneath the wordlines 58), as is diagrammatically illustrated in FIG. 6C.

Figure 6A:
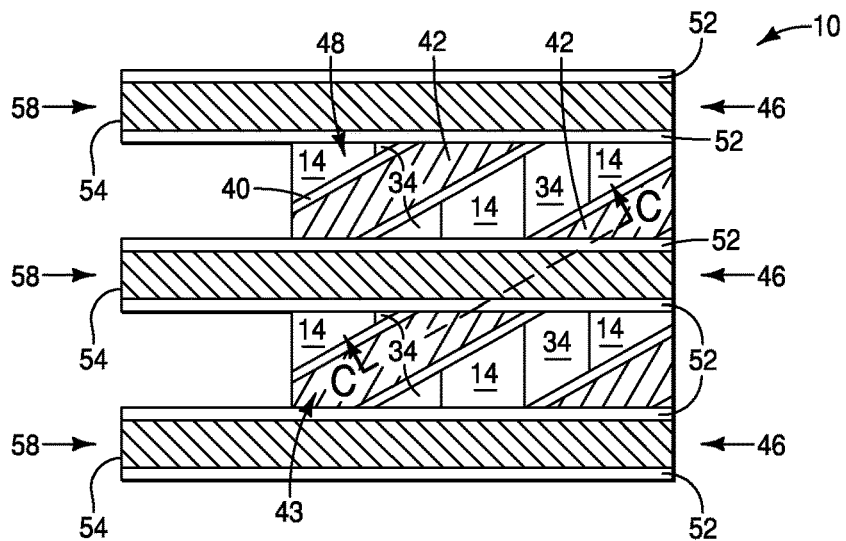
FIGS. 6, 6A, 6B and 6C are a diagrammatic three-dimensional view (FIG. 6), a diagrammatic cross-sectional top-down view (FIG. 6A), and diagrammatic cross-sectional side views (FIGS. 6B and 6C), of the example assembly of FIGS. 1 and 1A at an example process stage following that of FIGS. 5, 5A and 5B. The view of FIG. 6A is along a cross-section identified by the line A-A of FIG. 6. The view of FIG. 6B is along the side B of FIG. 6. The view of FIG. 6C is along the line C-C of FIG. 6A.
Figure 6:
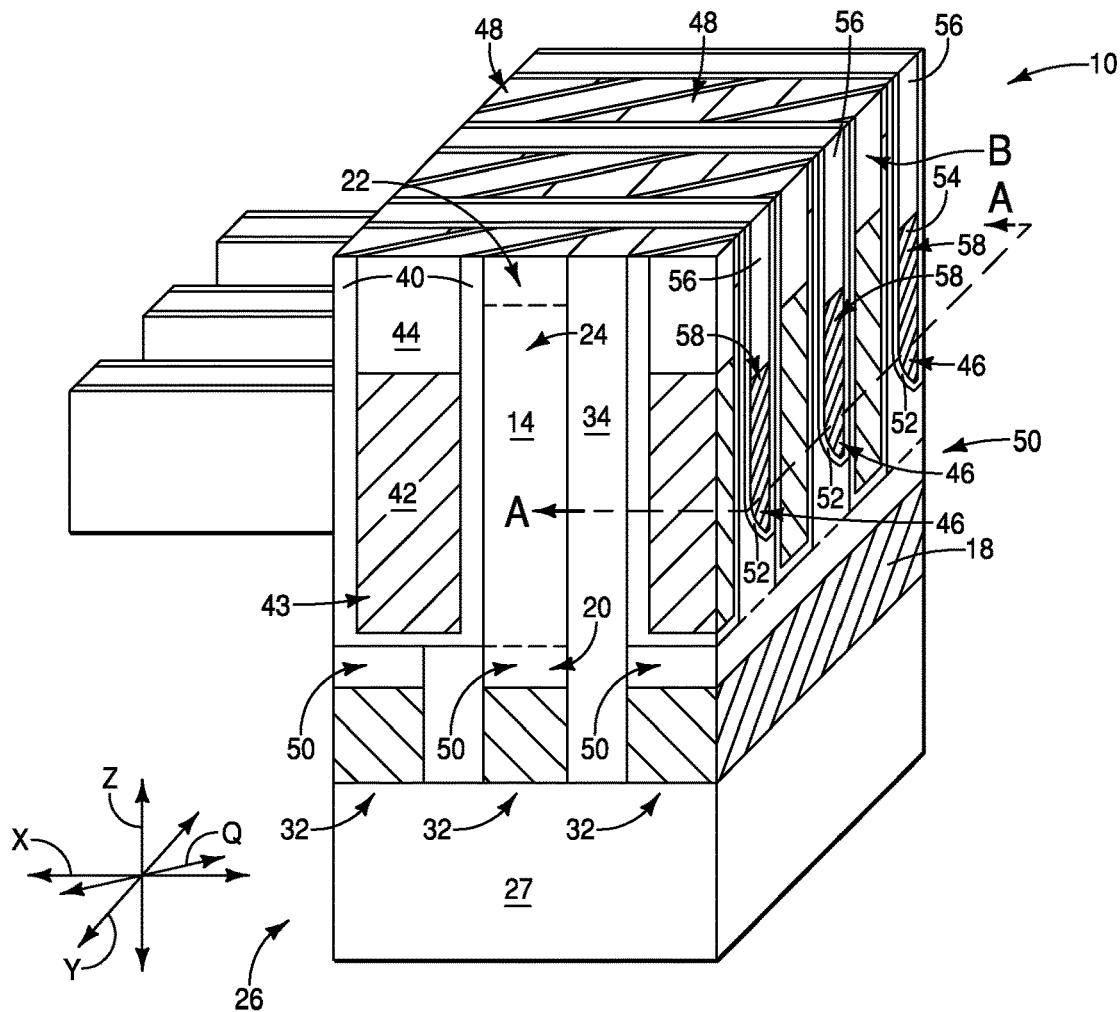
Figure 6B:
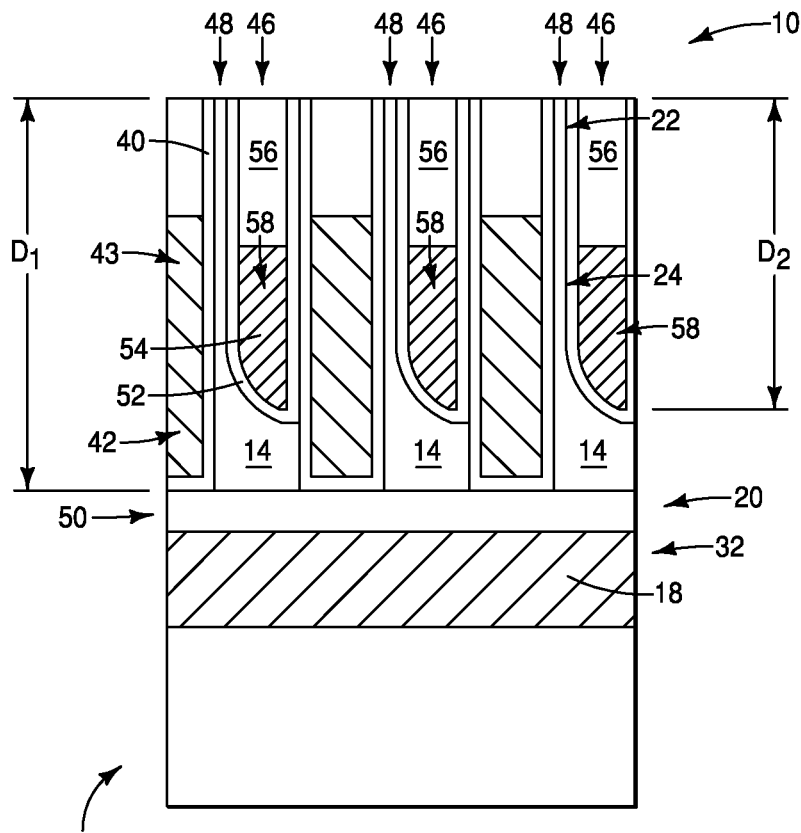

The second trenches 46 pattern the pillar templates 38 (FIGS. 5, 5A and 5B, where only some of the pillar templates are labeled) into semiconductor pillars 48 (shown in FIGS. 6, 6A and 6B, with only some of the semiconductor pillars 48 being labeled). The pillars 48 comprise the semiconductor material 14, and extend vertically from a supporting base comprising the digit lines 32 (the vertical direction is represented by a z-axis shown relative to FIG. 6). The doped regions 20 and 22 become vertically-opposed first and second source/drain regions (which may also be referred to as first and second diffusion regions), and the central region 24 is a body region which is vertically between the first and second source/drain regions 20 and 22. The first source/drain regions 20 are coupled with the bitlines 32. In the shown embodiment, the first source/drain regions 20 are not patterned into the pillars 48, and instead remain as beams 50 extending along upper surfaces of the bitlines 32. The structures comprising the source/drain regions 20 and 22, and the central regions 24 between the source/drain regions, may be referred to as active devices or as access devices.

The trenches 46 are lined with gate dielectric material 52, and then the conductive wordline material 54 is formed within the lined trenches.

The gate dielectric material 52 may comprise any suitable composition(s); and in some embodiments may comprise, consist essentially of, consist of silicon dioxide.

The wordline material 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments, the wordline material 54 may comprise one or more of tungsten, titanium, tantalum, tungsten nitride, titanium nitride, tantalum nitride, etc. The wordline material 54 may be a same metal-containing composition as the bitline material 18, or may be a different composition relative to the bitline material 18.

In the shown embodiment, the wordline material 54 partially fills the lined trenches 46, and insulative material 56 is formed over the wordline material 54 to fill the trenches 46. The insulative material 56 may comprise any suitable composition(s); and in some embodiments may comprise, consist essentially of, or consist of silicon dioxide.

The wordline material 54 within the trenches 46 is patterned into the wordlines 58, with such wordlines extending along the first direction of the x-axis. FIGS. 6 and 6A show the wordlines 58 extending beyond the arrangement comprising the pillars 48 and shield material 42 in order to better emphasize the linear configuration of the wordlines.

Figure 6C:
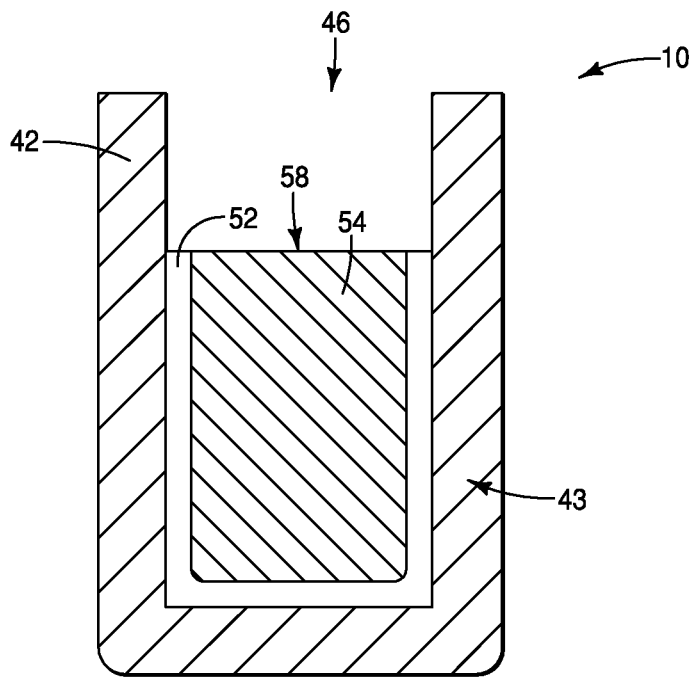

FIG. 6C shows a portion of a wordline 58 along the cross-section C-C of FIG. 6A. As discussed above, the trenches 46 are less deep than the trenches 36 (with the trenches 46 extending to the depth $D_2$ shown relative to FIG. 6B, and the trenches 36 extending to the depth $D_1$ shown relative to FIG. 6B). Accordingly, the trenches 46 only extend partially through the shield material 42, and thus the shield material 42 passes under the wordline 58. The configuration of FIG. 6C may be considered to show the shield material 42 passing entirely under the wordline 58, and may be contrasted with other configurations described in this disclosure.

The shield material 42 of FIGS. 6, 6A, 6B and 6C may be considered to be configured as a shield plate 43.

FIGS. 7 and 7A show the configuration of FIG. 6 incorporated into a memory array 60. The upper source/drain regions 22 (i.e., second source/drain regions, second diffusion regions) are electrically connected with (i.e., electrically coupled with) storage elements 62. The storage-elements may be any suitable devices having at least two detectable states; and in some embodiments may be, for example, capacitors, resistive-memory devices, conductive-bridging devices, phase-change-memory (PCM) devices, programmable metallization cells (PMCs), etc. In the shown embodiment, the storage elements 62 are capacitors. Each of the capacitors has a node coupled with a reference voltage 64 (only one of which is labeled). Such reference voltage may be any suitable voltage; such as, for example, ground, VCC/2, etc.

The bottom source/drain regions 20 (i.e., first source/drain regions, first diffusion regions) are electrically connected with (i.e., electrically coupled with) the bitlines (i.e., digit lines) 32.

The pillars 48 may be considered to correspond to regions of access devices (transistors), and the body regions 24 may be considered to comprise transistor channel regions 25 which are vertically disposed between the upper and lower source/drain regions 22 and 20. The wordlines 58 may be considered to be adjacent the access devices, and to comprise gates (transistor gates) associated with the access devices and configured to gatedly couple the source/drain regions 20 and 22 with one another through the channel regions 25.

The wordlines 58 may be considered to correspond to buried wordlines (i.e., the wordlines are recessed into the semiconductor material 14), with such buried wordlines extending along the first direction corresponding to the x-axis. The buried wordlines may be considered to extend along rows 66 of the memory array 60. The buried wordlines are spaced from the channel regions 25 of the pillars 48 by intervening regions comprising the gate dielectric material 52.

The bitlines 32 extend along the second direction corresponding to the y-axis, and may be considered to extend along columns 68 of the memory array 60.

The pillars (i.e., access-device-pillars, semiconductor-material pillars) 48 may be considered to be arranged in the rows 66 and the columns 68 of the memory array 60. The pillars 48 along a given column 68 will be those pillars coupled with a common bitline 32. The pillars 48 along a given row 66 will be those pillars coupled with a common wordline. The wordlines 58 are labeled as 58a, 58b and 58c so that they may be distinguished from another. The rows 66 may be considered to include rows 66a, 66b and 66c; with the row 66a comprising the pillars 48 associated with the wordline 58a, the row 66b comprising the pillars 48 associated with the wordline 58b, and the row 66c comprising the pillars associated with the wordline 58c. The individual rows are loosely labeled as 66a, 66b and 66c in FIG. 7, and more clearly identified in FIG. 7A. It is noted that the pillars of individual rows alternate on either side of a wordline. To assist the reader in identifying the rows, the individual pillars 48 are each identified relative to a specific one of the rows 66a, 66b and 66c that the pillars are associated with in FIG. 7. The pillars associated with the row 66a are labeled 166a, the pillars associated with the row 66b are labeled 166b and the pillars associated with the row 66c are labeled 166c.

It is to be understood that each row (e.g., row 66a) comprises a first series (i.e., first set) of pillars on one side of a wordline, and a second series (i.e., second set) of pillars on an opposing side of the wordline. For instance, two of the pillars identified as being associated with the row 66a are identified as 166a-1 in FIG. 7 to show that they are part of a first series on one side of the wordline 58a, and another of the pillars is identified as 166a-2 to show that it is part of a second series on an opposing side of the wordline 58a. In some embodiments, the first and second sides of the wordlines may be referred to as first and second lateral surfaces of the wordlines, as discussed in more detail below relative to other example embodiments.

Electrical activation of a wordline may induce electrical fields along channel regions 25 of pillars 48 along a row 66 associated with the wordline, and such may couple the source/drain regions 20 and 22 to one another through the channel regions 25. Deactivation of the wordline may then decouple the source/drain regions 20 and 22 from one another. When the term "gated coupling" is utilized herein, such may refer to the controlled coupling/decoupling of the source/drain regions 20 and 22 from one another that may be induced by electrical activation/deactivation the wordlines 58.

The shield plate 43 is coupled with (i.e., electrically connected with) a reference source (i.e., reference voltage node, reference structure, reference terminal, etc.) 70. The reference source is configured to provide a desired voltage to the shield plate 43. Such voltage may be any suitable voltage, and in some embodiments may be a ground voltage (i.e., the shield plate 43 may be electrically grounded).

FIG. 7A illustrates a relationship of the shield material 42 (or alternatively, the shield plate 43), and the wordlines 58 relative to the pillars 48. One of the pillars is labeled 48 a so that it may be distinguished from the other pillars. The pillar 48a has a first side surface 15, and an opposing second side surface 17. The first side surface 15 is proximate to a wordline 58, and the second side surface 17 is proximate to the shield plate 43. A first insulating material 52 (i.e., gate dielectric material) is between the wordline 58 and the first side surface 15, and a second insulating material 40 is between the second side surface 17 and the shield plate 43. The first and second insulating materials 52 and 40 may be a same composition as one another (e.g., may both comprise, consist essentially of, or consist of silicon dioxide) or may be different compositions relative to one another. In some embodiments, the insulating material 52 may be considered to be configured as an intervention of first insulating material between the wordline 58 and the first side surface 15 of the channel region 25, and the insulating material 40 may be considered to be configured as an intervention of a second insulating material between the shield plate 43 and the second side surface 17 of the channel region 25.

FIGS. 8-12 illustrate another example method for forming another example memory array.

Figure 8:
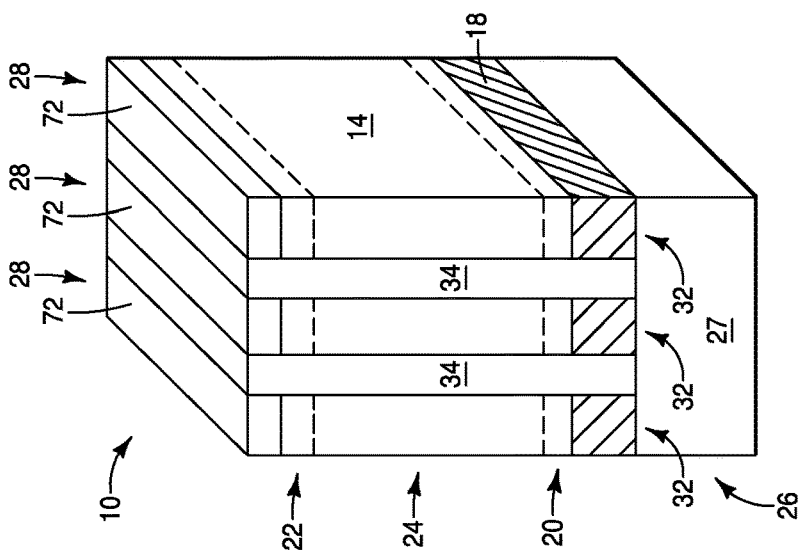

Referring to FIG. 8, such shows the construction 10 at a process stage analogous to the process stage of FIG. 3. Protective capping material 72 is over the rails 28. The capping material may comprise any suitable composition(s); and in some embodiments may comprise, consist essentially of, or consist of silicon dioxide.

Figure 9:
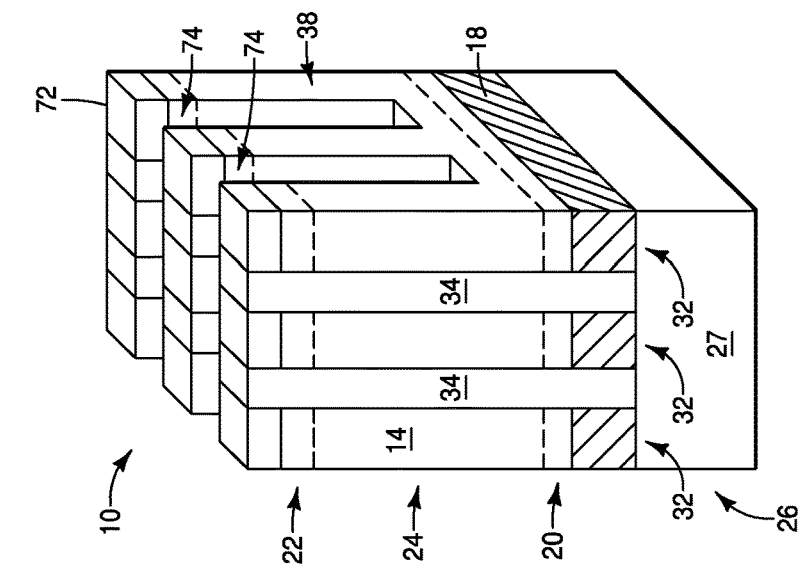

Referring to FIG. 9, trenches 74 are formed to extend through the materials 14, 34 and 72. The trenches 74 extend along the first direction of the x-axis. The trenches 74 pattern the semiconductor material 14 of the rails 28 (FIG. 8) into the pillar templates 38.

Figure 10:
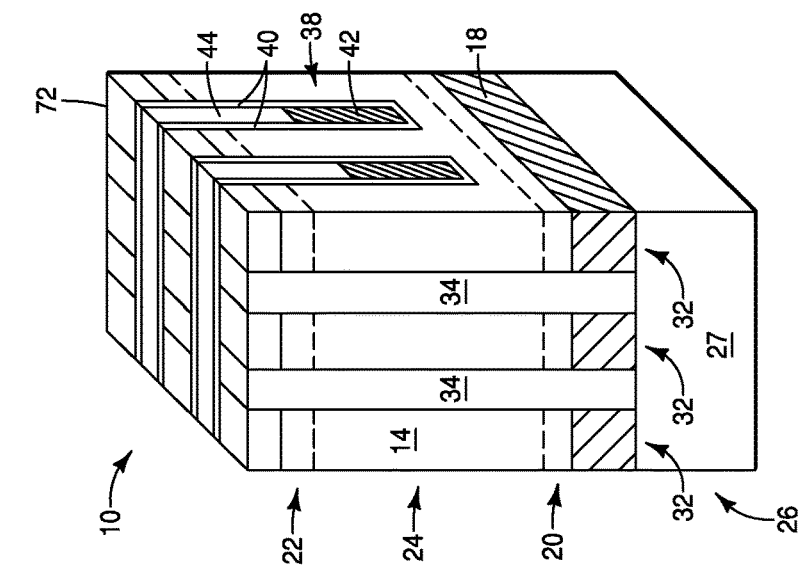
FIGS. 8-12 are diagrammatic three-dimensional views of an example assembly at example process stages of an example method for fabricating an example array of memory cells.

Referring to FIG. 10, the trenches are lined with insulative material 40, the shield material 42 is formed within the lines trenches, and the insulative material 44 is formed over the shield material.

Figure 11:
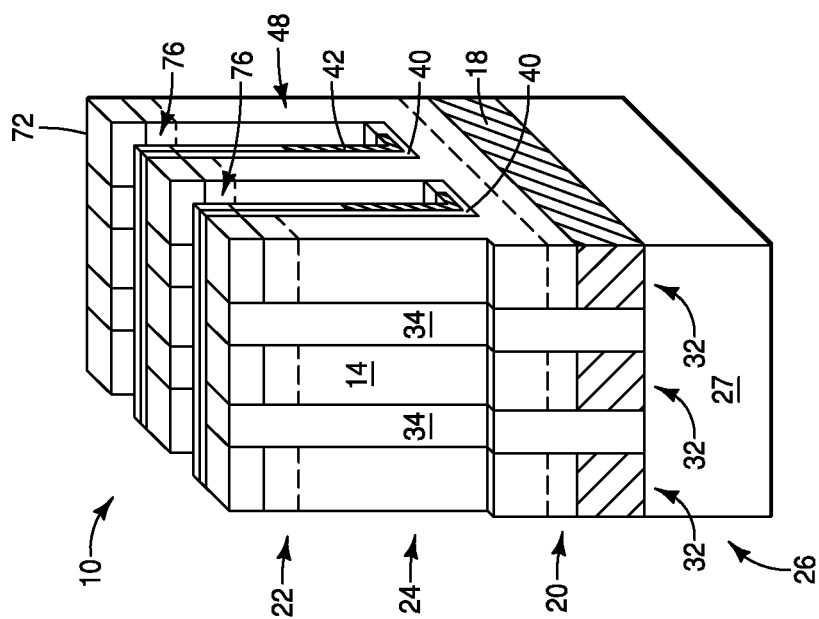

Referring to FIG. 11, trenches 76 are formed to pattern the pillar templates 38 into the pillars 48. The trenches 76 are offset relative to the trenches 74 (FIG. 9) so that the trenches 76 cut through the shield material 42 to leave remaining regions of the shield material along only one side of each of the trenches 76.

Figure 12:
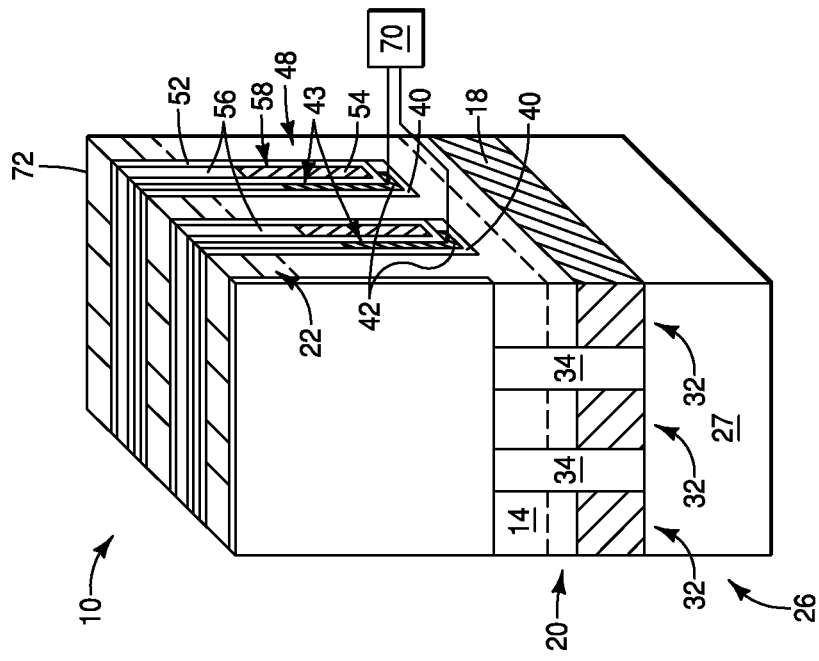

Referring to FIG. 12, the gate dielectric material 52 is provided within the trenches 76 to line such trenches, and then the wordline material 54 is formed within the lined trenches and recessed to only partially fill the lined trenches. The insulative material 56 is formed over the recessed wordline material 54 within the lined trenches 76.

The shield material 42 is patterned as shield plates 43, and such shield plates are coupled with the reference structure 70. In subsequent processing, storage elements analogous to the elements 62 of FIG. 7 may be coupled with the upper source/drain regions 22 of the pillars 48. Accordingly, the pillars 48 may be incorporated into a memory array analogous to the array 60 described above with reference to FIG. 7.

Figure 14:
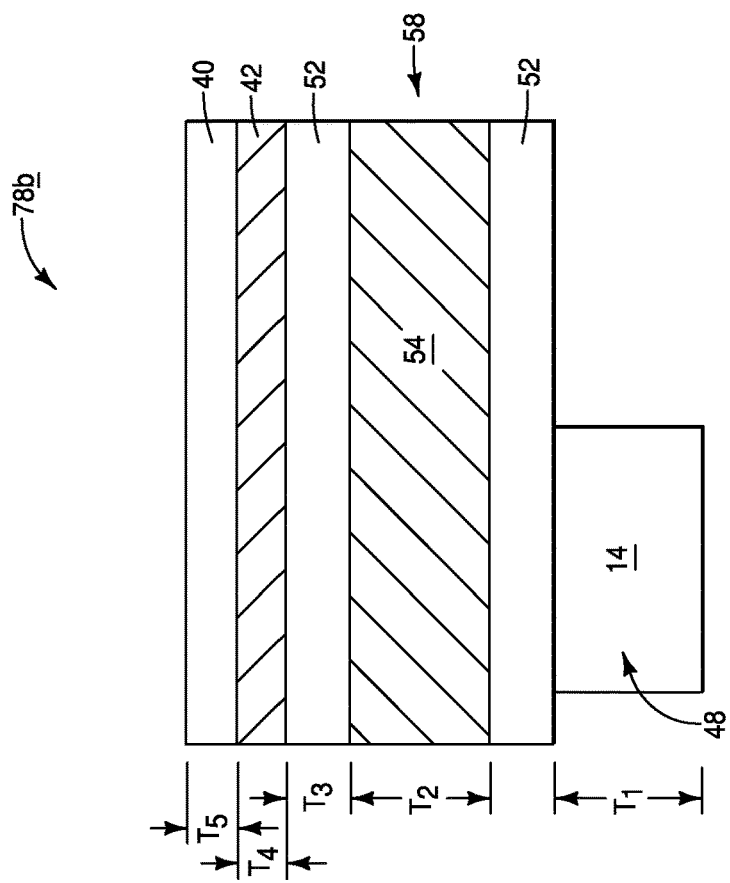
FIGS. 13 and 14 are diagrammatic top-down cross-sectional views of example memory configurations.
Figure 13:
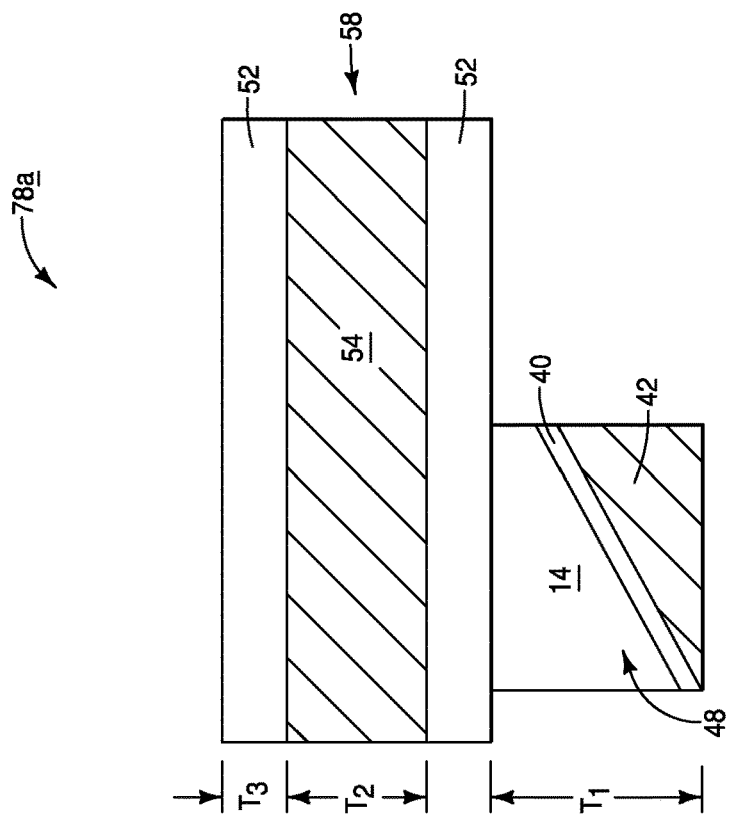

FIGS. 13 and 14 compare a memory configuration from the architecture of FIG. 7 (the configuration 78a of FIG. 13) with a memory configuration from the architecture of FIG. 12 (the configuration 78b of FIG. 14).

The configuration 78a of FIG. 13 comprises the wordline 58 extending across an angled region of a pillar 48 comprising the semiconductor material 14. A wide portion of the semiconductor material 14 may have a horizontal thickness $T_1$ within a range of from about 15 nanometers (nm) to about 25 nm. The wordline 58 may have a horizontal thickness $T_2$ within a range of from about 10 nm to about 20 nm, and the gate dielectric material 52 may have a thickness $T_3$ within a range of from about 2 nm to about 8 nm.

The configuration 78b of FIG. 14 comprises the wordline 58 extending across a pillar 48 of semiconductor material 14. The pillar 48 may have the horizontal thickness $T_1$ along the wordline 58, or may have a narrower horizontal thickness (e.g., a horizontal thickness within a range of from about 10 nm to about 15 nm). The wordline 58 of the configuration of FIG. 14 comprises the same horizontal thickness $T_2$ as the wordline 58 of the configuration of FIG. 13, and the gate dielectric material 52 of the configuration of FIG. 14 comprises the same horizontal thickness $T_3$ as the gate dielectric material of the configuration of FIG. 13. The shield material 42 of the configuration of FIG. 14 comprises a horizontal thickness $T_4$ which may be within a range of from about 5 nm to about 20 nm, and the insulative material 40 of the configuration of FIG. 14 comprises a horizontal thickness $T_5$ which may be within a range of from about 2 nm to about 8 nm.

Another example embodiment for forming an example memory array is described with reference to FIGS. 15-22.

Figure 15B:
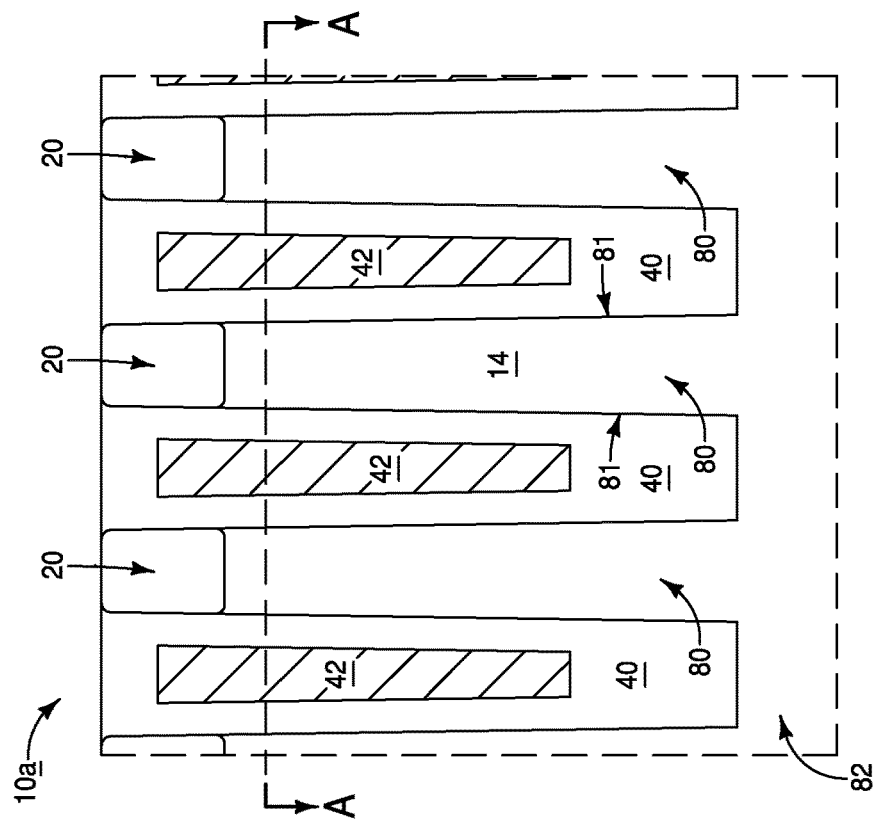
FIGS. 15A and 15B are a diagrammatic cross-sectional top-down view and a diagrammatic cross-sectional side view, respectively, of an example assembly at an example process stage of an example method for fabricating an example array of memory cells. The view of FIG. 15A is along the line A-A of FIG. 15B, and the view of FIG. 15B is along the line B-B of FIG. 15A.
Figure 15A:
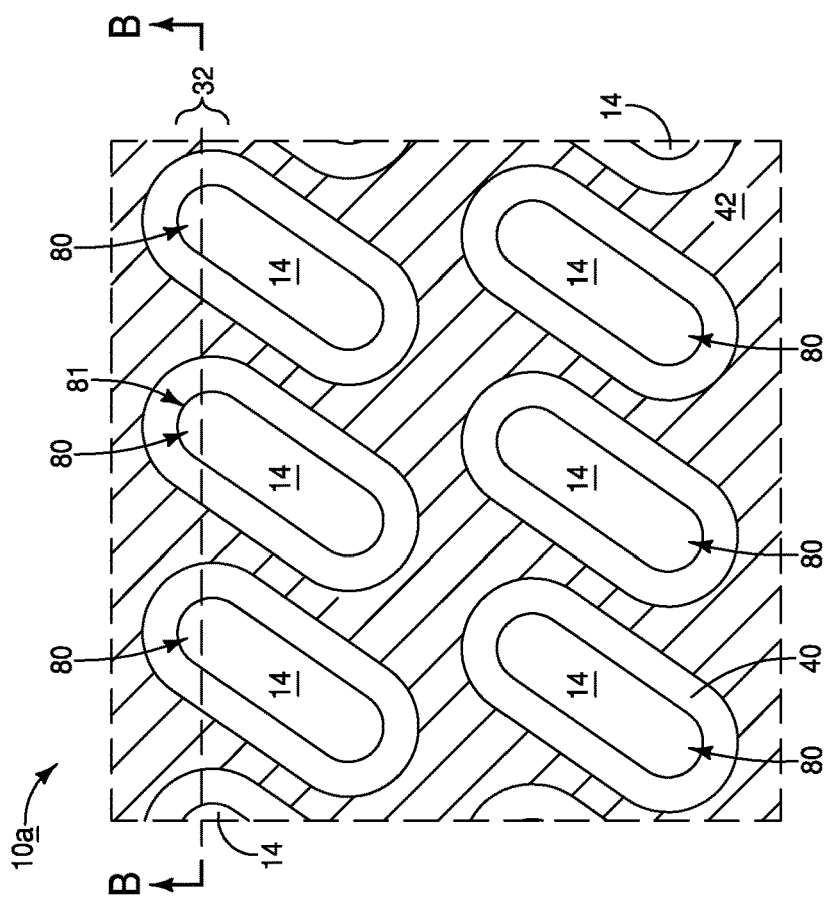

Referring to FIGS. 15A and 15B, a construction 10a comprises islands 80 of semiconductor material 14 extending upwardly from a mass 82 of the semiconductor material. The islands have doped regions 20. Such regions 20 are upper regions at the processing stage of FIG. 15B, and may have the source/drain doping of the type described with reference to FIG. 1. In some embodiments, the doped regions 20 may be considered to correspond to first source/drain regions.

Insulative material 40 is formed to laterally surround the islands, and lines outer lateral surfaces 81 of the islands. The insulative material 40 may be referred to as a first insulative material to distinguish it from other insulative materials formed at subsequent process stages.

Conductive shield material 42 is formed between the lined islands.

Figure 16B:
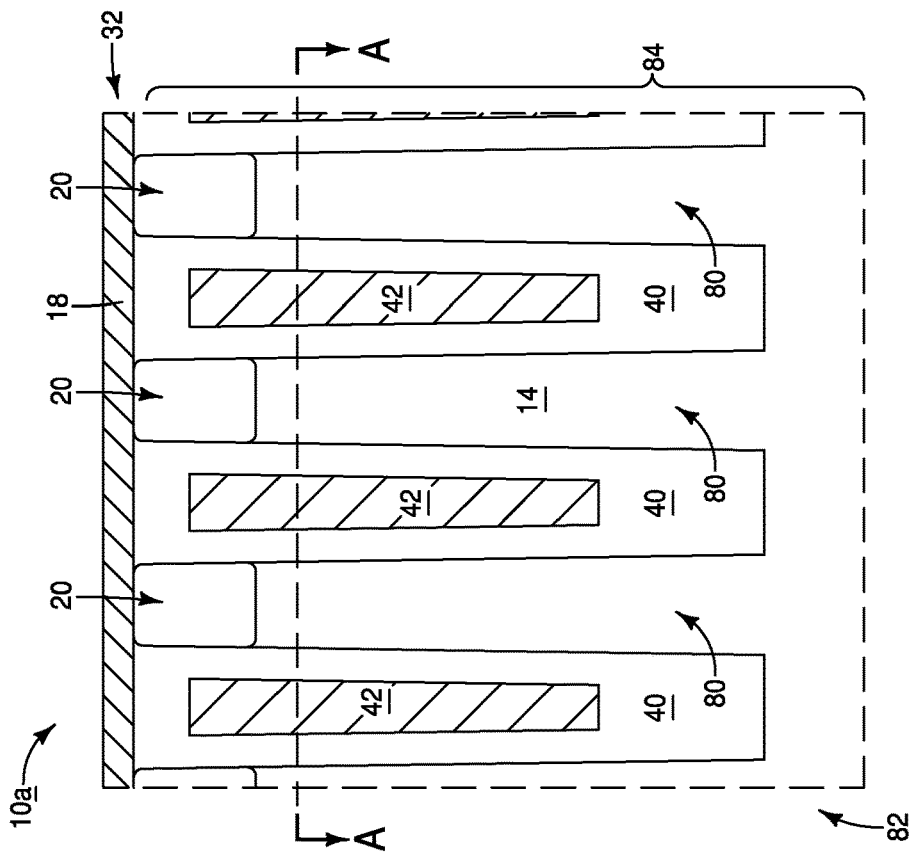
FIGS. 16A and 16B are a diagrammatic cross-sectional top-down view and a diagrammatic cross-sectional side view, respectively, of the example assembly of FIGS. 15A and 15B at an example process stage following that of FIGS. 15A and 15B. The view of FIG. 16A is along the line A-A of FIG. 16B, and the view of FIG. 16B is along the line B-B of FIG. 16A.
Figure 16A:
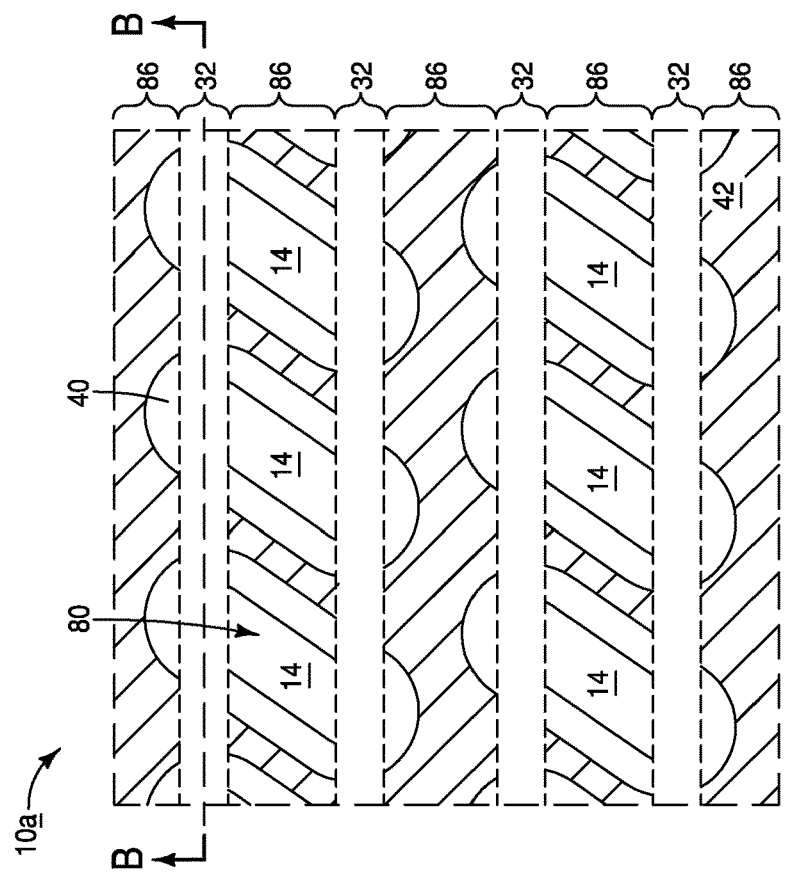

Referring to FIGS. 16A and 16B, bitlines 32 are formed over the islands, and are electrically coupled with (i.e., electrically connected with) the doped regions 20. In some embodiments, a planarized surface may extend across the doped regions 20 and the insulative material 40, and the bitlines may be formed along such planarized surface. The bitlines 32 comprise the bitline material 18 described above with reference to FIG. 1, and extend along the second direction of the y-axis.

The bitlines 32 are shown in dashed-line view in FIG. 16A to indicate that the bitlines are out of the plane relative to the cross-section of FIG. 16A.

In some embodiments, the insulative material 40, semiconductor material 14 and conductive shield material 42 may be considered together to form a structure 84, and the bitlines 32 may be considered to be formed to extend across an upper surface of such structure. Notably, two bitlines extend across each of the islands, as shown relative to the top view of FIG. 16A. The bitlines 32 may be considered to form a pattern across the structure 84. The bitlines 32 are spaced from another by gaps 86.

Figure 17B:
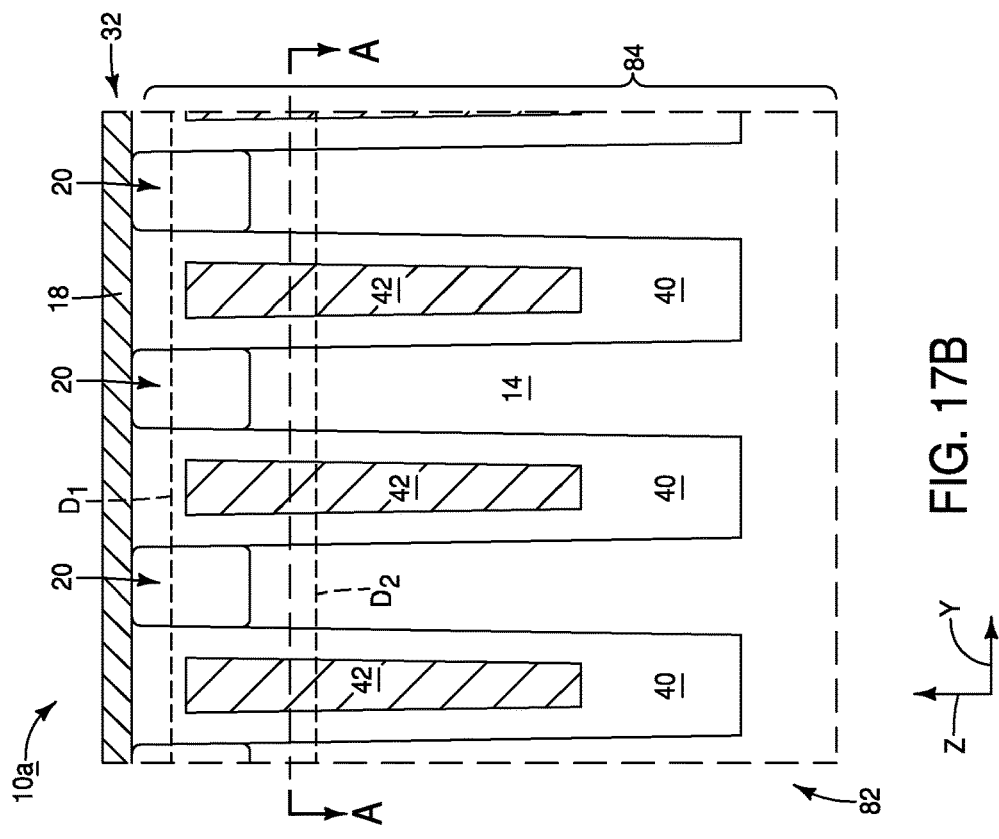
FIGS. 17A-17E are a diagrammatic cross-sectional top-down view (FIG. 17A) and diagrammatic cross-sectional side views (FIGS. 17B-17E) of the example assembly of FIGS. 15A and 15B at an example process stage following that of FIGS. 16A and 16B. The view of FIG. 17A is along the line A-A of FIG. 17B. The views of FIG. 17B-17D are along the lines B-B, C-C, D-D and E-E, respectively, of FIG. 17A.
Figure 17A:
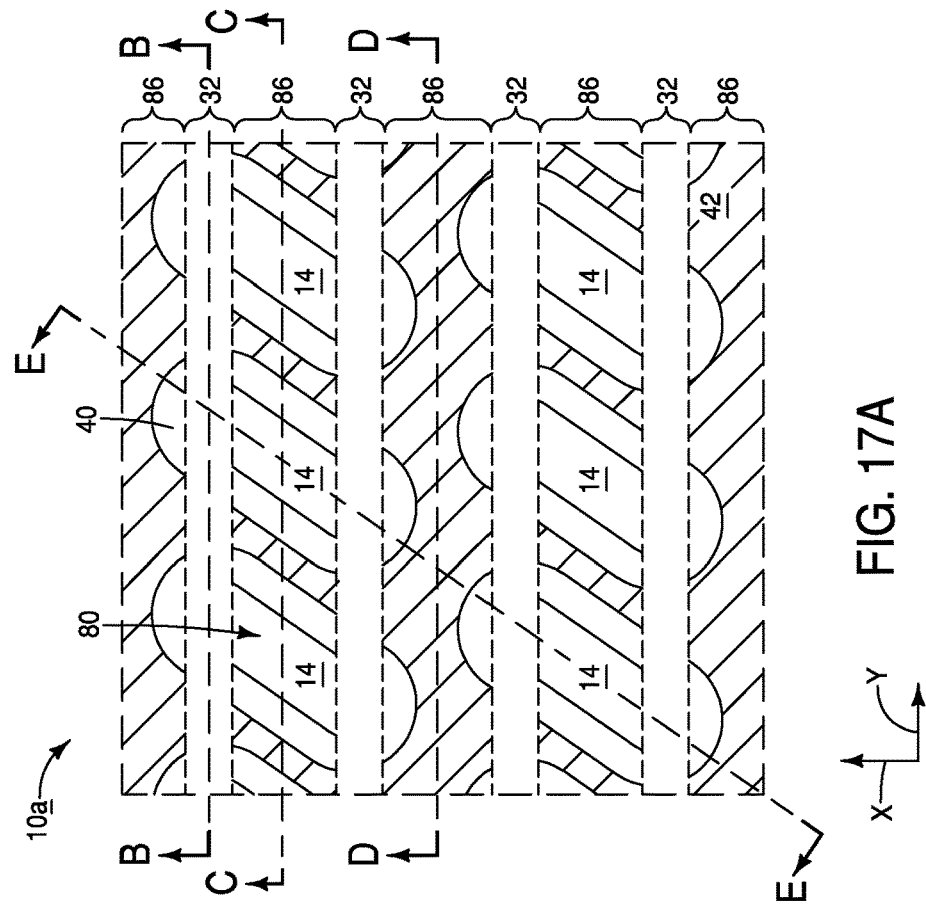
Figure 17D:
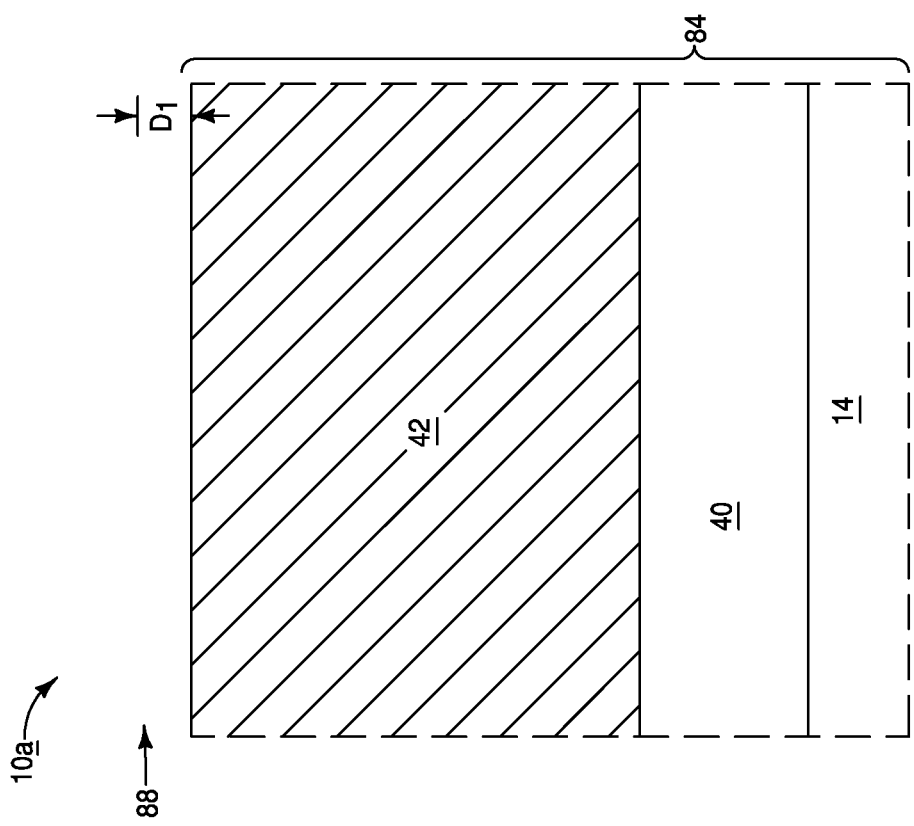
Figure 17C:
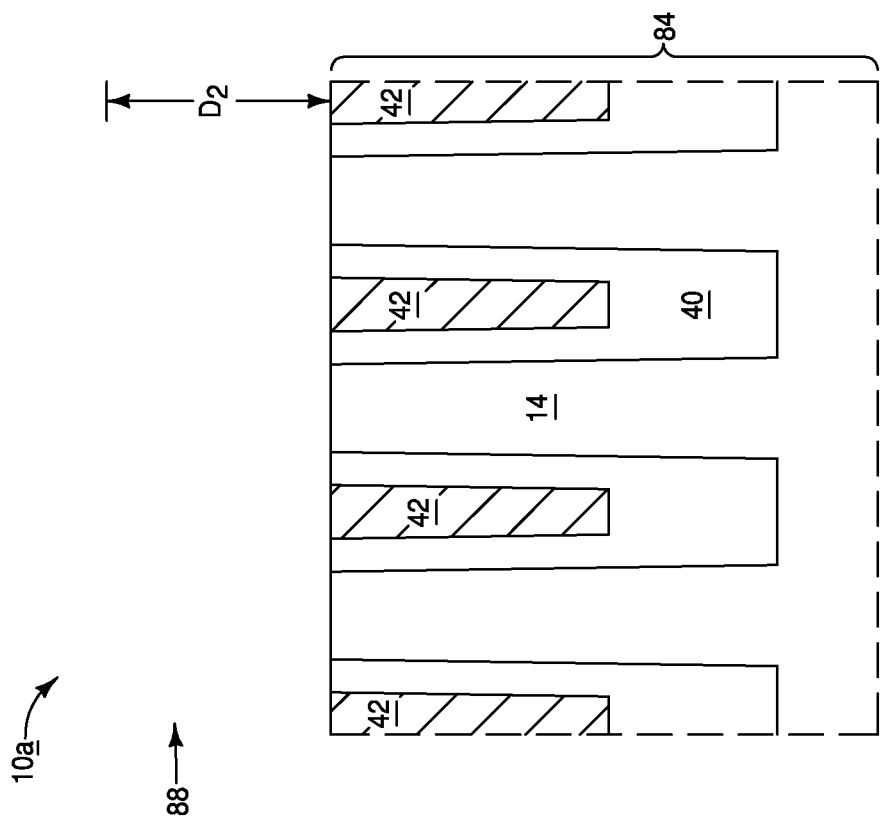
Figure 17E:
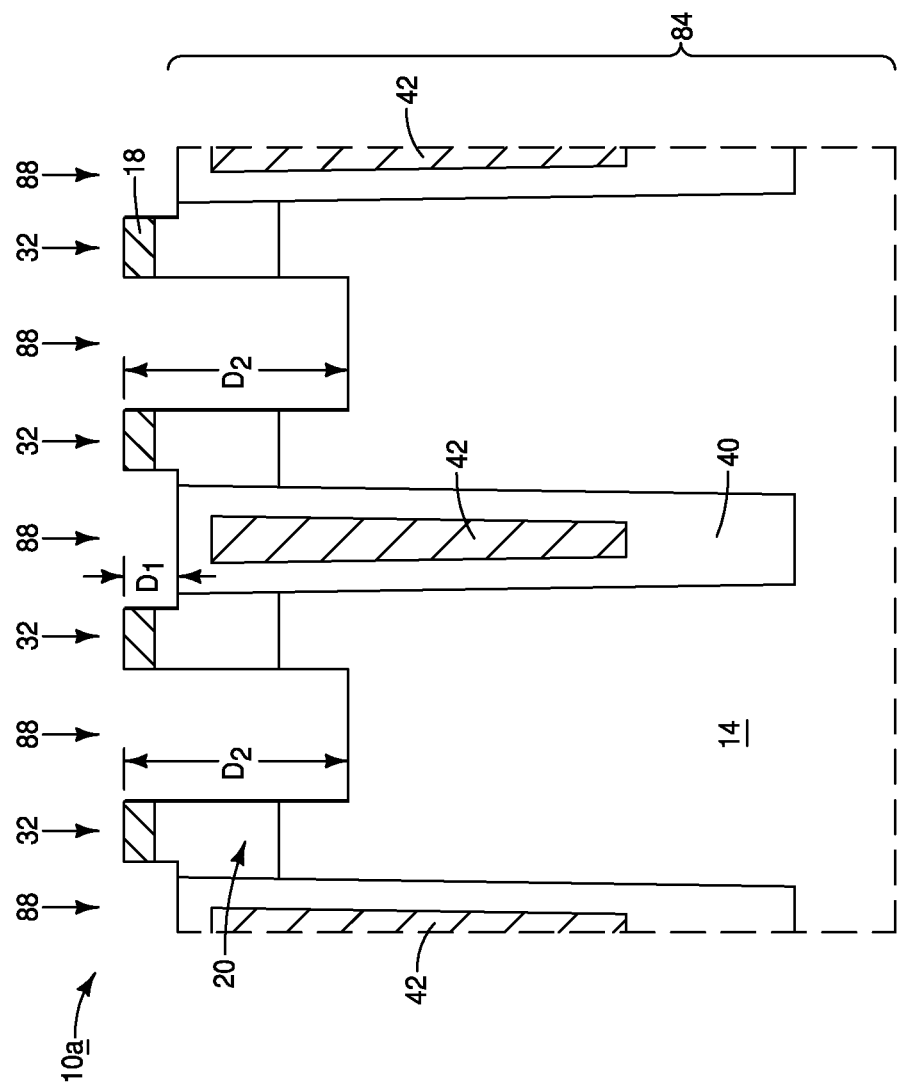
Figure 18B:
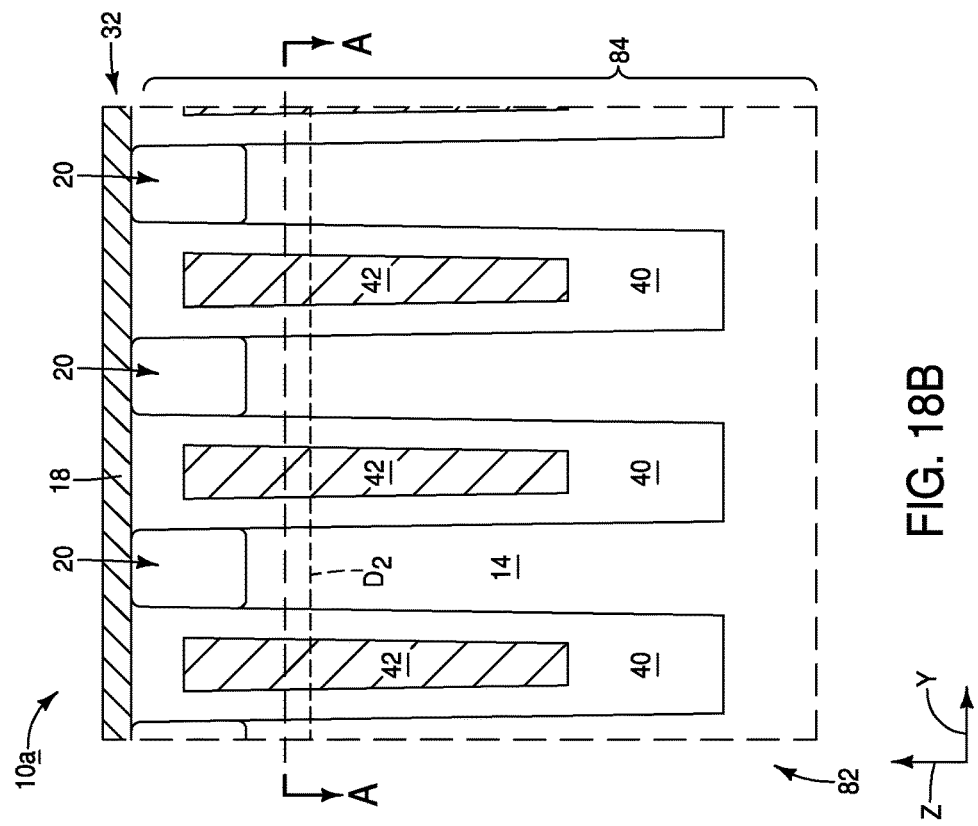
Figure 18A:
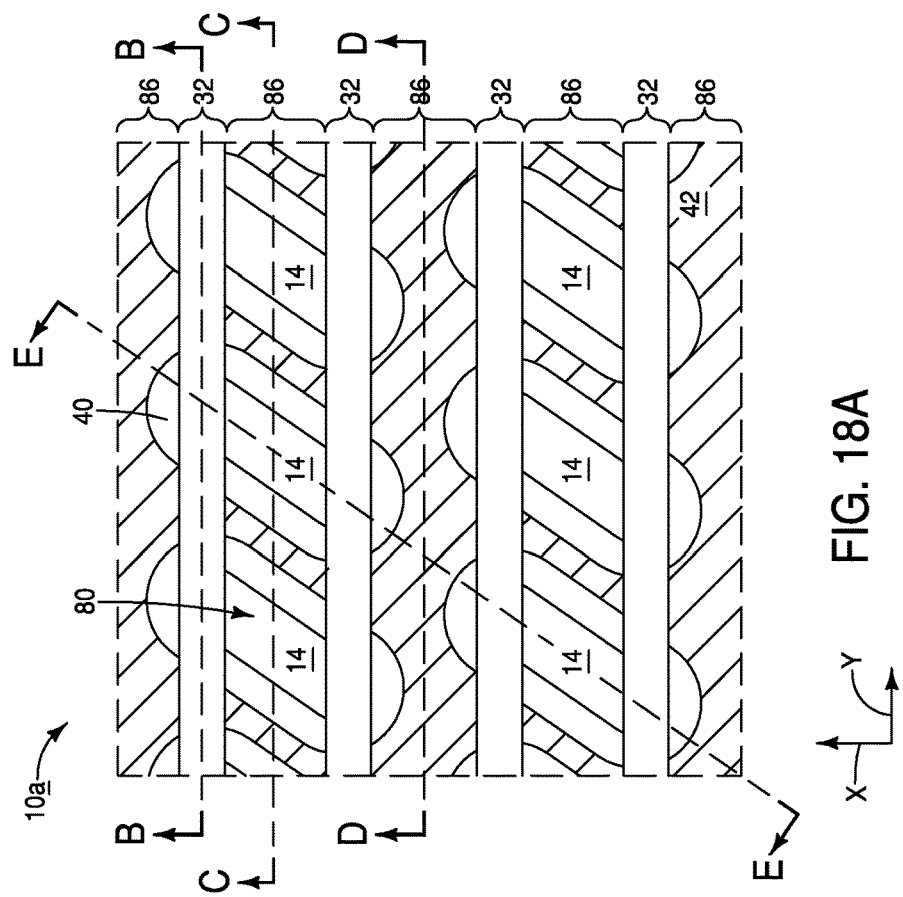
Figure 18C:
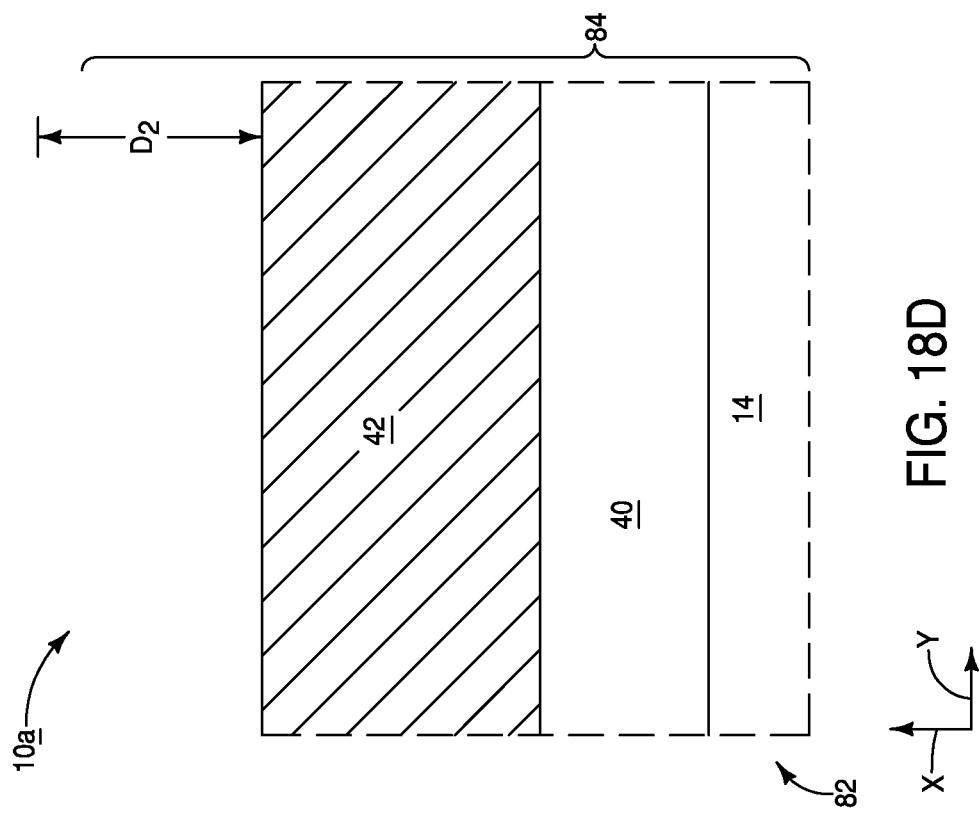
Figure 18D:
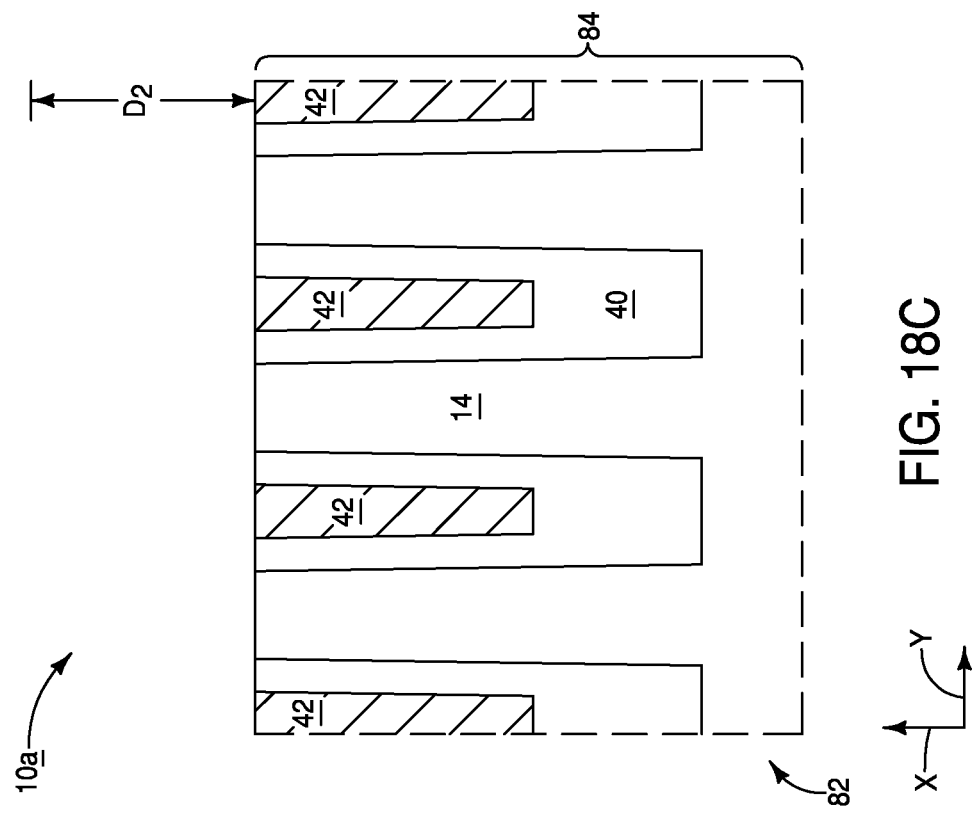

Referring to FIGS. 17A-E, the gaps 86 are extended into the structure 84 to form trenches 88, with such trenches extending along the second direction of the y-axis. The trenches 88 may be referred to as first trenches to distinguish them from other trenches formed at subsequent process stages. In the shown embodiment, the trenches formed along the middles of the islands (e.g., the trench formed along the cross-section C-C of FIG. 17A and shown along the cross-section of FIG. 17C) are at a first depth $D_1$, while the trenches formed adjacent the islands (for instance, the trench formed along the cross-section D-D of FIG. 17A and shown along the cross-section of FIG. 17D) are at a second depth $D_2$; with the first depth $D_1$ being less than the second depth $D_2$. The first and second depths $D_1$ and $D_2$ may be any suitable depths to accomplish desired electrical isolation between adjacent semiconductor pillars after formation of wordlines at a processing stage described below with reference to FIGS. 21A and 21B, and in some embodiments may be greater than about 100 nm, or even greater than about 500 nm. The first and second depths $D_1$ and $D_2$ may be different from one another as shown in FIGS. 17A-E, or may be the same as one another as shown in an alternative embodiment of FIGS. 18A-E. The approximate locations of the depths $D_1$ and $D_2$ are shown in FIG. 17B to assist the reader in understanding the relation of such depths relative to the locations of the source/drain regions 20 and the shield material 42. Similarly, the approximate location of the depth $D_2$ is shown in FIG. 18B.

FIG. 19 shows the construction 10a at a processing stage which may follow FIG. 18E. An analogous configuration (not shown) may follow the processing stage of FIG. 17E.

The trenches 88 are filled with insulative material 90. The insulative material 90 may be referred to as second insulative material to distinguish it from the first insulative material 40. The second insulative material 90 may comprise any suitable composition(s); and in some embodiments may comprise, consist essentially of, or consist of silicon dioxide. The first and second insulative materials 40 and 90 may comprise a same composition as one another, or may comprise different compositions relative to one another. The structure 84 and insulative material 90 may be considered together to form a subassembly 92.

Figure 20B:
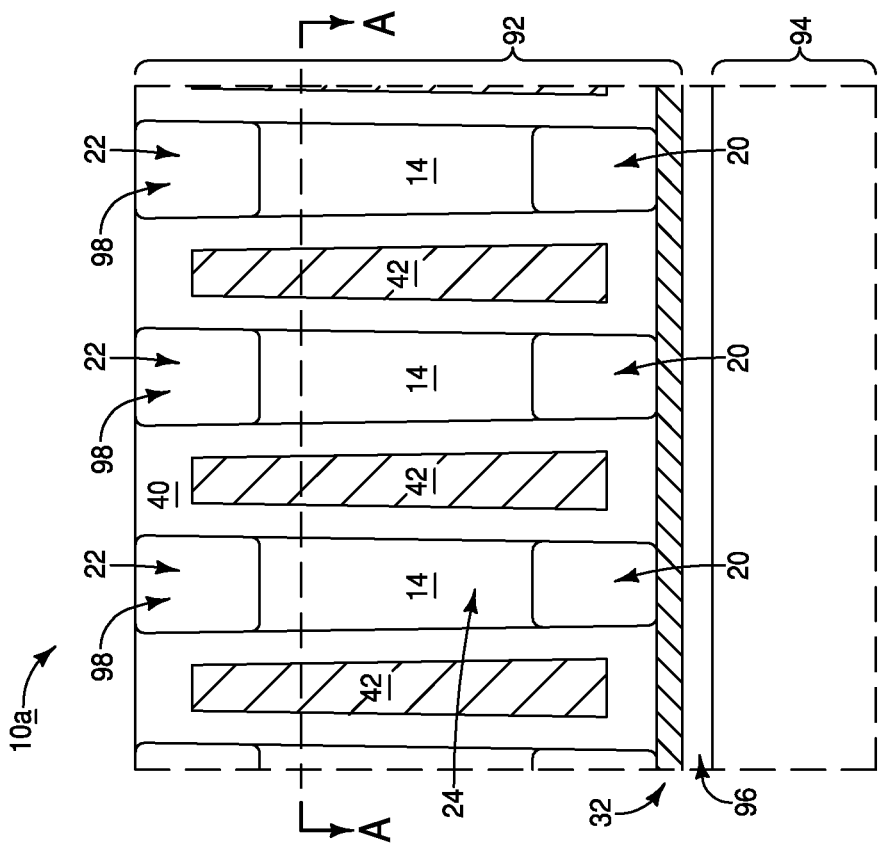
FIGS. 20A and 20B are a diagrammatic cross-sectional top-down view and a diagrammatic cross-sectional side view, respectively, of the example assembly of FIGS. 15A and 15B at an example process stage which may follow that of FIG. 19. The view of FIG. 20A is along the line A-A of FIG. 20B, and the view of FIG. 20B is along the line B-B of FIG. 20A.
Figure 20A:
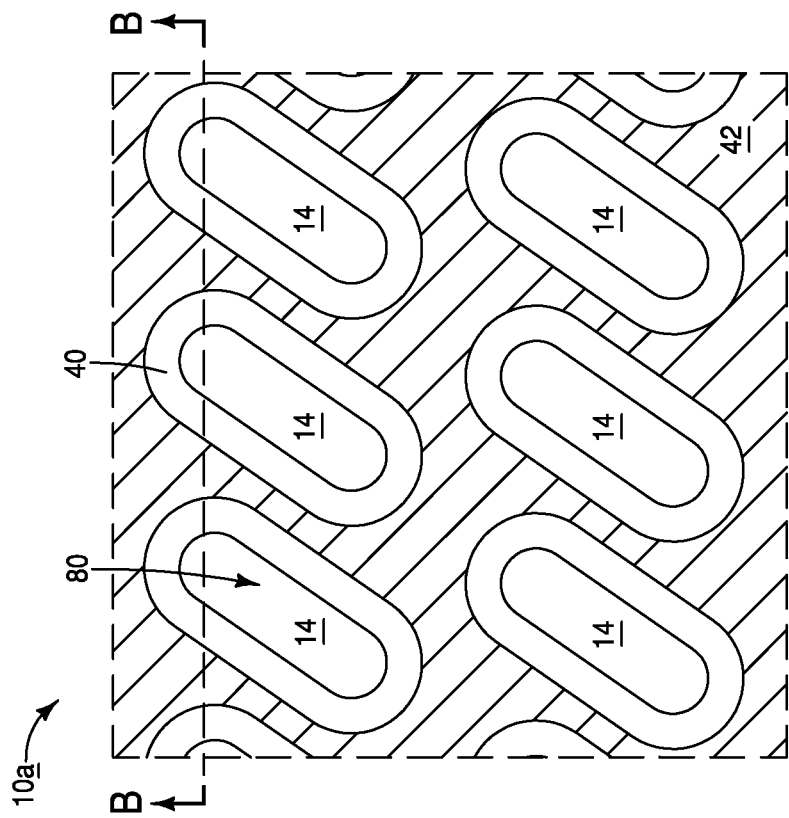

Referring to FIGS. 20A and 20B, the subassembly 92 is bonded to a handle structure 94 through a bonding region 96, and is then inverted. The handle structure 94 may comprise any suitable configuration, and in some embodiments may correspond to a semiconductor wafer (e.g., a monocrystalline silicon wafer) or other suitable semiconductor substrate. For purposed of interpreting this disclosure, the term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The bonding of the subassembly 92 with the handle structure 94 may be accomplished utilizing any suitable processing; including, for example, techniques in which two silicon dioxide surfaces are placed against one another and subjected to appropriate treatment to induce covalent bonding between the surfaces and thereby form a composite structure. Accordingly, the bonding region 96 may comprise silicon dioxide. The treatment utilized to induce the covalent bonding may be a thermal treatment. Such thermal treatment may utilize a temperature in excess of 800° C. Alternatively, one or both of the silicon dioxide surfaces may be subjected to a plasma treatment prior to the thermal treatment, and then the temperature of the thermal treatment may be reduced to a temperature within a range of from about 150° C. to about 200° C. The bonding of the silicon dioxide surfaces to one another may be referred to as "hybrid bonding" (or "smart-cut"); with example hybrid bonding procedures being described in U.S. Pat. Nos. 9,666,573 and 10,103,053, both of which are assigned to Micron Technology, Inc., and both of which list Mitsunari Sukekawa as an inventor.

The mass 82 (FIG. 19) of semiconductor material 14 is removed with appropriate processing (e.g., CMP), which exposes bottom regions 98 of the islands 80. The source/drain regions 22 are formed along the exposed bottom regions 98 of the islands 80, and in some embodiments may be formed by implanting appropriate dopant into the bottom regions of the islands.

Referring to FIGS. 21A and 21B, additional insulative material 40 is formed over the subassembly 92, and then trenches 100 are formed to extend into the bottoms of the islands 80. The trenches 100 subdivide the islands into the pillars 48. The trenches 100 may be referred to as second trenches to distinguish them from the first trenches 88 formed at the processing stages of FIGS. 17E and 18E. The second trenches 100 extend along the first direction of the x-axis. The additional insulative material may comprise the material 40 (as shown), or may comprise any other suitable material.

The second trenches are lined with the gate dielectric material 52, and then the wordline material 54 is formed within such lines trenches and patterned into the wordlines 58. Subsequently, the insulative material 56 is formed over the wordlines.

Referring to FIGS. 22A and 22B, the storage elements 62 (shown as blocks) are electrically coupled with the source/drain regions 22. In some embodiments, the storage elements 62 may be capacitors, such as, for example, the capacitors described above with reference to FIG. 7. Insulative material 102 is provided between the storage elements 62.

The conductive shield material is patterned into shield plates 43, and such are electrically coupled with the reference structure 70.

The construction 10a of FIGS. 22A and 22B may be considered to correspond to an assembly comprising a memory array 60. The memory array 60 includes the bitlines 32 extending along the second direction of the y-axis, (i.e., extending along the columns 68 of the memory array 60), and includes the wordlines 58 extending along the first direction of the x-axis (i.e., extending along rows 66 of the memory array). The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another; with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b and the pillars associated with the row 66c are labeled 166c. Notably, each row comprises a first series (i.e., first set) of pillars on one side of a wordline, and a second series (i.e., second set) of pillars on an opposing side of the wordline. For instance, a pair of the pillars 166a are labeled 166a-1 to show that they are part of a first series on one side of the wordline 58a, and another pair of the pillars 166a is labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2.

The opposing sides of the wordline 58a are identified as sides 55 and 57 along the cross-sectional views of FIGS. 22A and 22B. Such sides 55 and 57 of the wordlines may be instead referred to as first and second lateral surfaces of the wordlines.

Each of the semiconductor pillars 48 comprises a channel region 25 vertically disposed between the first and second source/drain regions 20 and 22. The wordlines 58 are adjacent to such channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars 166a-2 along the wordline 58a). The conductive shield material 42 is between the semiconductor pillars of the first and second sets.

In the embodiment of FIGS. 22A and 22B, the conductive shield material 42 extends partially under the wordlines 58, but does not extend entirely under such wordlines. Accordingly, the conductive shield material 42 between the semiconductor pillars of a first set (e.g., the pillars identified as 166a-1) is not continuous with the conductive shield material 42 between the semiconductor pillars of the second set (e.g., the pillars identified as 166a-2). Such is in contrast to the embodiment described above with reference to FIGS. 6 and 7 where the shield material 42 extended entirely under the wordlines 58.

The embodiment of FIG. 22B shows the gate dielectric material 52 spacing the shield material 42 from the second lateral side 57 of the wordline 58a, and spacing the channel region 25 from the first lateral side 55 of the wordline 58a. In other embodiments (e.g., the embodiment of FIGS. 1-7), the insulative material spacing the shield material from one lateral side of a wordline may not be the same as the insulative material spacing the transistor channel material from another side of the wordline.

The cross-section of FIG. 22B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars, and are spaced from such channel regions by the gate dielectric material 52; and have their second lateral surfaces 57 along the conductive plates 43, and spaced from the conductive plates by the gate dielectric material 52. The illustrated shield plates 43 are angle plates along the cross-section, with bottom regions of the angle plates extending partially across the bottoms of the wordlines 58*a-c*.

Another example embodiment for forming an example memory array is described with reference to FIGS. 23-28.

Figure 23B:
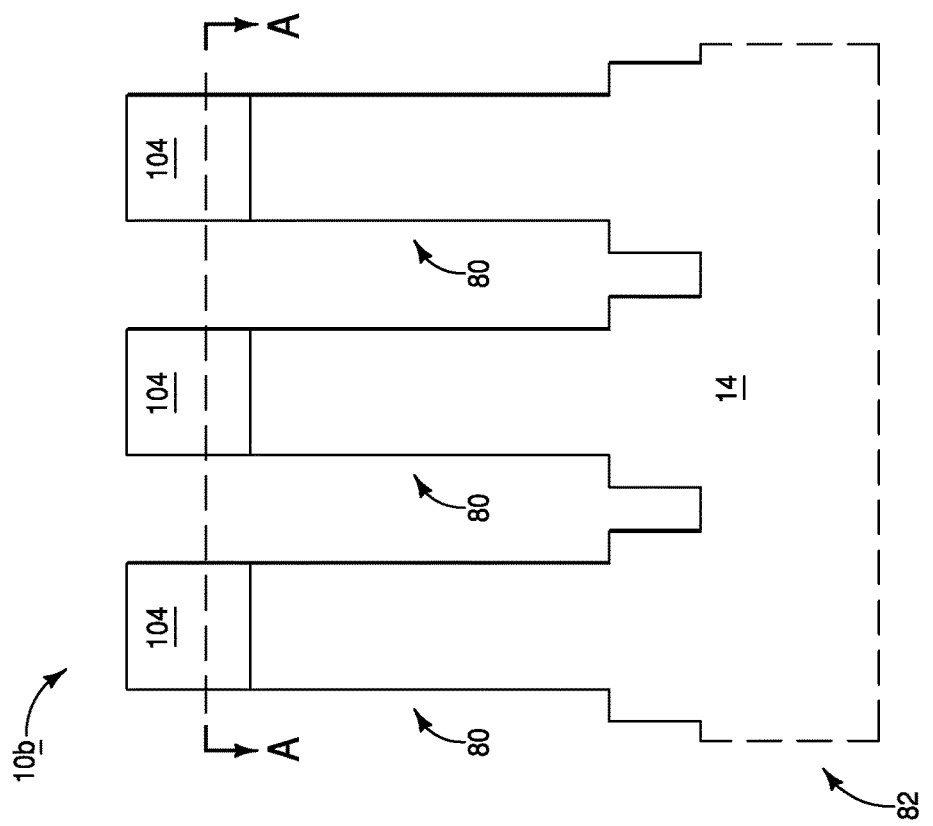
FIGS. 23A and 23B are a diagrammatic cross-sectional top-down view and a diagrammatic cross-sectional side view, respectively, of an example assembly at an example process stage of an example method for fabricating an example array of memory cells. The view of FIG. 23A is along the line A-A of FIG. 23B, and the view of FIG. 23B is along the line B-B of FIG. 23A.
Figure 23A:
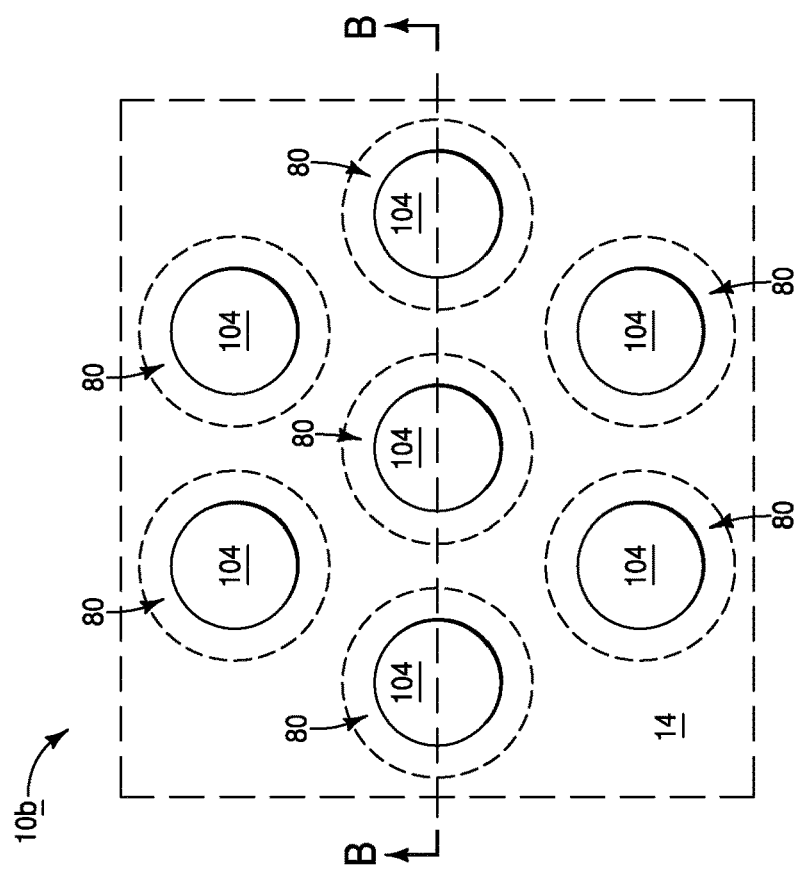

Referring to FIGS. 23A and 23B, a construction 10*b* comprises islands 80 of semiconductor material 14 extending upwardly from a mass 82 of the semiconductor material. The islands are capped with protective material 104. The protective material 104 may comprise any suitable composition(s); and in some embodiments may comprise, consist essentially of, or consist of silicon nitride.

Figure 24B:
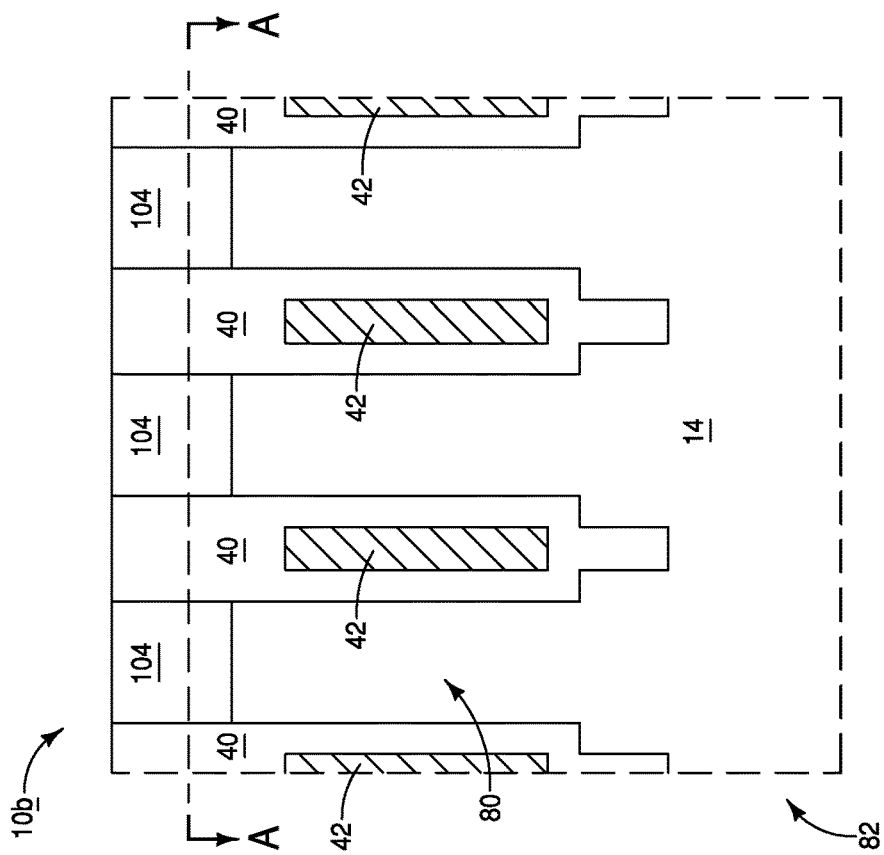
FIGS. 24A and 24B are a diagrammatic cross-sectional top-down view and a diagrammatic cross-sectional side view, respectively, of the example assembly of FIGS. 23A and 23B at an example process stage following that of FIGS. 23A and 23B. The view of FIG. 24A is along the line A-A of FIG. 24B, and the view of FIG. 24B is along the line B-B of FIG. 24A.
Figure 24A:
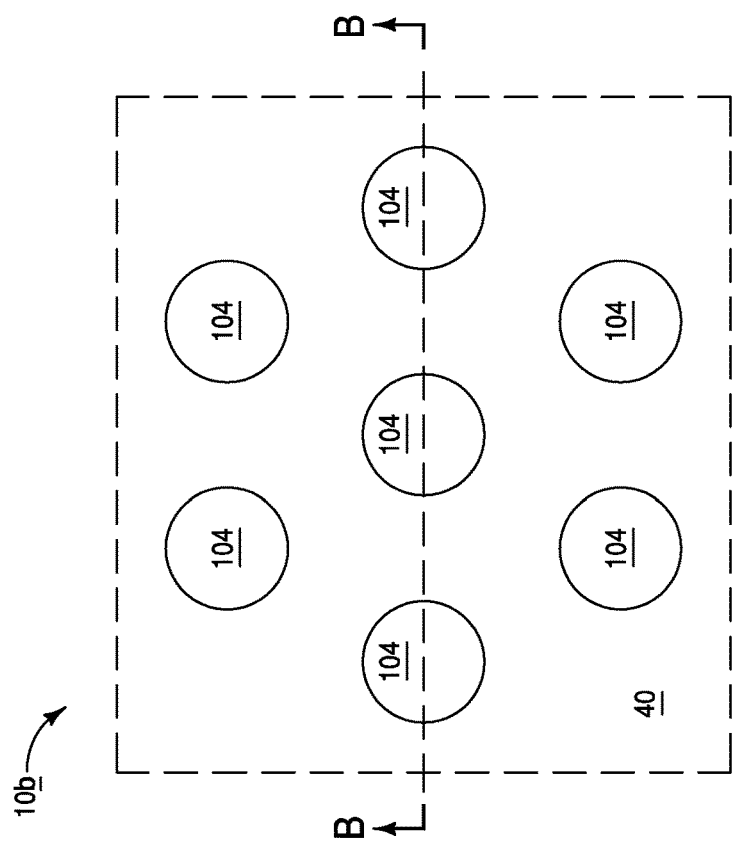

Referring to FIGS. 24A and 24B, regions between the islands 80 are lined with insulative material 40, then shield material 42 is deposited and recessed, and then additional insulative material 40 is provided over the shield material.

Referring to FIGS. 25A and 25B, the protective material 104 (FIGS. 24A and 24B) is removed, and then doped regions 22 are formed along upper portions of the islands 80. In the shown embodiment, the doped regions 22 are formed after removing the protective material 104. In other embodiments, the semiconductor material 14 may be blanket-doped prior to patterning the material into the islands 80, and accordingly the doped regions 22 may be formed at an earlier process stage than the process stage of FIGS. 25A and 25B.

Capacitors 62 are formed to be coupled with (electrically connected with) the source/drain regions 22. The illustrated capacitors are container-type capacitors; and each comprises a container-shaped electrode 106, a dielectric material 108 within the container-shaped electrode, and another electrode 110 over the dielectric material 108 and within the container-shaped electrode. The electrodes 106 and 110 may comprise any suitable compositions; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The dielectric material 108 may comprise any suitable composition(s); and in some embodiments may comprise one or more of silicon dioxide, silicon nitride and silicon oxynitride.

Insulative material 112 is provided over and between the capacitors 62. The insulative material 112 may comprise any suitable composition(s); and in some embodiments may comprise one or both of silicon dioxide and silicon nitride.

The semiconductor material 14, shield material 42, insulative material 40, capacitors 62 and insulative material 112 may be together considered to form a subassembly 114.

Referring to FIGS. 26A and 26B, the subassembly 114 is bonded to a handle structure 94 through a bonding region 96, and is then inverted. The handle structure 94 may comprise the configuration described above with reference to FIGS. 20A and 20B, and the bonding of the subassembly 114 with the handle structure 94 may be accomplished utilizing hybrid bonding procedures described above with reference to FIGS. 20A and 20B.

The mass 82 (FIG. 25B) of semiconductor material 14 is removed with appropriate processing (e.g., CMP), which exposes regions 98 of the semiconductor material 14 (in some embodiments, the regions 98 may be considered to correspond to bottom regions of the islands 80 of FIG. 25B). The source/drain regions 20 are formed along the regions 98, and in some embodiments may be formed by implanting appropriate dopant into the regions 98.

Trenches 116 are formed to extend into the islands 80 (FIG. 25B) and to pattern the pillars 48 from the islands. The trenches 116 extend along the first direction of the x-axis.

The trenches 116 are lined with the gate dielectric material 52, and then the wordline material 54 is formed within such lined trenches and patterned into the wordlines 58. Subsequently, additional insulative material is formed over the wordlines, and in the shown embodiment the additional insulative material is a same composition as material 52 (in other embodiments, the additional insulative material may have another composition).

The conductive shield material 42 is patterned into shield plates 43.

The embodiment of FIGS. 26A and 26B shows the trenches 116 etched deep enough to reach the doped regions 22. In alternative embodiments, the trenches 116 may be etched less deep, and doped extensions may be formed to extend from bottoms of the trenches to the doped regions 22. For instance, FIGS. 27A and 27B show an embodiment alternative to that of FIGS. 26A and 26B, and show doped extensions 118 formed to extend from bottoms of the trenches 116 to the doped regions 22. The doped extensions 118 may be the same conductivity type as the regions 22, and may be heavily-doped with appropriate dopant. Alternatively, the extensions 118 may be less doped than the regions 22, and may, for example, correspond to lightly-doped diffusion regions.

Referring to FIGS. 28A and 28B, the construction 10*b* is shown at a processing stage subsequent to that of FIGS. 26A and 26B. Bitlines 32 are formed over the subassembly 114, and are coupled with the source/drain regions 20. The bitlines comprise the bitline material 18 described above with reference to FIG. 1.

The conductive shield plates 43 are electrically coupled with the reference structure 70.

The construction of FIGS. 28A and 28B may be considered to correspond to an assembly comprising a memory array 60. The memory array includes the bitlines 32 extending along the second direction of the y-axis, (i.e., extending along the columns 68 of the memory array 60), and includes the wordlines 58 extending along the first direction of the x-axis (i.e., extending along rows 66 of the memory array). The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58*a*, 58*b* and 58*c* so that they may be distinguished from another. The rows 66 are labeled as 66*a*, 66*b* and 66*c* so that they may be distinguished from one another; with the row 66*a* comprising the pillars 48 associated with the wordline 58*a*, the row 66*b* comprising the pillars 48 associated with the wordline 58*b*, and the row 66*c* comprising the pillars associated with the wordline 58*c*. The individual pillars 48 are identified relative to a specific one of the rows 66*a*, 66*b* and 66*c* that the pillars are associated with. The pillars associated with the row 66*a* are labeled 166*a*, the pillars associated with row 66*b* are labeled 166*b*, and the pillars associated with the row 66*c* are labeled 166*c*. Notably, each row comprises a first series (i.e., first set) of pillars on one side of a wordline, and a second series (i.e., second set) of pillars on an opposing side of the wordline. For instance, one of the pillars 166*a* is labeled 166*a*-1 to show that it is part of a first series on one side of the wordline 58*a*, and others of the pillars 166*a* are labeled 166*a*-2 to show that they are part of a second series on an opposing side of the wordline 58*a*. The pillars of the first set alternate with the pillars of the second set along the row 66*a*. Similarly, the pillars 166*b* comprise a first set 166*b*-1 and a second set 166*b*-2, and the pillars 166*c* comprise a first set 166*c*-1 and a second set 166*c*-2 (not shown).

The opposing sides of the wordline 58*a* are identified as sides 55 and 57 along the cross-sectional views of FIGS. 28A and 28B. Such sides 55 and 57 of the wordlines may be instead referred to as first and second lateral surfaces of the wordlines.

Each of the semiconductor pillars 48 comprises a channel region 25 vertically disposed between the first and second source/drain regions 20 and 22. The wordlines 58 are adjacent to such channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166*a*-1 along the wordline 58*a*), and the gate dielectric material is between the second lateral surface 57 and the semiconductor pillars 48 of the second set (e.g., the pillars labeled 166*a*-2 along the wordline 58*a*). The conductive shield material 42 is between the semiconductor pillars of the first and second sets.

In the embodiment of FIG. 28B the conductive shield material 42 does not extend to under the wordlines 58, but instead the shield plates 43 are configured as vertical pillars.

The embodiment of FIG. 28B shows the gate dielectric material 52 spacing the shield material 42 from the second lateral side 57 of the wordline 58*a*, and spacing the channel region 25 from the first lateral side 55 of the wordline 58*a*. In other embodiments (e.g., the embodiment of FIGS. 1-7), the insulative material spacing the shield material from one lateral side of a wordline may not be the same as the insulative material spacing the transistor channel material from another side of the wordline.

The cross-section of FIG. 28B may be considered to be a cross-section along a column direction (i.e., along the y-axis direction). Such cross-section passes through a series of the first semiconductor pillars (specifically, pillars identified as 166*a*-1, 166*b*-1 and 166*c*-1), and through a series of the conductive plates 43 of the shield material 42. The wordlines (58*a*, 58*b* and 58*c*) along the cross-section have their first lateral surfaces 55 along the channel regions 25 of the semiconductor pillars (i.e., along channel regions of transistors comprising active regions within the semiconductor pillars), and are spaced from such channel regions by the gate dielectric material 52; and have their second lateral surfaces 57 along the conductive plates 43, and spaced from the conductive plates by the gate dielectric material 52. The illustrated shield plates 43 are vertically-extending pillars along the cross-section, with no regions of the shield material extending to under the wordlines 58*a*-*c*.

The shield plates 43 of the above-discussed embodiments are entirely electrically isolated from the body regions 24 of the semiconductor pillars 48. In other embodiments, the shield plates may be electrically connected with (electrically coupled with) the body regions 24. An example of such other embodiments is described with reference to FIGS. 29-34.

Figure 29B:
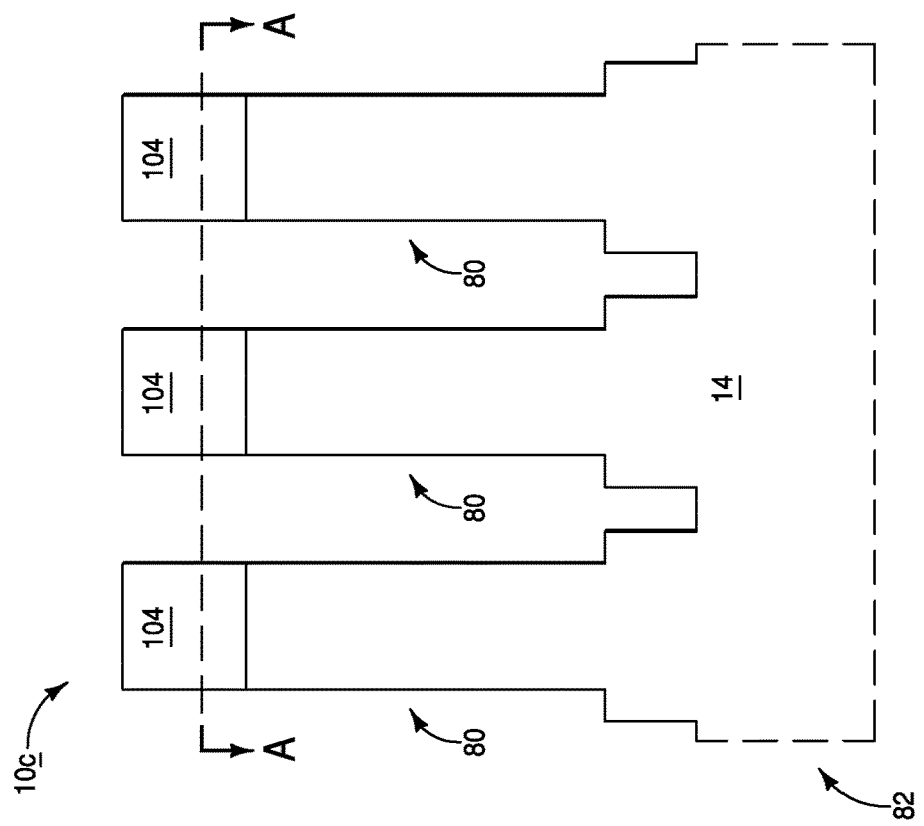
FIGS. 29A and 29B are a diagrammatic cross-sectional top-down view and a diagrammatic cross-sectional side view, respectively, of an example assembly at an example process stage of an example method for fabricating an example array of memory cells. The view of FIG. 29A is along the line A-A of FIG. 29B, and the view of FIG. 29B is along the line B-B of FIG. 29A.
Figure 29A:
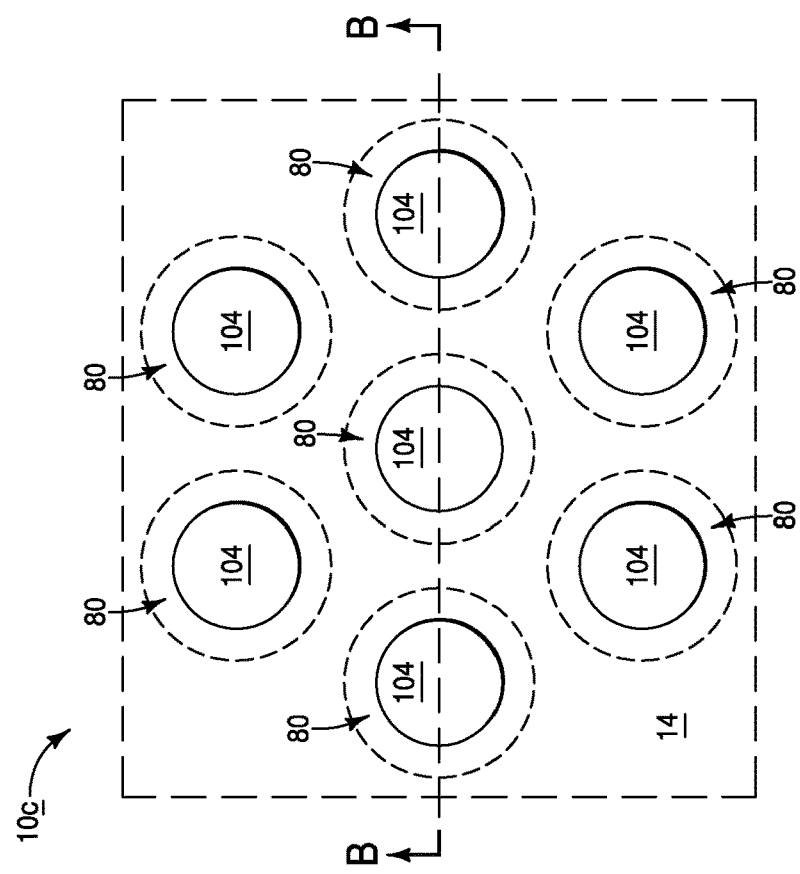

Referring to FIGS. 29A and 29B, a construction 10*c* comprises islands 80 of semiconductor material 14 extending upwardly from a mass 82 of the semiconductor material. The islands are capped with the protective material 104. The construction of FIGS. 29A and 29B may be identical to that described above with reference to FIGS. 23A and 23B.

Referring to FIGS. 30A and 30B, regions between the islands 80 are lined with insulative material 40, then shield material 42 is deposited and recessed, and then additional insulative material 40 is provided over the shield material. The configuration of FIGS. 30A and 30B differs from that of FIGS. 24A and 24B in that the shield material 42 punches through bottom regions of the insulative material 40 so that segments along an outer boundary of the shield material directly contact the semiconductor material 14 at interface regions 120.

Referring to FIGS. 31A and 31B, processing analogous to that described above with reference to FIGS. 25A and 25B is conducted to form the doped regions 22 and the capacitors 62 of a subassembly 114.

Referring to FIGS. 32A and 32B, processing analogous to that described above with reference to FIGS. 26A and 26B is conducted to bond the subassembly 114 to a handle structure 94 and invert the subassembly.

The mass 82 (FIG. 31B) of semiconductor material 14 is removed with appropriate processing (e.g., CMP), which exposes regions 98 of the semiconductor material 14 (in some embodiments, the regions 98 may be considered to correspond to bottom regions of the islands 80). The interface regions 120 where the conductive shield material 42 contacts the semiconductor material 14 remain after the removal of the mass 82.

Referring to FIGS. 33A and 33B, the source/drain regions 20 are formed along upper portions of the semiconductor material 14, and may be formed with processing analogous to that described above with reference to FIGS. 26A and 26B.

The trenches 116 are formed to extend along the first direction of the x-axis, and to pattern the pillars 48. The trenches 116 may be formed with processing analogous to that described above with reference to FIGS. 26A and 26B.

The trenches 116 are lined with the gate dielectric material 52, and then the wordline material 54 is formed within such lined trenches and patterned into the wordlines 58. Subsequently, additional insulative material is formed over the wordlines. In the shown embodiment the additional insulative material is the same composition as material 52 (in other embodiments, the additional insulative material may have a different composition).

The conductive shield material 42 is patterned into shield plates 43. The illustrated shield plates 43 are angle plates, with bottom portions extending to under the wordlines 58.

The embodiment of FIGS. 33A and 33B shows the trenches 116 formed shallow enough that doped extensions 118 (of the type described above with reference to FIGS. 27A and 27B) are provided between bottoms of the trenches and the source/drain regions 22. In other embodiments, the trenches 116 may be etched deep enough so that the doped extension 118 may be omitted.

Referring to FIGS. 34A and 34B, bitlines 32 are formed over the subassembly 114, and are coupled with the source/drain regions 20. The bitlines comprise the bitline material 18 described above with reference to FIG. 1.

The conductive shield plates 43 are electrically coupled with the reference structure 70.

The construction of FIGS. 34A and 34B may be considered to correspond to an assembly comprising a memory array 60. The memory array includes the bitlines 32 extending along the second direction of the y-axis, (i.e., extending along the columns 68 of the memory array 60), and includes the wordlines 58 extending along the first direction of the x-axis (i.e., extending along rows 66 of the memory array). The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another; with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b and the pillars associated with the row 66c are labeled 166c. Notably, each row comprises a first series (i.e., first set) of pillars on one side of a wordline, and a second series (i.e., second set) of pillars on an opposing side of the wordline. For instance, one of the pillars 166a is labeled 166a-1 to show that it is part of a first series on one side of the wordline 58a, and others of the pillars 166a are labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2 (not shown).

The opposing sides of the wordline 58a are identified as sides 55 and 57 along the cross-sectional views of FIGS. 34A and 34B. Such sides 55 and 57 of the wordlines may be instead referred to as first and second lateral surfaces of the wordlines.

Each of the semiconductor pillars 48 comprises a channel region 25 vertically disposed between the first and second source/drain regions 20 and 22. The wordlines 58 are adjacent to such channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars labeled 166a-2 along the wordline 58a). The conductive shield material 42 is between the semiconductor pillars of the first and second sets.

The embodiment of FIG. 34B shows the interface regions 120 enabling the shield material 42 to directly contact the body regions 24 of access devices (transistors) comprising the semiconductor pillars 48. In some embodiments, the shield material 42 may comprise a suitable composition at a suitable reference voltage to enable the shield material to alleviate floating body effects (i.e., charge buildup) that may be associated with the body regions 24 during operation of access devices associated with the memory array 60. For instance, in some embodiments the shield material may comprise doped semiconductor material, with such doped semiconductor material having an opposite-type conductivity relative to the source/drain regions 20 and 22. For instance, if the source/drain regions 20 and 22 are n-type, the shield material may be p-type. The voltage source 70 may be configured to operate together with the shield plates 43 for alleviation of floating body effects within the body regions 24.

The cross-section of FIG. 34B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars, and are spaced from such channel regions by the gate dielectric material 52; and have their second lateral surfaces 57 along the conductive plates 43, and spaced from the conductive plates by the gate dielectric material 52.

Figure 35:
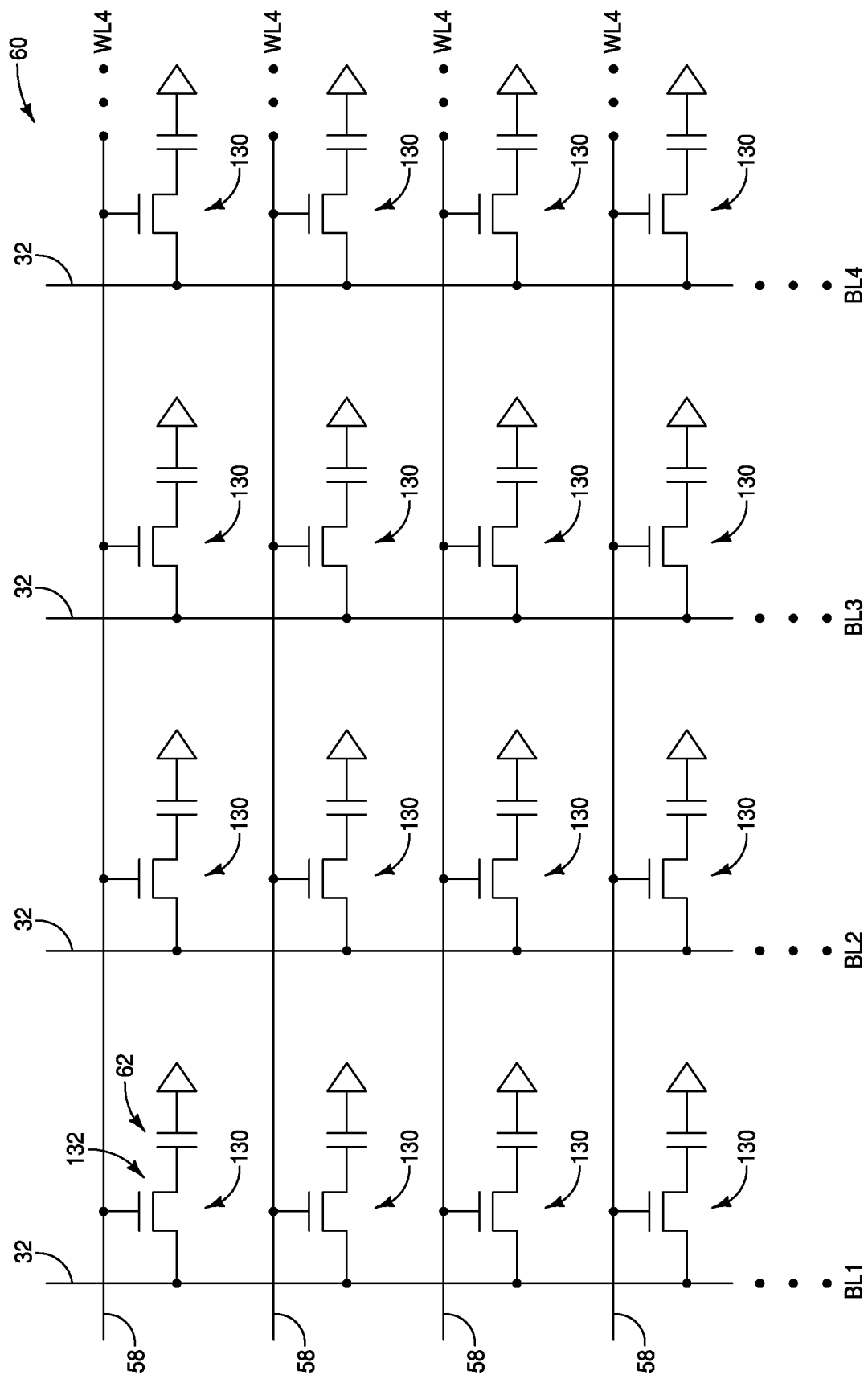
FIG. 35 is a diagrammatic schematic illustration of a region of an example memory array.

The memory arrays 60 described herein may be DRAM arrays, and may comprise memory cells having one transistor in combination with one capacitor (1T-1C memory cells). FIG. 35 schematically illustrates a portion of an example DRAM array 60. The bitlines (digit lines) 32 are shown to correspond to bitlines BL1, BL2, BL3 and BL4; and the wordlines 58 are shown to correspond to wordlines WL1, WL2, WL3 and WL4. Memory cells 130 extend across the array, with each of the memory cells including a capacitor 62 and a transistor (access device) 132. The access devices may comprise active regions within the pillars 48 described above with reference to FIGS. 1-34; with such active regions including the pair of source/drain regions 20 and 22, and the channel region 25 between the source/drain regions. Each of the memory cells 130 within the memory array 60 of FIG. 35 is uniquely addressed through a combination of one of the wordlines and one of the bitlines. The memory array may include any suitable number of memory cells; and in some embodiments may comprise hundreds, millions, tens of millions, etc., of memory cells.

Figure 36:
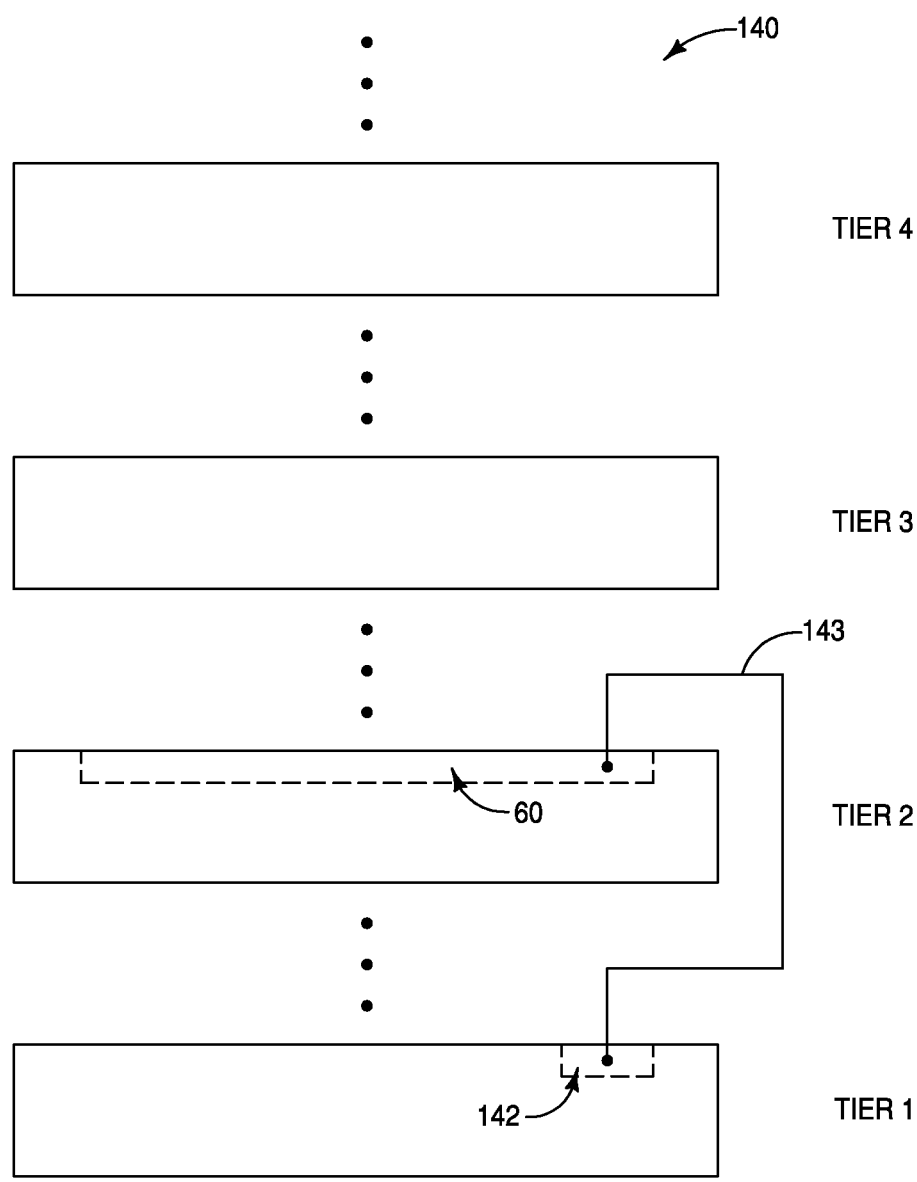
FIG. 36 is a diagrammatic cross-sectional side view of a region of an example assembly comprising stacked tiers.

In some embodiments, a memory array 60 of any of the types described herein may be within a memory tier (i.e., memory deck) which is within a vertically-stacked arrangement of tiers (or decks). For instance, FIG. 36 shows a portion of an integrated assembly 140 comprising a vertically-stacked arrangement of tiers (labeled as tiers 1-4). The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

The bottom tier (tier 1) may include control circuitry and/or sensing circuitry (e.g., may include wordline drivers, sense amplifiers, etc.); and in some applications may comprise CMOS circuitry (diagrammatically illustrated as CMOS circuitry 142). One or more of the upper tiers (tiers 2-4) may include a memory array, such as, for example, a memory array 60 of any of the types described with reference to FIGS. 1-35. If multiple tiers comprise memory arrays, the memory arrays within the various tiers may be the same as one another (e.g., may all be DRAM arrays), or may be different relative to one another (e.g., some may be DRAM arrays, while others are NAND arrays). FIG. 36 diagrammatically indicates that a memory array 60 is within the second tier (tier 2), and shows an electrical connection 143 between the CMOS circuitry 142 of tier 1 and components of the memory array 60 of tier 2. In some embodiments, the CMOS circuitry 142 may be electrically coupled with wordlines and/or bitlines of the memory 60; and may comprise, for example, wordline drivers, sense amplifiers, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory device having a buried wordline, a shield plate, and an access device. The access device includes first and second diffusion regions and a channel region. The diffusion regions and the channel region are arranged vertically so that the channel region is between the first and second diffusion regions. The access device is adjacent the wordline and the shield plate so that a part of the wordline is proximate a first side surface of the channel region with an intervention of a first insulating material therebetween, and a part of the shield plate is proximate a second side surface of the channel region with an intervention of a second insulating material therebetween.

Some embodiments include an assembly having a row of vertically-extending semiconductor pillars. Each of the semiconductor pillars includes a transistor channel region vertically disposed between a first source/drain region and a second source/drain region. A wordline extends along the row of vertically-extending semiconductor pillars, and is adjacent to the transistor channel regions of the semiconductor pillars. The wordline has a first lateral surface and an opposing second lateral surface. The semiconductor pillars are subdivided amongst a first set along the first lateral surface, and a second set along the second lateral surface. The semiconductor pillars of the first set alternate with the semiconductor pillars of the second set along the row. A gate dielectric material is between the first lateral surface and the transistor channel regions of the semiconductor pillars of the first set, and is between the second lateral surface and the transistor channel regions of the semiconductor pillars of the second set. A conductive shield material is between the semiconductor pillars of the first set, and is between the semiconductor pillars of the second set. Bitlines are coupled with the first source/drain regions. Storage elements are coupled with the second source/drain regions.

Some embodiments include a memory array which has vertically-extending semiconductor pillars. Each of the semiconductor pillars comprises a transistor channel region vertically disposed between a first source/drain region and a second source/drain region. The semiconductor pillars are arranged in rows and columns of the memory array. The rows extend along a row direction, and the columns extend along a column direction. Wordlines extend along the row direction. The wordlines are adjacent the transistor channel regions of the semiconductor pillars. Each row of the memory array includes a plurality of the semiconductor pillars along an associated one of the wordlines. The associated one of the wordlines has a first lateral surface and an opposing second lateral surface. The plurality of semiconductor pillars associated with said one of the wordlines is subdivided amongst a first set along the first lateral surface, and a second set along the second lateral surface. The semiconductor pillars of the first set are spaced from said associated one of the wordlines by a gate dielectric material between the first lateral surface and the transistor channel regions of the semiconductor pillars of the first set. The semiconductor pillars of the second set are spaced from said associated one of the wordlines by the gate dielectric material between the second lateral surface and the transistor channel regions of the semiconductor pillars of the second set. Conductive shield material is between the semiconductor pillars. Bitlines extend along the column direction and are coupled with the first source/drain regions. Storage elements are coupled with the second source/drain regions. Each of the storage elements is uniquely addressed by one of the wordlines in combination with one of the bitlines.

Some embodiments include a method of forming an assembly. A construction is formed to have pillars of semiconductor material supported by a base. The pillars are arranged in rows. A conductive shield material is formed to extend along first sides of the pillars, and a wordline material is formed to extend along opposing second sides of the pillars. The wordline material is configured as wordlines extending along a first direction, with the first direction being a direction of the rows, and with each wordline being associated with one of the rows. The pillars along each of the rows alternate between first pillars on a first side of the wordline associated with the row, and second pillars on an opposing second side of the wordline associated with the row. First and second source/drain regions are formed along vertically-opposing regions of the pillars. Each of the pillars comprises a transistor channel region vertically disposed between the first and second source/drain regions associated with the pillar. Bitlines are formed to be electrically connected with the first source/drain regions, and to extend along a second direction which crosses the first direction.

Storage elements are formed to be electrically connected with the second source/drain regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory device comprising:
 a buried wordline extending across a horizontal upper surface of a base;
 a shield plate;
 an access device comprising first and second diffusion regions and a channel region, the first and second diffusion regions and the channel region being arranged vertically relative to the horizontal upper surface of the base so that the channel region is elevationally between the first and second diffusion regions; and
 wherein the access device is adjacent the wordline and the shield plate so that a part of the wordline is proximate a first side surface of the channel region with an intervention of a first insulating material therebetween and that a part of the shield plate is proximate a second side surface of the channel region with an intervention of a second insulating material therebetween.

2. The memory device of claim 1 further comprising:
 a bitline in an electrical connection with first diffusion region; and
 a storage element in an electrical connection with the second diffusion region.

3. A memory device comprising:
 a buried wordline extending across a horizontal upper surface of a base;
 a shield plate comprising polycrystalline semiconductive material doped with impurities;
 an access device comprising first and second diffusion regions and a channel region, the first and second diffusion regions and the channel region being arranged vertically so that the channel region is between the first and second diffusion regions; and
 wherein the access device is adjacent the wordline and the shield plate so that a part of the wordline is proximate a first side surface of the channel region with an intervention of a first insulating material therebetween and that a part of the shield plate is proximate a second side surface of the channel region with an intervention of a second insulating material therebetween.

4. The memory device of claim 3 wherein the first and second diffusion regions, and the shield plate, are all a same conductivity type.

5. The memory device of claim 4 wherein the first and second diffusion regions are n-type, and wherein the shield plate is also n-type.

6. The memory device of claim 3 wherein the first and second diffusion regions are a first conductivity type, and wherein the shield plate is a second conductivity type opposite to the first conductivity type.

7. The memory device of claim 6 wherein the first and second diffusion regions are n-type, and wherein the shield plate is p-type.

8. The memory device of claim 7 wherein the channel region is within a body region of the access device, and wherein the shield plate directly contacts the body region of the access device.

9. The memory device of claim 1 further comprising:
 a bitline coupled to the first diffusion region;
 a storage element coupled to the second diffusion region; and
 wherein each of the wordline and the bitline comprises a metal.

10. The memory device of claim 9 wherein the wordline extends horizontally in a first direction, and wherein the bitline extends horizontally in a second direction which crosses the first direction.

11. The memory device of claim 1 wherein the shield plate is coupled with a reference source having ground voltage.

* * * * *